(12) United States Patent
Chen et al.

(10) Patent No.: US 12,063,784 B2
(45) Date of Patent: Aug. 13, 2024

(54) MEMORY PERIPHERAL CIRCUIT HAVING THREE-DIMENSIONAL TRANSISTORS AND METHOD FOR FORMING THE SAME

(71) Applicant: YANGTZE MEMORY TECHNOLOGIES CO., LTD., Wuhan (CN)

(72) Inventors: Liang Chen, Wuhan (CN); Chao Sun, Wuhan (CN); Wei Liu, Wuhan (CN); Wenshan Xu, Wuhan (CN); Wu Tian, Wuhan (CN); Ning Jiang, Wuhan (CN); Lei Xue, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 380 days.

(21) Appl. No.: 17/482,046

(22) Filed: Sep. 22, 2021

(65) Prior Publication Data

US 2022/0367505 A1 Nov. 17, 2022

Related U.S. Application Data

(63) Continuation of application No. PCT/CN2021/103656, filed on Jun. 30, 2021.

(30) Foreign Application Priority Data

Jun. 30, 2021 (WO) ................ PCT/CN2021/103656

(51) Int. Cl.
*H10B 43/40* (2023.01)
*H01L 23/00* (2006.01)
(Continued)

(52) U.S. Cl.
CPC ............. *H10B 43/40* (2023.02); *H01L 24/08* (2013.01); *H01L 24/80* (2013.01);
(Continued)

(58) Field of Classification Search
CPC ........ H10B 43/40; H10B 41/27; H10B 43/27; H10B 41/41; H01L 24/08; H01L 24/80; H01L 25/0657; H01L 25/18; H01L 25/50
See application file for complete search history.

(56) References Cited

U.S. PATENT DOCUMENTS 9,379,129 B1 6/2016 Lue et al.
10,283,493 B1 5/2019 Nishida
(Continued)

FOREIGN PATENT DOCUMENTS

CN 105183379 A 12/2015
CN 107658307 A 2/2018
(Continued)

OTHER PUBLICATIONS

International Search Report issued in corresponding International Application No. PCT/CN2021/103755, mailed Feb. 10, 2022, 4 pages.

(Continued)

*Primary Examiner* — Michael Jung
(74) *Attorney, Agent, or Firm* — BAYES PLLC

(57) ABSTRACT

In certain aspects, a memory device includes an array of memory cells, a plurality of word lines coupled to the array of memory cells, and a plurality of peripheral circuits coupled to the array of memory cells and configured to control the array of memory cells. A first peripheral circuit of the plurality of peripheral circuits includes a first three-dimensional (3D) transistor coupled to the array of memory cells through at least one of the plurality of word lines. The first 3D transistor includes a 3D semiconductor body, and a gate structure in contact with a plurality of sides of the 3D semiconductor body. The gate structure includes a gate dielectric and a gate electrode.

20 Claims, 34 Drawing Sheets

(51) Int. Cl.
*H01L 25/00* (2006.01)
*H01L 25/065* (2023.01)
*H01L 25/18* (2023.01)
*H10B 41/27* (2023.01)
*H10B 41/41* (2023.01)
*H10B 43/27* (2023.01)

(52) U.S. Cl.
CPC .......... *H01L 25/0657* (2013.01); *H01L 25/18* (2013.01); *H01L 25/50* (2013.01); *H10B 41/27* (2023.02); *H10B 41/41* (2023.02); *H10B 43/27* (2023.02); *H01L 2224/08145* (2013.01); *H01L 2224/80895* (2013.01); *H01L 2224/80896* (2013.01); *H01L 2924/1431* (2013.01); *H01L 2924/14511* (2013.01)

(56) References Cited

U.S. PATENT DOCUMENTS

| | | |
|---|---|---|
| 10,768,222 B1 | 9/2020 | Brozek |
| 2010/0327339 A1 | 12/2010 | Tanaka et al. |
| 2012/0273862 A1 | 11/2012 | Tanzawa |
| 2013/0153978 A1 | 6/2013 | Lee et al. |
| 2015/0263173 A1* | 9/2015 | Lue ................ H01L 29/7833 257/408 |
| 2017/0053906 A1 | 2/2017 | Or-Bach et al. |
| 2017/0053921 A1 | 2/2017 | Jeong et al. |
| 2019/0081068 A1 | 3/2019 | Huang et al. |
| 2019/0157298 A1* | 5/2019 | Huo .................. H10B 41/50 |
| 2020/0058669 A1* | 2/2020 | Chen ................. H10B 43/27 |
| 2020/0066703 A1 | 2/2020 | Kim et al. |
| 2020/0105780 A1 | 4/2020 | Lai et al. |
| 2020/0286906 A1 | 9/2020 | Karda et al. |
| 2020/0328186 A1 | 10/2020 | Liu |
| 2021/0066281 A1* | 3/2021 | Kwon ................ H01L 25/0657 |
| 2021/0104534 A1 | 4/2021 | Huo et al. |

FOREIGN PATENT DOCUMENTS

| | | |
|---|---|---|
| CN | 110720145 A | 1/2020 |
| CN | 110729300 A | 1/2020 |
| CN | 111146203 A | 5/2020 |
| CN | 112424933 A | 2/2021 |
| CN | 112701121 A | 4/2021 |
| TW | 201608697 A | 3/2016 |
| TW | 202103306 A | 1/2021 |
| TW | 202117937 A | 5/2021 |

OTHER PUBLICATIONS

International Search Report issued in corresponding International Application No. PCT/CN2021/103723, mailed Feb. 10, 2022, 4 pages.
International Search Report issued in corresponding International Application No. PCT/CN2021/103656, mailed Feb. 10, 2022, 4 pages.
International Search Report issued in corresponding International Application No. PCT/CN2021/103677, mailed Feb. 10, 2022, 4 pages.
Supplementary European Search Report issued in corresponding European Application No. 21 94 1513, mailed on Apr. 12, 2024, 8 pages.

* cited by examiner

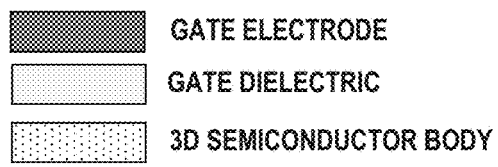
GATE ELECTRODE
GATE DIELECTRIC
3D SEMICONDUCTOR BODY
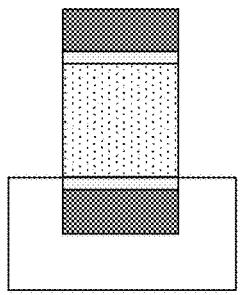
FIG. 7A
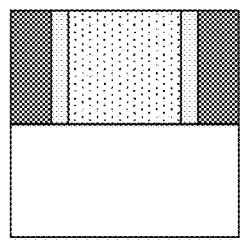
FIG. 7B
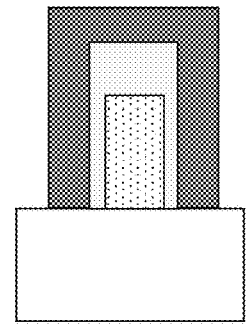
FIG. 7C
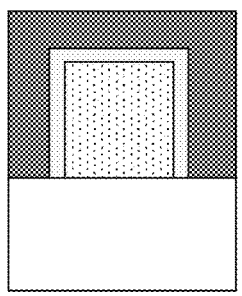
FIG. 7D
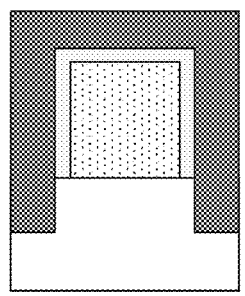
FIG. 7E
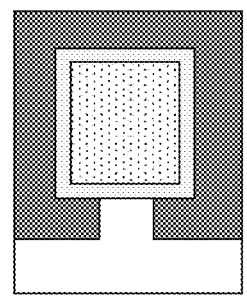
FIG. 7F
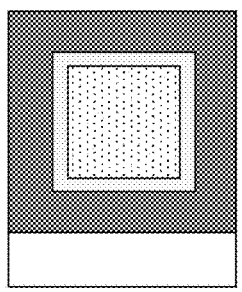
FIG. 7G
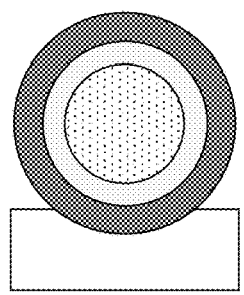
FIG. 7H
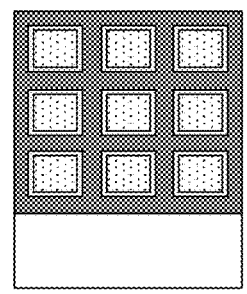
FIG. 7I

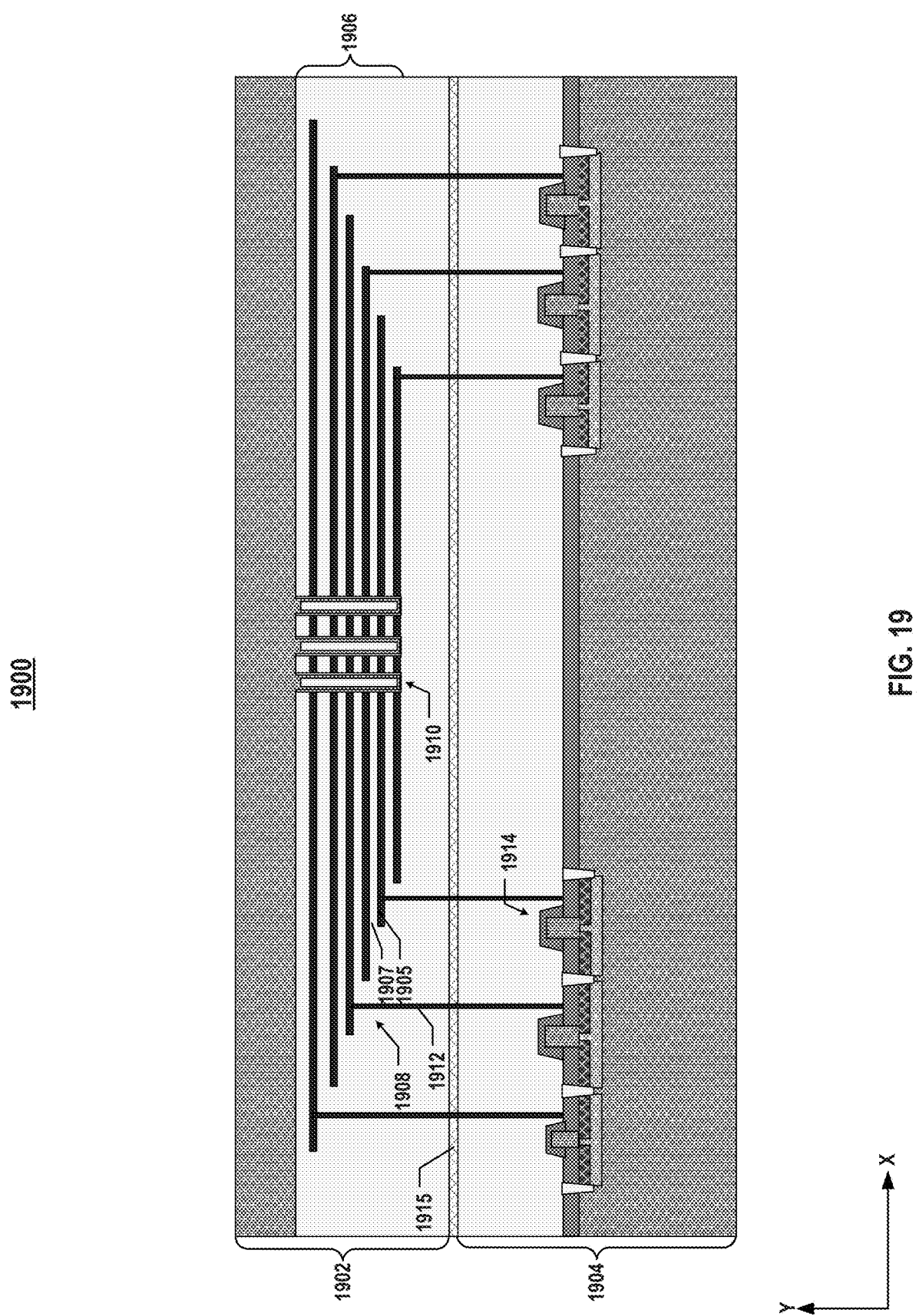

2500

MEMORY PERIPHERAL CIRCUIT HAVING THREE-DIMENSIONAL TRANSISTORS AND METHOD FOR FORMING THE SAME

CROSS-REFERENCE TO RELATED APPLICATIONS

This application is a continuation of International Application No. PCT/CN2021/103656, filed on Jun. 30, 2021, entitled "MEMORY PERIPHERAL CIRCUIT HAVING THREE-DIMENSIONAL TRANSISTORS AND METHOD FOR FORMING THE SAME," which is hereby incorporated by reference in its entirety. This application also claims the benefit of priority to International Application No. PCT/CN2021/093323, filed on May 12, 2021, entitled "MEMORY PERIPHERAL CIRCUIT HAVING THREE-DIMENSIONAL TRANSISTORS AND METHOD FOR FORMING THE SAME," which is incorporated herein by reference in its entirety. This application is also related to U.S. application Ser. No. 17/481,971, filed on Sep. 22, 2021, entitled "MEMORY PERIPHERAL CIRCUIT HAVING THREE-DIMENSIONAL TRANSISTORS AND METHOD FOR FORMING THE SAME," U.S. application Ser. No. 17/482,026, filed on Sep. 22, 2021, entitled "MEMORY PERIPHERAL CIRCUIT HAVING THREE-DIMENSIONAL TRANSISTORS AND METHOD FOR FORMING THE SAME," and U.S. application Ser. No. 17/482,074, filed on Sep. 22, 2021, entitled "MEMORY PERIPHERAL CIRCUIT HAVING THREE-DIMENSIONAL TRANSISTORS AND METHOD FOR FORMING THE SAME," all of which are hereby incorporated by reference in their entireties.

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a memory device includes an array of memory cells, a plurality of word lines coupled to the array of memory cells, and a plurality of peripheral circuits coupled to the array of memory cells and configured to control the array of memory cells. A first peripheral circuit of the plurality of peripheral circuits includes a first 3D transistor coupled to the array of memory cells through at least one of the plurality of word lines. The first 3D transistor includes a 3D semiconductor body, and a gate structure in contact with a plurality of sides of the 3D semiconductor body. The gate structure includes a gate dielectric and a gate electrode.

In another aspect, a memory device includes an array of memory cells, a plurality of word lines coupled to the array of memory cells, and a plurality of string drivers coupled to the plurality of word lines, respectively, and configured to drive the array of memory cells through the plurality of word lines. Each of the plurality of string drivers includes a 3D transistor.

In still another aspect, a system includes a memory device configured to store data. The memory device includes an array of memory cells, a plurality of word lines coupled to the array of memory cells, and a plurality of string drivers coupled to the plurality of word lines, respectively, and configured to drive the array of memory cells through the plurality of word lines. Each of the plurality of string drivers includes a 3D transistor. The system also includes a memory controller coupled to the memory device and configured to control the array of memory cells through the plurality of string drivers.

In still another aspect, a 3D memory device includes a first semiconductor structure, a second semiconductor structure, and a bonding interface between the first semiconductor structure and the second semiconductor structure. The first semiconductor structure includes a stack structure including interleaved word lines and dielectric layers, and an array of 3D NAND memory strings extending through the stack structure. Edges of the interleaved word lines and dielectric layers define a staircase structure on a side of the stack structure. The second semiconductor structure includes a plurality of string drivers. Each of the plurality of string drivers includes a 3D transistor. The plurality of string drivers face the staircase structure across the bonding interface.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 7A-7I illustrate side views of cross-sections of various 3D transistors, according to various aspects of the present disclosure.

FIG. 19 illustrates a side view of a cross-section of a 3D memory device including string drivers having 3D transistors, according to some aspects of the present disclosure.

Figure 1A:
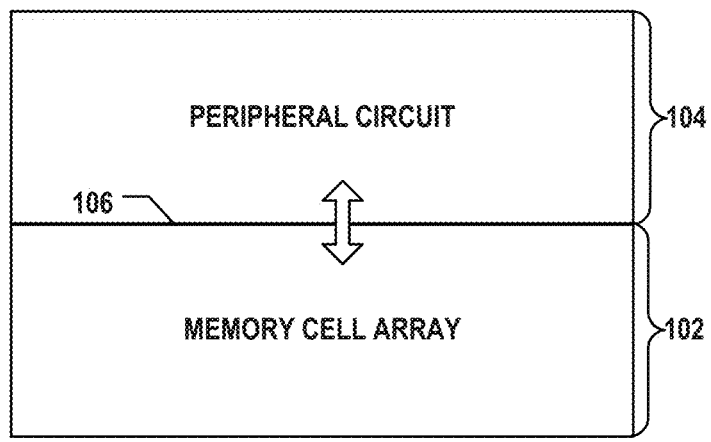
FIG. 1A illustrates a schematic view of a cross-section of a 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

Compared with logic devices, such as microprocessors, the complementary metal oxide semiconductor (CMOS) technology nodes used for peripheral circuits of memory devices, such as NAND Flash memory, are less advanced (e.g., 60 nm and above) because the memory peripheral circuits require low cost and low leakage current (a.k.a. off-state current $I_{off}$). With the development of 3D memory devices, such as 3D NAND Flash memory devices, the more stacked layers (e.g., word lines) require more peripheral circuits for operating the 3D memory devices, thereby demanding a smaller unit size of the peripheral circuit. For example, the number and/or size of page buffers needs to increase to match the increased number of memory cells. In some cases, the chip area occupied by page buffers can become dominating in a 3D NAND Flash memory, for example, more than 50% of the total chip area. In another example, the number of string drivers in the word line driver is proportional to the number of word lines in the 3D NAND Flash memory. Thus, the continuous increase of the word lines also increases the area occupied by the word line driver, as well as the complexity of metal routings, sometimes even the number of metal layers. Moreover, in some 3D memory devices in which the memory cell array and peripheral circuits are fabricated on different substrates and bonded together, the continuous increase of peripheral circuit areas, particularly page buffer area, makes it the bottleneck for reducing the total chip size.

However, scaling down the peripheral circuit size following the advanced technology node trend used for the logic devices would cause a significant cost increase and higher leakage current, which are undesirable for memory devices. Moreover, because the 3D NAND Flash memory devices require a relatively high voltage (e.g., above 5 V) in certain memory operations, such as program and erase, unlike logic devices, which can reduce its working voltage as the CMOS technology node advances, the voltage provided to the memory peripheral circuits cannot be reduced. As a result, scaling down the memory peripheral circuit sizes by following the trend for advancing the CMOS technology nodes, like the normal logic devices, becomes infeasible.

On the other hand, there is an increasing demand for higher I/O speed for the 3D NAND Flash memory, which requires a higher saturated drain current ($I_{dsat}$, a.k.a. on-state current $I_{on}$) of the transistors used in the memory I/O circuits. However, the planar transistors commonly used in existing memory peripheral circuits, such as I/O circuits, would suffer from a high leakage current as the saturated drain current keeps increasing, which is also undesirable for memory devices.

In summary, the continuous advancement of memory devices, such as 3D NAND Flash memory, require high speed, low leakage current, high voltage, and small size at the same, without increasing the cost, for memory peripheral circuits, which have become more and more challenging. Neither the all-planar transistor solution used in existing memory peripheral circuits, or the advanced CMOS technology node solution used in logic devices, can meet the above-mentioned requirements at the same time.

To address one or more of the aforementioned issues, the present disclosure introduces a solution in which at least in some of the memory peripheral circuits, such as I/O circuits, page buffers, and word line drivers, the conventional planar transistors are replaced with 3D transistors (a.k.a. non-planar transistors). In some implementations, as the fabrication process of the 3D transistors disclosed herein is compatible with the planar transistors, planar transistors and 3D transistors are fabricated in the same process flow to achieve a hybrid configuration of memory peripheral circuits—having both 3D transistors and planar transistors.

Compared with planar transistors, 3D transistors can have a larger gate control area to achieve better channel control with a smaller subthreshold swing. During the off state, since the channel is fully depleted, the leakage current of 3D transistors can be significantly reduced a well. Thus, a memory peripheral circuit, such as an I/O circuit, using 3D transistors instead of planar transistors, can achieve a much better speed (saturated drain current)/leakage current performance. For example, according to some studies made by the inventors, having the same dimensions and same leakage current, the saturated drain current of a 3D transistor can be more than twice (e.g., 3 times) of the saturated drain current of a planar transistor.

Besides switch speed increase due to high saturated drain current, the memory peripheral circuit size can be reduced as well by replacing the planar transistors with the 3D transistors. For example, according to some studies made by the inventors, the saturated drain current of a 3D transistor can be more than twice (e.g., 3 times) of the saturated drain current of a planar transistor at the same dimensions and leakage current. Thus, for certain memory peripheral circuits in which size reduction is more desirable than speed increase, such as page buffers and word line drivers, the size of the peripheral circuit can be reduced while maintaining the same leakage current and the statured drain current. Moreover, a simple solution of reducing the transistor dimensions of planar transistors is not feasible because the leakage current can be drastically increased due to the narrow channel effect, for example, when the gate width is below 180 nm, according to some studies made by the inventors.

On the other hand, the 3D transistors disclosed herein can be fabricated using less advanced CMOS technology nodes (e.g., above 14 nm) compared with logic devices in order to meet the low leakage current, high voltage, and low-cost requirements for memory peripheral circuits. For example, although advanced CMOS technology nodes (e.g., sub-22 nm) can reduce the transistor dimensions, the voltage has to be reduced (e.g., to 0.9 V) in order to avoid increasing the leakage current. The voltage reduction, however, is not acceptable for memory peripheral circuits, which need to operate at certain voltage levels during the memory operations. Also, the advanced CMOS technology nodes, as well as the associated process and structures, such as stressors for strain control and high dielectric constant (high-k)/metal gate (HKMG), may increase the manufacturing complexity and decrease the production yield and thus, increase the cost, which may not be suitable for cost-sensitive memory peripheral circuits.

Consistent with the scope of the present disclosure, according to some aspects of the present disclosure, the peripheral circuits having 3D transistors and the memory cell array can be formed on different wafers and bonded together in a face-to-face manner. Thus, the thermal budget of fabricating the memory cell array does not affect the fabrication of the peripheral circuits. For existing memory devices in which the peripheral circuits and memory cell array are fabricated on the same wafer, the transistor dimension reduction is limited by the thermal budget of forming the memory cell array. In contrast, in the present disclosure, the dimensions of transistors (e.g., 3D transistors) forming the memory peripheral circuits can be reduced without the constraints from the memory cell array thermal budget. Moreover, in some implementations, after bonding, certain peripheral circuits with reduced 3D transistors dimensions (e.g., string drivers of word line drivers) can be arranged to face the staircase structure of the memory cell array formed on another substrate, thereby simplifying the metal routing.

FIG. 1A illustrates a schematic view of a cross-section of a 3D memory device 100, according to some aspects of the present disclosure. 3D memory device 100 represents an example of a bonded chip. The components of 3D memory device 100 (e.g., memory cell array and peripheral circuits) can be formed separately on different substrates and then jointed to form a bonded chip. 3D memory device 100 can include a first semiconductor structure 102 including an array of memory cells (memory cell array). In some implementations, the memory cell array includes an array of NAND Flash memory cells. For ease of description, a NAND Flash memory cell array may be used as an example for describing the memory cell array in the present disclosure. But it is understood that the memory cell array is not limited to NAND Flash memory cell array and may include any other suitable types of memory cell arrays, such as dynamic random access memory (DRAM) cell array, static random access memory (SRAM) cell array, NOR Flash memory cell array, phase change memory (PCM) cell array, resistive memory cell array, magnetic memory cell array, spin transfer torque (STT) memory cell array, to name a few, or any combination thereof.

First semiconductor structure 102 can be a NAND Flash memory device in which memory cells are provided in the form of an array of 3D NAND memory strings and/or an array of two-dimensional (2D) NAND memory cells. NAND memory cells can be organized into pages or fingers, which are then organized into blocks in which each NAND memory cell is electrically connected to a separate line called a bit line (BL). All cells with the same vertical position in the NAND memory cell can be electrically connected through the control gates by a word line (WL). In some implementations, a plane contains a certain number of blocks that are electrically connected through the same bit line. First semiconductor structure 102 can include one or more planes, and the peripheral circuits that are needed to perform all the read/program (write)/erase operations can be included in a second semiconductor structure 104.

In some implementations, the array of NAND memory cells is an array of 2D NAND memory cells, each of which includes a floating-gate transistor. The array of 2D NAND memory cells include a plurality of 2D NAND memory strings, each of which includes a plurality of memory cells (e.g., 32 to 128 memory cells) connected in series (resembling a NAND gate) and two select transistors, according to some implementations. Each 2D NAND memory string is arranged in the same plane on the substrate (in 2D), according to some implementations. In some implementations, the array of NAND memory cells is an array of 3D NAND memory strings, each of which extends vertically above the substrate (in 3D) through a stack structure, e.g., a memory stack. Depending on the 3D NAND technology (e.g., the number of layers/tiers in the memory stack), a 3D NAND memory string typically includes 32 to 256 NAND memory cells, each of which includes a floating-gate transistor or a charge-trap transistor.

As shown in FIG. 1A, 3D memory device 100 can also include second semiconductor structure 104 including the peripheral circuits of the memory cell array of first semiconductor structure 102. The peripheral circuits (a.k.a. control and sensing circuits) can include any suitable digital, analog, and/or mixed-signal circuits used for facilitating the operations of the memory cell array. For example, the peripheral circuit can include one or more of a page buffer, a decoder (e.g., a row decoder and a column decoder), a sense amplifier, a driver (e.g., a word line driver), an I/O circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in second semiconductor structure 104 use CMOS technology, e.g., which can be implemented with logic processes (e.g., technology nodes of 90 nm, 65 nm, 60 nm, 45 nm, 32 nm, 28 nm, etc.). As described above and below in detail, consistent with the scope of the present disclosure, the technology nodes used for fabricating the peripheral circuits in second semiconductor structure 104 are above 22 nm in order to reduce leakage current, maintain certain voltage levels (e.g., 1.2 V and above), and reduce the cost.

As shown in FIG. 1A, 3D memory device 100 further includes a bonding interface 106 vertically between first semiconductor structure 102 and second semiconductor structure 104. As described below in detail, first and second semiconductor structures 102 and 104 can be fabricated separately (and in parallel in some implementations) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance (e.g., micron-level) electrical connections between first semiconductor structure 102 and second semiconductor structure 104, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer between the memory cell array in first semiconductor structure 102 and the peripheral circuits in second semiconductor structure 104 can be performed through the interconnects (e.g., bonding contacts) across bonding interface 106. By vertically integrating first and second semiconductor structures 102 and 104, the chip size can be reduced, and the memory cell density can be increased.

Figure 1B:
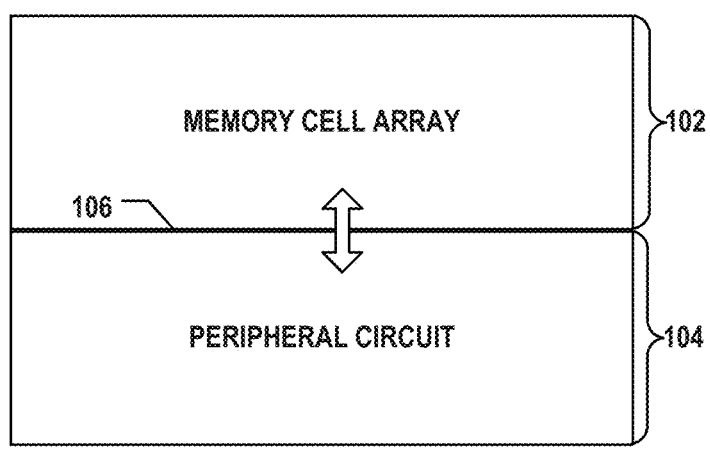
FIG. 1B illustrates a schematic view of a cross-section of another 3D memory device, according to some aspects of the present disclosure.

It is understood that the relative positions of stacked first and second semiconductor structures 102 and 104 are not limited. FIG. 1B illustrates a schematic view of a cross-section of another exemplary 3D memory device 101, according to some implementations. Different from 3D memory device 100 in FIG. 1A in which second semiconductor structure 104 including the peripheral circuits is above first semiconductor structure 102 including the memory cell array, in 3D memory device 101 in FIG. 1B, first semiconductor structure 102 including the memory cell array is above second semiconductor structure 104 including the peripheral circuits. Nevertheless, bonding interface 106 is formed vertically between first and second semiconductor structures 102 and 104 in 3D memory device 101, and first and second semiconductor structures 102 and 104 are jointed vertically through bonding (e.g., hybrid bonding) according to some implementations. hybrid bonding, also known as "metal/dielectric hybrid bonding," is a direct bonding technology (e.g., forming bonding between surfaces without using intermediate layers, such as solder or adhesives) and can obtain metal-metal (e.g., Cu-to-Cu) bonding and dielectric-dielectric (e.g., $SiO_2$-to-$SiO_2$) bonding simultaneously. Data transfer between the memory cell array in first semiconductor structure 102 and the peripheral circuits in second semiconductor structure 104 can be performed through the interconnects (e.g., bonding contacts) across bonding interface 106.

Figure 2:
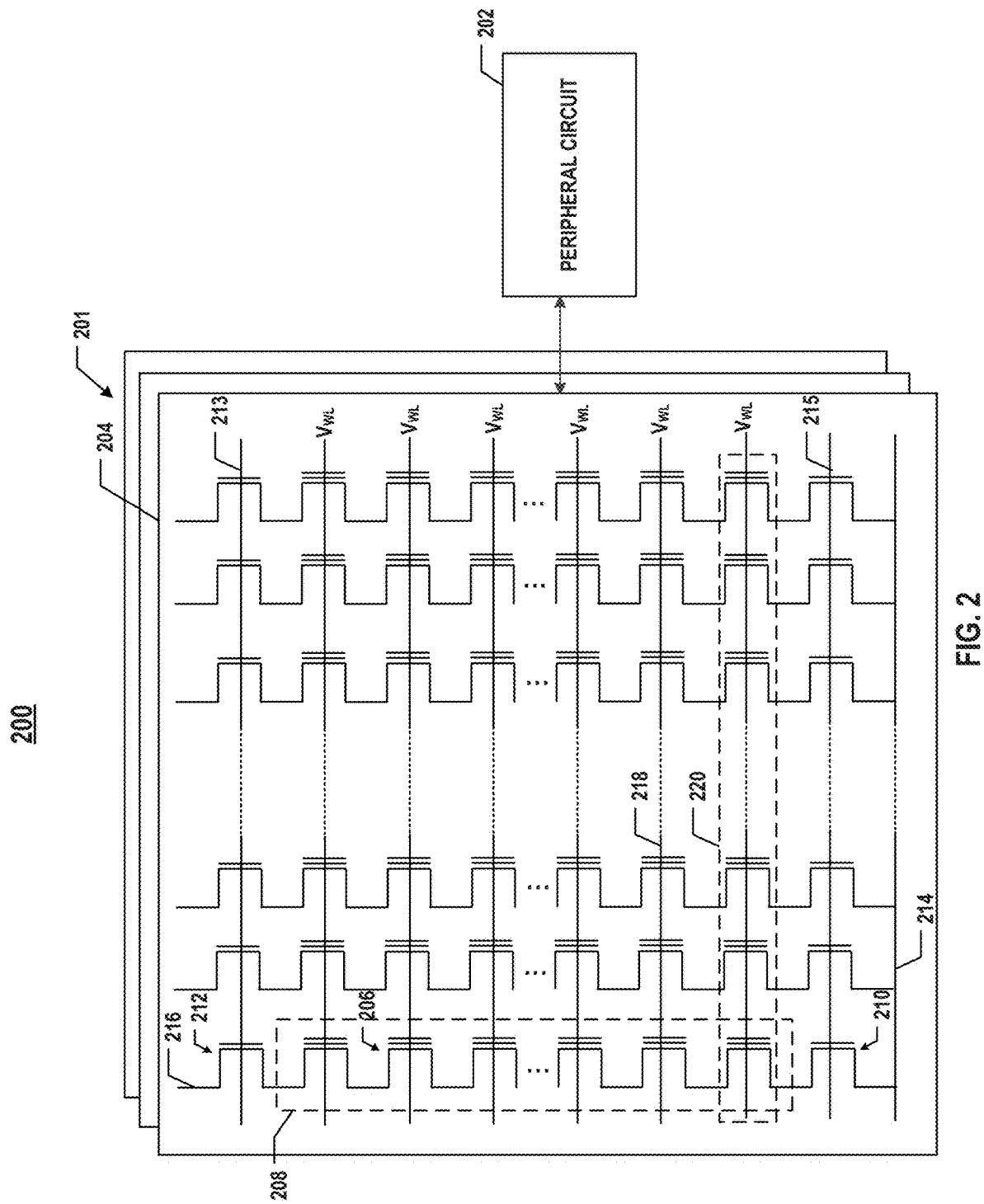
FIG. 2 illustrates a schematic circuit diagram of a memory device including peripheral circuits, according to some aspects of the present disclosure.

FIG. 2 illustrates a schematic circuit diagram of a memory device 200 including peripheral circuits, according to some aspects of the present disclosure. Memory device 200 can include a memory cell array 201 and peripheral circuits 202 coupled to memory cell array 201. 3D memory devices 100 and 101 may be examples of memory device 200 in which memory cell array 201 and peripheral circuits 202 may be included in first and second semiconductor structures 102 and 104, respectively. Memory cell array 201 can be a NAND Flash memory cell array in which memory cells 206 are provided in the form of an array of 3D NAND memory strings 208 each extending vertically above a substrate (not shown). In some implementations, each 3D NAND memory string 208 includes a plurality of memory cells 206 coupled in series and stacked vertically. Each memory cell 206 can hold a continuous, analog value, such as an electrical voltage or charge, that depends on the number of electrons trapped within a region of memory cell 206. Each memory cell 206 can be either a floating gate type of memory cell including a floating-gate transistor or a charge trap type of memory cell including a charge-trap transistor.

In some implementations, each memory cell 206 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 206 is a multi-level cell (MLC) that is capable of storing more than a single bit of data in four or more memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 2, each 3D NAND memory string 208 can include a source select gate (SSG) transistor 210 at its source end and a drain select gate (DSG) transistor 212 at its drain end. SSG transistor 210 and DSG transistor 212 can be configured to activate selected 3D NAND memory strings 208 (columns of the array) during read and program operations. In some implementations, the sources of SSG transistors 210 of 3D NAND memory strings 208 in the same block 204 are coupled through a same source line (SL) 214, e.g., a common SL, for example, to the ground. DSG transistor 212 of each 3D NAND memory string 208 is coupled to a respective bit line 216 from which data can be read or programmed via an output bus (not shown), according to some implementations. In some implementations, each 3D NAND memory string 208 is configured to be selected or unselected by applying a select voltage (e.g., above the threshold voltage of DSG transistor 212) or a deselect voltage (e.g., 0 V) to respective DSG transistor 212 through one or more DSG lines 213 and/or by applying a select voltage (e.g., above the threshold voltage of SSG transistor 210) or a deselect voltage (e.g., 0 V) to respective SSG transistor 210 through one or more SSG lines 215.

As shown in FIG. 2, 3D NAND memory strings 208 can be organized into multiple blocks 204, each of which can have a common source line 214. In some implementations, each block 204 is the basic data unit for erase operations, i.e., all memory cells 206 on the same block 204 are erased at the same time. Memory cells 206 can be coupled through word lines 218 that select which row of memory cells 206 is affected by read and program operations. In some implementations, each word line 218 is coupled to a row 220 of memory cells 206, which is the basic data unit for program and read operations. Each word line 218 can include a plurality of control gates (gate electrodes) at each memory cell 206 in respective row 220 and a gate line coupling the control gates.

Figure 3:
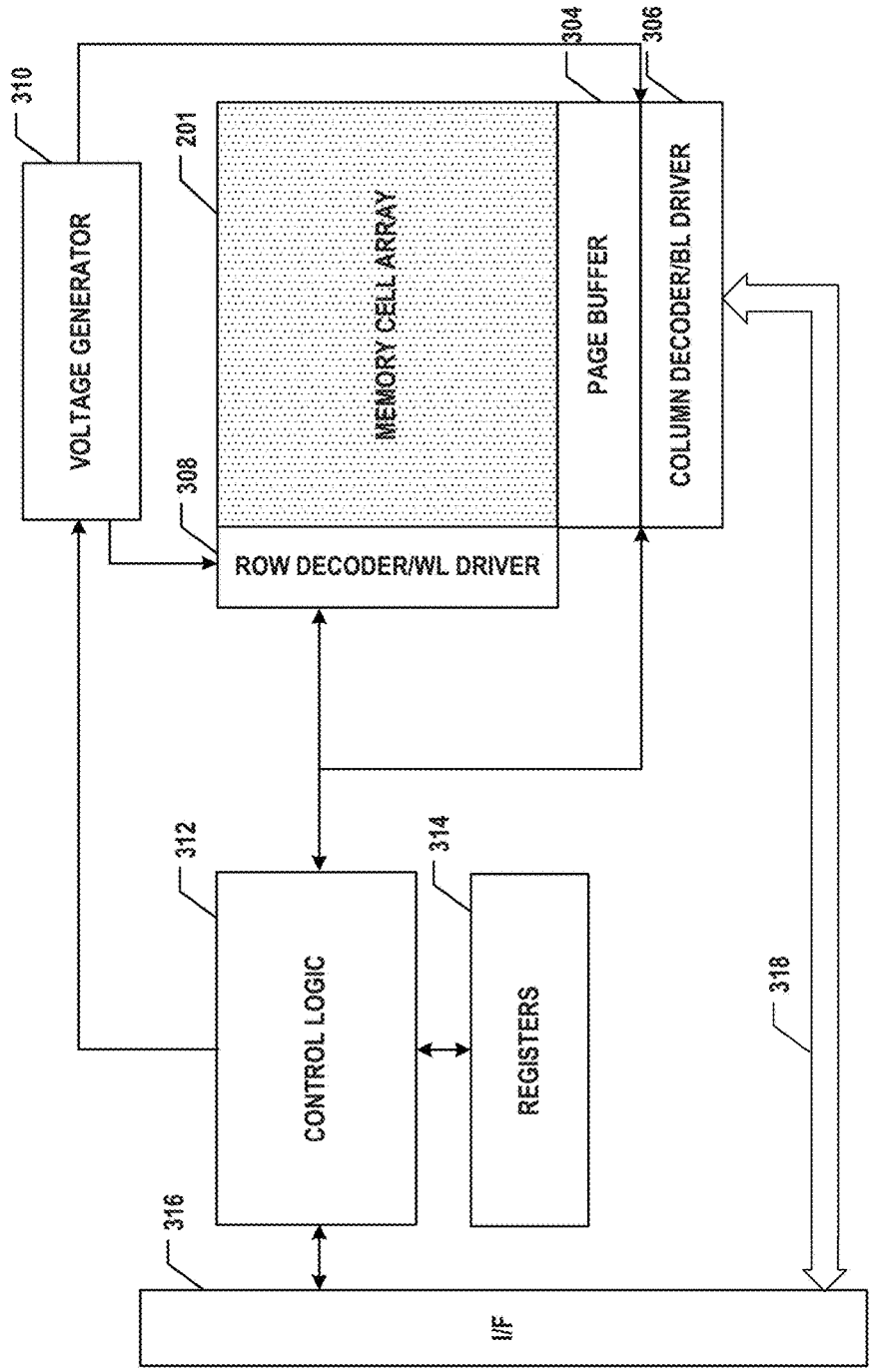
FIG. 3 illustrates a block diagram of a memory device including a memory cell array and peripheral circuits, according to some aspects of the present disclosure.

Peripheral circuits 202 can be coupled to memory cell array 201 through bit lines 216, word lines 218, source lines 214, SSG lines 215, and DSG lines 213. As described above, peripheral circuits 202 can include any suitable circuits for facilitating the operations of memory cell array 201 by applying and sensing voltage signals and/or current signals through bit lines 216 to and from each target memory cell 206 through word lines 218, source lines 214, SSG lines 215, and DSG lines 213. Peripheral circuits 202 can include various types of peripheral circuits formed using CMOS technologies. For example, FIG. 3 illustrates some exemplary peripheral circuits 202 including a page buffer 304, a column decoder/bit line driver 306, a row decoder/word line driver 308, a voltage generator 310, control logic 312, registers 314, an interface (I/F) 316, and a data bus 318. It is understood that in some examples, additional peripheral circuits 202 may be included as well.

Page buffer 304 can be configured to buffer data read from or programmed to memory cell array 201 according to the control signals of control logic 312. In one example, page buffer 304 may store one page of program data (write data) to be programmed into one row 220 of memory cell array 201. In another example, page buffer 304 also performs program verify operations to ensure that the data has been properly programmed into memory cells 206 coupled to selected word lines 218.

Row decoder/word line driver 308 can be configured to be controlled by control logic 312 and select or unselect a block 204 of memory cell array 201 and select or unselect a word line 218 of selected block 204. Row decoder/word line driver 308 can be further configured to drive memory cell array 201. For example, row decoder/word line driver 308 may drive memory cells 206 coupled to the selected word line 218 using a word line voltage generated from voltage generator 310. In some implementations, row decoder/word line driver 308 can include a decoder and string drivers (driving transistors) coupled to local word lines and word lines 218.

Voltage generator 310 can be configured to be controlled by control logic 312 and generate the word line voltages (e.g., read voltage, program voltage, pass voltage, local voltage, and verification voltage) to be supplied to memory cell array 201. In some implementations, voltage generator 310 is part of a voltage source that provides voltages at various levels of different peripheral circuits 202 as described below in detail. Consistent with the scope of the present disclosure, in some implementations, the voltages provided by voltage generator 310, for example, to row decoder/word line driver 308 and page buffer 304 are above certain levels that are sufficient to perform the memory operations. For example, the voltages provided to page buffer 304 may be between 2 V and 3.3 V, such as 3.3 V, and the voltages provided to row decoder/word line driver 308 may be greater than 3.3 V, such as between 3.3 V and 30 V.

Column decoder/bit line driver 306 can be configured to be controlled by control logic 312 and select one or more 3D NAND memory strings 208 by applying bit line voltages generated from voltage generator 310. For example, column decoder/bit line driver 306 may apply column signals for selecting a set of N bits of data from page buffer 304 to be outputted in a read operation.

Control logic 312 can be coupled to each peripheral circuit 202 and configured to control operations of peripheral circuits 202. Registers 314 can be coupled to control logic 312 and include status registers, command registers, and address registers for storing status information, command operation codes (OP codes), and command addresses for controlling the operations of each peripheral circuit 202.

Interface 316 can be coupled to control logic 312 and configured to interface memory cell array 201 with a memory controller (not shown). In some implementations, interface 316 act as a control buffer to buffer and relay control commands received from the memory controller and/or a host (not shown) to control logic 312 and status information received from control logic 312 to the memory controller and/or the host. Interface 316 can also be coupled to page buffer 304 and column decoder/bit line driver 306 via data bus 318 and act as an I/O interface and a data buffer to buffer and relay the program data received from the memory controller and/or the host to page buffer 304 and the read data from page buffer 304 to the memory controller and/or the host. In some implementations, interface 316 and data bus 318 are part of an I/O circuit of peripheral circuits 202.

Consistent with the scope of the present disclosure, at least one peripheral circuit 202 of memory device 200 can have 3D transistors instead of planar transistors in order to achieve high speed, low leakage current, high voltage, and small size at the same, without increasing the cost. In some implementations, all the planar transistors in each peripheral circuit 202 are replaced with 3D transistors. That is, peripheral circuits 202 may not have a planar transistor at all. In some implementations, as the fabrication process of the 3D transistors disclosed herein is compatible with the planar transistors, planar transistors and 3D transistors are fabricated in the same process flow to achieve a hybrid configuration of memory peripheral circuits—having both 3D transistors and planar transistors. That is, peripheral circuits 202 may have planar transistors as well. For example, one or more peripheral circuits 202 may have 3D transistors, while other peripheral circuits 202 may still have planar transistors. It is understood that in some examples, both 3D transistors and planar transistors may be used in the same peripheral circuit 202. For example, FIG. 4 illustrates a perspective view of a planar transistor, according to some aspects of the present disclosure, and FIG. 5 illustrates a perspective view of a 3D transistor, according to some aspects of the present disclosure.

Figure 4:
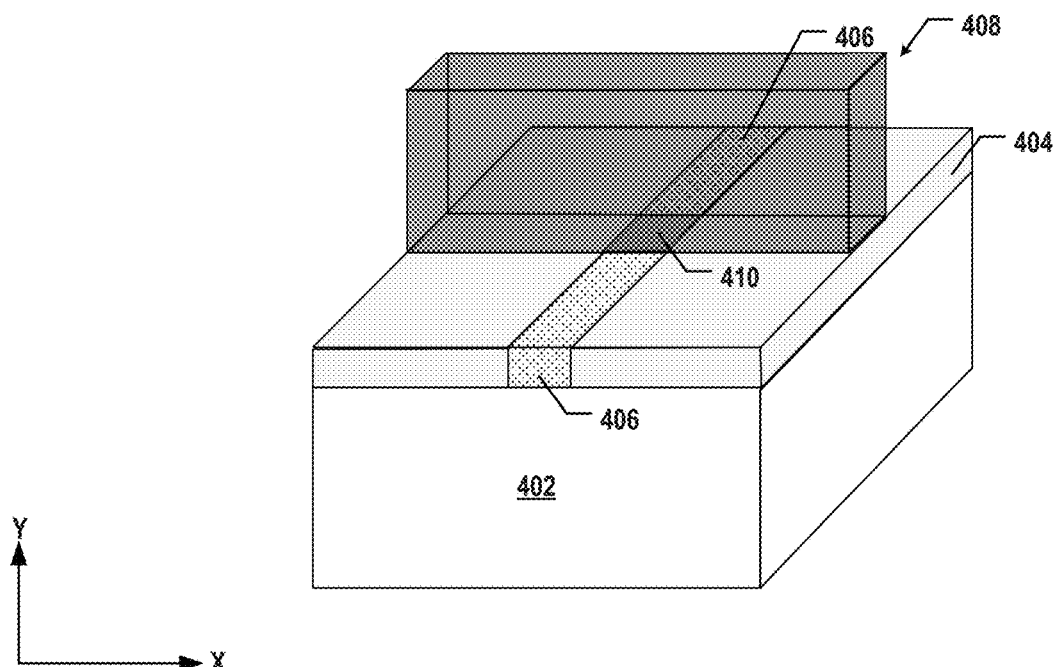
FIG. 4 illustrates a perspective view of a planar transistor, according to some aspects of the present disclosure.
Figure 5:
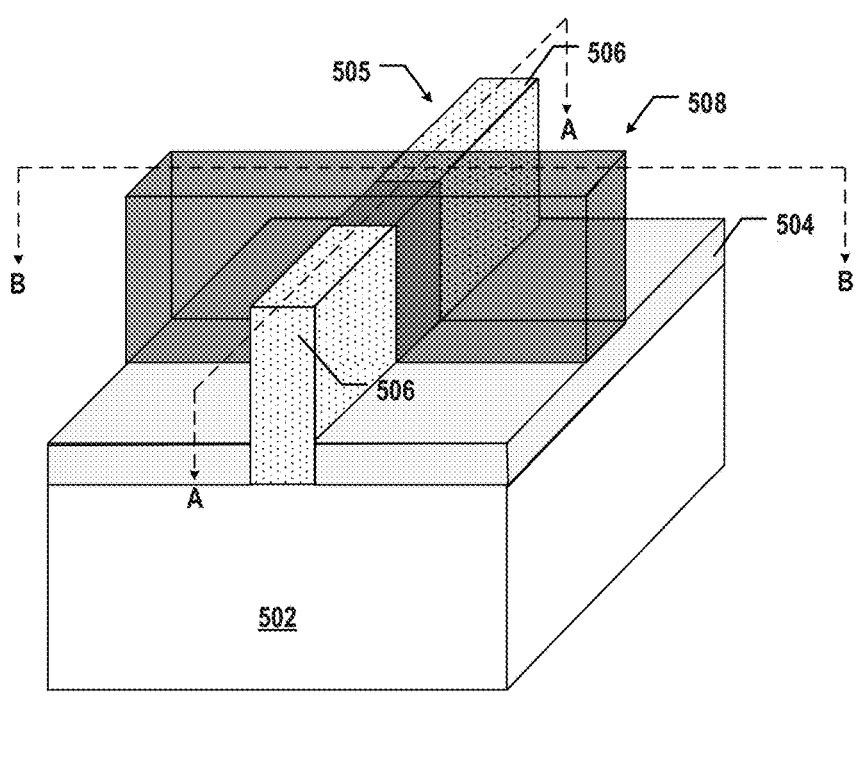
FIG. 5 illustrates a perspective view of a 3D transistor, according to some aspects of the present disclosure.

As shown in FIG. 4, a planar transistor 400 can be a MOS field-effect-transistor (MOSFET) on a substrate 402, which can include silicon (e.g., single crystalline silicon, c-Si), silicon germanium (SiGe), gallium arsenide (GaAs), germanium (Ge), silicon on insulator (SOI), or any other suitable materials. It is noted that x- and y-axes are added in FIG. 4 to further illustrate the spatial relationships of the components of a semiconductor device (e.g., planar transistor 400). Substrate 402 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., planar transistor 400) is determined relative to the substrate of the semiconductor device (e.g., substrate 402) in the y-direction (the vertical direction or thickness direction) when the substrate is positioned in the lowest plane of the semiconductor device in the y-direction. The same notion for describing the spatial relationship is applied throughout the present disclosure.

Trench isolations 404, such as shallow trench isolations (STI), can be formed in substrate 402 and between adjacent planar transistors 400 to reduce current leakage. Trench isolations 404 can include any suitable dielectric materials, such as silicon oxide, silicon nitride, silicon oxynitride, or high-k dielectrics (e.g., aluminum oxide, hafnium oxide, zirconium oxide, etc.). In some implementations, high-k dielectric materials include any dielectrics having a dielectric constant, or k-value, higher than that of silicon nitride (k>7). In some implementations, trench isolation 404 includes silicon oxide.

As shown in FIG. 4, planar transistor 400 can also include a gate structure 408 on substrate 402. In some implementations, gate structure 408 is on the top surface of substrate 402. Although not shown, gate structure 408 can include a gate dielectric on substrate 402, i.e., above and in contact with the top surface of substrate 402. Gate structure 408 can also include a gate electrode on the gate dielectric, i.e., above and in contact with the gate dielectric. The gate dielectric can include any suitable dielectric materials, such as silicon oxide, silicon nitride, silicon oxynitride, or high-k dielectrics. In some implementations, the gate dielectric includes silicon oxide, i.e., a gate oxide. The gate electrode can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. In some implementations, the gate electrode includes doped polysilicon, i.e., a gate poly.

As shown in FIG. 4, planar transistor 400 can further include a pair of a source and a drain 406 in substrate 402. Source and drain 406 can be doped with any suitable P-type dopants, such as boron (B) or Gallium (Ga), or any suitable N-type dopants, such as phosphorus (P) or arsenic (As). Source and drain 406 can be separated by gate structure 408 in the plan view. In other words, gate structure 408 is formed between source and drain 406 in the plan view, according to some implementations. A channel 410 of planar transistor 400 in substrate 402 can be formed laterally between source and drain 406 under gate structure 408 when a gate voltage applied to the gate electrode of gate structure 408 is above the threshold voltage of planar transistor 400. As shown in FIG. 4, gate structure 408 can be above and in contact with the top surface of the part of substrate 402 in which channel 410 can be formed (the active region). That is, gate structure 408 is in contact with only one side of the active region, i.e., in the plane of the top surface of substrate 402, according to some implementations. Gate structure 408 further includes a gate dielectric (e.g., gate oxide, not shown in FIG. 4) between the gate electrode and channel 410. It is understood although not shown in FIG. 4, planar transistor 400 may include additional components, such as wells and spacers.

As shown in FIG. 5, a 3D transistor 500 can be a MOSFET on a substrate 502, which can include silicon (e.g., single crystalline silicon, c-Si), SiGe, GaAs, Ge, silicon on insulator SOI, or any other suitable materials. In some implementations, substrate 502 includes single crystalline silicon. Trench isolations 504, such as STI, can be formed in substrate 502 and between adjacent 3D transistors 500 to reduce current leakage. Trench isolations 504 can include any suitable dielectric materials, such as silicon oxide, silicon nitride, silicon oxynitride, or high-k dielectrics (e.g., aluminum oxide, hafnium oxide, zirconium oxide, etc.). In some implementations, high-k dielectric materials include any dielectrics having a dielectric constant, or k-value, higher than that of silicon nitride (k>7). In some implementations, trench isolation 404 includes silicon oxide.

As shown in FIG. 5, different from planar transistor 400, 3D transistor 500 can further include a 3D semiconductor body 505 above substrate 502. That is, in some implementations, 3D semiconductor body 505 at least partially extends above the top surface of substrate 502 to expose not only the top surface, but also the two side surfaces, of 3D semiconductor body 505. As shown in FIG. 5, for example, 3D semiconductor body 505 may be in a 3D structure, which is also known as a "fin," to expose three sides thereof. As described below with respect to the fabrication process of 3D transistor 500, 3D semiconductor body 505 is formed from substrate 502 and thus, has the same semiconductor material as substrate 502, according to some implementations. In some implementations, 3D semiconductor body 505 includes single crystalline silicon. Since the channels can be formed in 3D semiconductor body 505, 3D semiconductor body 505 (e.g., the fin), as opposed to substrate 502, may be viewed as the active region for 3D transistor 500.

Figure 6A:
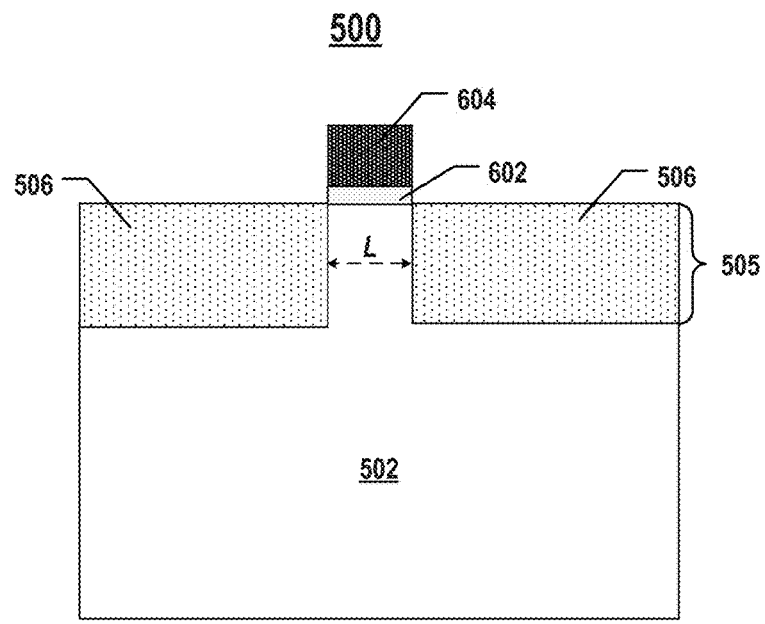
FIGS. 6A and 6B illustrate side views of two cross-sections of the 3D transistor in FIG. 5, according to some aspects of the present disclosure.
Figure 6B:
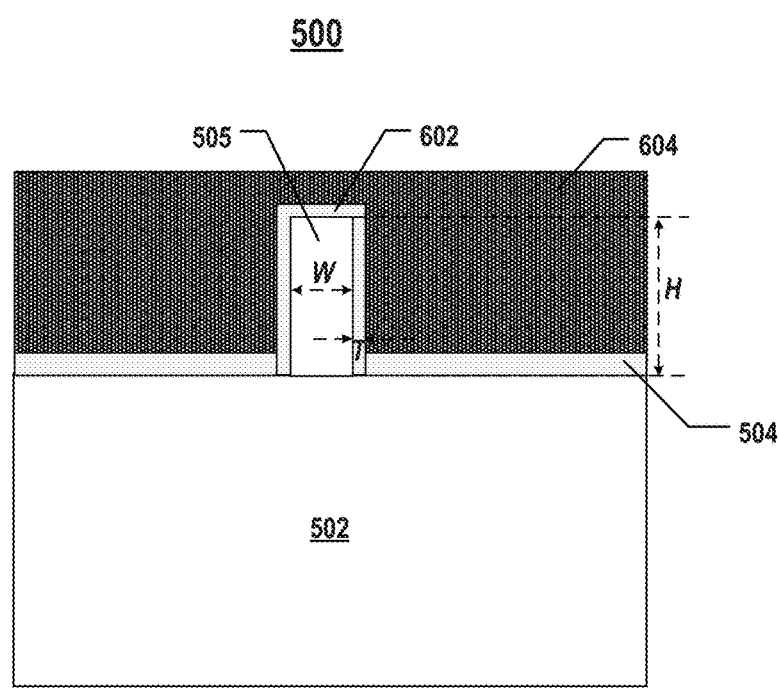

FIG. 6A illustrates a side view of the cross-section of 3D transistor 500 in FIG. 5 in the AA plane, according to some aspects of the present disclosure. FIG. 6B illustrates a side view of the cross-section of 3D transistor 500 in FIG. 5 in the BB plane, according to some aspects of the present disclosure. As shown in FIGS. 5 and 6B, 3D transistor 500 can also include a gate structure 508 on substrate 502. Different from planar transistors 400 in which gate structure 408 is in contact with only one side of the active region, i.e., in the plane of the top surface of substrate 402, gate structure 508 of 3D transistor 500 can be in contact with a plurality of sides of the active region, i.e., in multiple planes of the top surface and side surfaces of the 3D semiconductor body 505. In other words, the active region of 3D transistor 500, i.e., 3D semiconductor body 505, can be at least partially surrounded by gate structure 508.

Gate structure 508 can include a gate dielectric 602 over 3D semiconductor body 505, e.g., in contact with the top surface and two side surfaces of 3D semiconductor body 505. Gate structure 508 can also include a gate electrode 604 over and in contact with gate dielectric 602. Gate dielectric 602 can include any suitable dielectric materials, such as silicon oxide, silicon nitride, silicon oxynitride, or high-k dielectrics. In some implementations, gate dielectric 602 includes silicon oxide, i.e., a gate oxide. Gate electrode 604 can include any suitable conductive materials, such as polysilicon, metals (e.g., W, Cu, Al, etc.), metal compounds (e.g., TiN, TaN, etc.), or silicides. In some implementations, gate electrode 604 includes doped polysilicon, i.e., a gate poly.

As shown in FIGS. 5 and 6A, 3D transistor 500 can further include a pair of a source and a drain 506 (dope regions, a.k.a., source electrode and drain electrode) in substrate 502. Source and drain 506 can be doped with any suitable P-type dopants, such as B or Ga, or any suitable N-type dopants, such as P or Ar. Source and drain 506 can be separated by gate structure 508 in the plan view. In other words, gate structure 508 is formed between source and drain 506 in the plan view, according to some implementations. As a result, multiple channels of 3D transistor 500 in 3D semiconductor body 505 can be formed laterally between a source and a drain 506 surrounded by gate structure 508 when a gate voltage applied to gate electrode 604 of gate structure 508 is above the threshold voltage of 3D transistor 500. Different from planar transistor 400 in which only a single channel can be formed on the top surface of substrate 402, multiple channels can be formed on the top surface and side surfaces of 3D semiconductor body 505 in 3D transistor 500. In some implementations, 3D transistor 500 includes a multi-gate transistor. That is, different from planar transistor 400 that includes only a single gate, 3D transistors 500 can include a plurality of gates on a plurality of sides of 3D semiconductor body 505 due to the 3D structure of 3D semiconductor body 505 and gate structure 508 that surrounds the plurality of sides of 3D semiconductor body 505. As a result, compared with planar transistor 400, 3D transistor 500 can have a larger gate control area to achieve better channel control with a smaller subthreshold swing. During the off state, since the channel is fully depleted, the leakage current (100 of 3D transistor 500 can be significantly reduced a well. On the other hand, the dimensions of 3D transistor 500 can be significantly reduced from planar transistor 400 while still maintaining the same electrical performance (e.g., channel control, subthreshold swing, and/or leakage current) as planar transistor 400.

It is understood that although 3D transistors (e.g., FinFET) are also used in logic devices (e.g., microprocessors) using advanced technology nodes (e.g., sub-22 nm), as described above, due to the different requirements for transistors between logic devices and memory peripheral circuits, the designs of 3D transistors 500 may also exhibit unique features that are not found in the 3D transistors used in logic devices. From the material perspective, in some implementations, different from the 3D transistors (e.g., FinFET) in logic devices using advanced technology nodes (e.g., sub-22 nm), which uses HKMG (i.e., high-k dielectric for gate dielectric, and metal for gate electrode), 3D transistor 500 in memory peripheral circuits uses gate poly and gate oxide instead of HKMG to reduce the manufacturing cost and complexity.

From the transistor dimension perspective, 3D transistors 500 in memory peripheral circuits may not scale down following the same trend of logic devices (e.g., microprocessor) using advanced technology nodes (e.g., sub-22 nm). The differences in dimensions can allow 3D transistors 500 to be used at a higher voltage (e.g., 3.3 V and above) that is typically not used and undesirable for the 3D transistors (e.g., FinFET) in logic devices using advanced technology nodes (e.g., sub-22 nm). The differences in dimensions can also significantly reduce the manufacturing cost and complexity of 3D transistors 500 in memory peripheral circuits.

For example, in some implementations, as shown in FIG. 6B, the width (W) of 3D semiconductor body 505 is greater than 10 nm. For example, the width of 3D semiconductor body 505 may be between 30 nm and 1,000 nm (e.g., 30 nm, 40 nm, 50 nm, 60 nm, 70 nm, 80 nm, 90 nm, 100 nm, 200 nm, 300 nm, 400 nm, 500 nm, 600 nm, 700 nm, 800 nm, 900 nm, 1,000 nm, any range bounded by the lower end by any of these values, or in any range defined by any two of these values). The width of 3D transistor 500 may be significantly greater than (e.g., one or more times or even one or more orders of magnitude) that of the 3D transistors (e.g., FinFET) used in logic devices using advanced technology nodes (e.g., sub-22 nm).

In some implementations, as shown in FIG. 6B, the height (H) of 3D semiconductor body 505 is greater than 40 nm. For example, the height of 3D semiconductor body 505 may be between 50 nm and 1,000 nm (e.g., 50 nm, 60 nm, 70 nm, 80 nm, 90 nm, 100 nm, 200 nm, 300 nm, 400 nm, 500 nm, 600 nm, 700 nm, 800 nm, 900 nm, 1,000 nm, any range bounded by the lower end by any of these values, or in any range defined by any two of these values). The height of 3D transistor 500 may be significantly greater than (e.g., one or more times or even one or more orders of magnitude) that of the 3D transistors (e.g., FinFET) used in logic devices using advanced technology nodes (e.g., sub-22 nm).

In some implementations, as shown in FIG. 6B, the thickness (T) of gate dielectric 602 is greater than 1.8 nm. For example, the thickness of gate dielectric 602 may be between 2 nm and 100 nm (e.g., 2 nm, 3 nm, 4 nm, 5 nm, 6 nm, 7 nm, 8 nm, 9 nm, 10 nm, 20 nm, 30 nm, 40 nm, 50 nm, 60 nm, 70 nm, 80 nm, 90 nm, 100 nm, any range bounded by the lower end by any of these values, or in any range defined by any two of these values). The thickness of gate dielectric 602 may be significantly greater than (e.g., one or more times or even one or more orders of magnitude) that of the 3D transistors (e.g., FinFET) used in logic devices using advanced technology nodes (e.g., sub-22 nm). As a result, with a thicker gate dielectric 602, 3D transistors 500 can sustain a higher voltage (e.g., 3.3 V and above) than the 3D transistors (e.g., FinFET) used in logic devices using advanced technology nodes (e.g., sub-22 nm).

In some implementations, as shown in FIG. 6A, the channel length (L) of 3D transistor 500 is greater than 30 nm. For example, the channel length of 3D transistor 500 may be between 50 nm and 1,500 nm (e.g., 50 nm, 60 nm, 70 nm, 80 nm, 90 nm, 100 nm, 200 nm, 300 nm, 400 nm, 500 nm, 600 nm, 700 nm, 800 nm, 900 nm, 1,000 nm, 1,100 nm, 1,200 nm, 1,300 nm, 1,400 nm, 1,500 nm, any range bounded by the lower end by any of these values, or in any range defined by any two of these values). The channel length of 3D transistor 500 may be significantly greater than (e.g., one or more times or even one or more orders of magnitude) that of the 3D transistors (e.g., FinFET) used in logic devices using advanced technology nodes (e.g., sub-22 nm).

It is understood, although not shown in FIGS. 5, 6A, and 6B, 3D transistor 500 may include additional components, such as wells and spacers. It is also understood that different from the 3D transistors (e.g., FinFET) used in logic devices using advanced technology nodes (e.g., sub-22 nm) that include a stressor including GaAs or SiGe (a.k.a. strain elements) at the source and drain or use strained-silicon technology to apply strain in the channel in order to increase carrier mobility, 3D transistor 500 may not include a stressor at source and drain 506 and/or may not use strained semiconductor materials in 3D semiconductor body 505 due to its relatively large dimensions, as well as to reduce the manufacturing complexity and cost.

It is further understood that FIGS. 5, 6A, and 6B illustrate one example of 3D transistors (e.g., FinFETs) that can be used in memory peripheral circuits, and any other suitable 3D transistors, such as gate all around (GAA) FETs, may be used in memory peripheral circuits as well. For example, FIGS. 7A-7I illustrate side views of cross-sections of various 3D transistors, according to various aspects of the present disclosure. Similar to 3D transistor 500 in FIGS. 5, 6A, and 6B, each of the 3D transistors in FIGS. 7A-7I can be a multi-gate transistor having a 3D semiconductor body above the substrate, and a gate structure in contact with more than one side of the 3D semiconductor body. The gate structure can include a gate dielectric and a gate electrode. For example, FIGS. 7A, 7B, and 7C illustrate a gate all around (GAA) silicon on nothing (SON) transistor, a multiple independent gate FET (MIGET), and a FinFET, respectively, each of which is considered to be a double-gate transistor. For example, FIGS. 7D, 7E, and 7F illustrate a trigate FET, a H-gate FET, and a Ω-FET, respectively, each of which is considered to be a triple-gate transistor. For example, FIGS. 7G, 7H, and 7I illustrate a quadruple gate FET, cylindrical FET, and a multi-bridge/stacked nanowire FET, respectively, each of which is considered to be a surrounding-gate transistor. As can be seen in FIGS. 7A-7I, the cross-sections of 3D semiconductor bodies in the side views can have a square shape, a rectangular shape (or a trapezoidal shape), a circular (or an oval shape), or any other suitable shapes. It is understood that consistent with the scope of the present disclosure, for 3D semiconductor bodies that have a circular or oval shape of their cross-sections, the 3D semiconductor bodies may still be considered to having multiple sides, such that the gate structures are in contact with more than one side of the 3D semiconductor bodies. It is understood that in some examples, multiple 3D transistors (e.g., multiple FinFETs) may share a single 3D semiconductor body (e.g., a fin), i.e., formed on a single 3D semiconductor body. For example, multiple FinFETs may be arranged in parallel on a same fin, and there may not be any trench isolation (e.g., STI) formed between the multiple FinFETs sharing the same fin to separate the FinFETs.

Figure 8A:
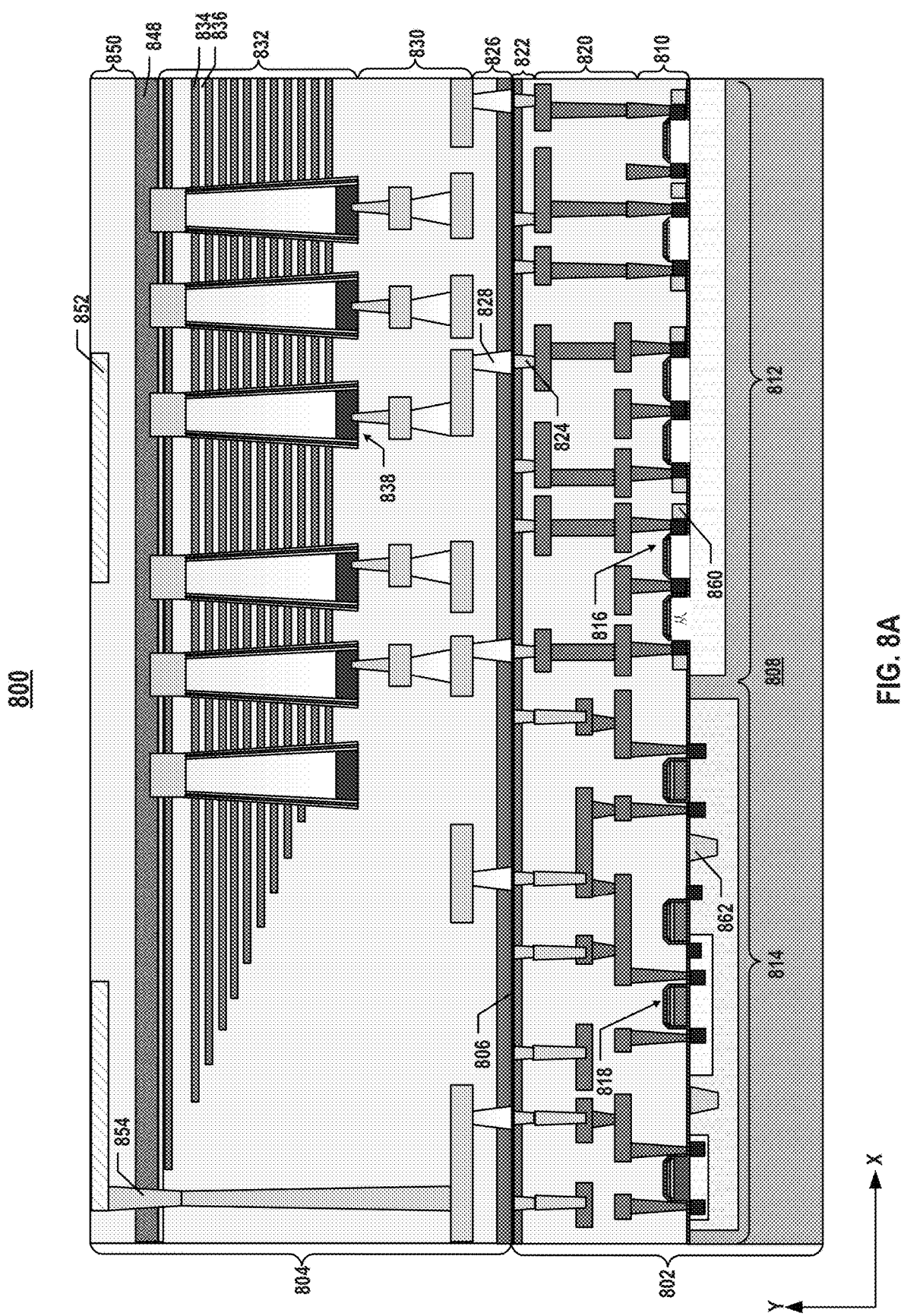
FIG. 8A illustrates a side view of a cross-section of a 3D memory device, according to some aspects of the present disclosure.

As described above with respect to FIGS. 1A and 1B, 3D transistors 500 may be one example of the transistors in the peripheral circuits of second semiconductor structure 104 bonded with first semiconductor structure 102 having a memory cell array. For example, FIG. 8A illustrates a side view of a cross-section of an exemplary 3D memory device 800, according to some implementations. It is understood that FIG. 8A is for illustrative purposes only and may not necessarily reflect the actual device structure (e.g., interconnections) in practice. As one example of 3D memory device 100 described above with respect to FIG. 1A, 3D memory device 800 is a bonded chip including a first semiconductor structure 802 and a second semiconductor structure 804 stacked over first semiconductor structure 802. First and second semiconductor structures 802 and 804 are jointed at a bonding interface 806 therebetween, according to some implementations. As shown in FIG. 8A, first semiconductor structure 802 can include a substrate 808, which can include silicon (e.g., single crystalline silicon, c-Si), SiGe, GaAs, Ge, SOI, or any other suitable materials.

First semiconductor structure 802 can include a device layer 810 above substrate 808. In some implementations, device layer 810 includes a first peripheral circuit 812 (e.g., page buffer 304, word line driver 308, and/or I/O circuit 316 and 318), and a second peripheral circuit 814 (e.g., control logic 312, registers 314, etc.). In some implementations, first peripheral circuit 812 includes a plurality of 3D transistors 816 (e.g., corresponding to 3D transistor 500), and second peripheral circuit 814 include a plurality of planar transistors 818 (e.g., corresponding to planar transistor 400). Trench isolations 860 and 862 (e.g., STIs) and doped regions (e.g., wells, sources, and drains of transistors 816 and 818) can be formed on or in substrate 808 as well. In some implementations, trench isolation 860 is on substrate 808 and laterally between two adjacent 3D transistors 816, and trench isolation 862 extends into substrate 808 and laterally between two adjacent planar transistors 818 in the plan view. In some implementations, trench isolation 862 and trench isolation 860 have different depths (e.g., the bottom surfaces thereof are in different planes in the y-direction) as they separate different types of transistors—planar transistors 818 and 3D transistors 816, respectively. For example, as shown in FIG. 8A, trench isolation 862 may have a greater depth than trench isolation 860. It is understood that depending on the different fabrication processes, in some examples, trench isolation 862 and trench isolation 860 have the same depth (e.g., the bottom surfaces thereof are in the same plane in the y-direction).

In some implementations, first semiconductor structure 802 further includes an interconnect layer 820 above device layer 810 to transfer electrical signals to and from peripheral circuits 812 and 814. Interconnect layer 820 can include a plurality of interconnects (also referred to herein as "contacts"), including lateral interconnect lines and vertical interconnect access (VIA) contacts. As used herein, the term "interconnects" can broadly include any suitable types of interconnects, such as middle-end-of-line (MEOL) interconnects and back-end-of-line (BEOL) interconnects. Interconnect layer 820 can further include one or more interlayer dielectric (ILD) layers (also known as "intermetal dielectric (IMD) layers") in which the interconnect lines and via contacts can form. That is, interconnect layer 820 can include interconnect lines and via contacts in multiple ILD layers. In some implementations, the devices in device layer 810 are coupled to one another through the interconnects in interconnect layer 820. For example, peripheral circuit 812 may be coupled to peripheral circuit 814 through interconnect layer 820.

As shown in FIG. 8A, first semiconductor structure 802 can further include a bonding layer 822 at bonding interface 806 and above interconnect layer 820 and device layer 810. Bonding layer 822 can include a plurality of bonding contacts 824 and dielectrics electrically isolating bonding contacts 824. Bonding contacts 824 can include conductive materials. The remaining area of bonding layer 822 can be formed with dielectric materials. Bonding contacts 824 and surrounding dielectrics in bonding layer 822 can be used for hybrid bonding. Similarly, as shown in FIG. 8A, second semiconductor structure 804 can also include a bonding layer 826 at bonding interface 806 and above bonding layer 822 of first semiconductor structure 802. Bonding layer 826 can include a plurality of bonding contacts 828 and dielectrics electrically isolating bonding contacts 828. Bonding contacts 828 can include conductive materials. The remaining area of bonding layer 826 can be formed with dielectric materials. Bonding contacts 828 and surrounding dielectrics in bonding layer 826 can be used for hybrid bonding. Bonding contacts 828 are in contact with bonding contacts 824 at bonding interface 806, according to some implementations.

Second semiconductor structure 804 can be bonded on top of first semiconductor structure 802 in a face-to-face manner at bonding interface 806. In some implementations, bonding interface 806 is disposed between bonding layers 822 and 826 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 806 is the place at which bonding layers 822 and 826 are met and bonded. In practice, bonding interface 806 can be a layer with a certain thickness that includes the top surface of bonding layer 822 of first semiconductor structure 802 and the bottom surface of bonding layer 826 of second semiconductor structure 804.

In some implementations, second semiconductor structure 804 further includes an interconnect layer 830 above bonding layer 826 to transfer electrical signals. Interconnect layer 830 can include a plurality of interconnects, such as MEOL interconnects and BEOL interconnects. In some implementations, the interconnects in interconnect layer 830 also include local interconnects, such as bit lines, bit line contacts, and word line contacts. Interconnect layer 830 can further include one or more ILD layers in which the interconnect lines and via contacts can form. In some implementations, first peripheral circuit 812 is page buffer 304, and 3D transistors 816 of first peripheral circuit 812 are coupled to the bit lines of second semiconductor structure 804. In some implementations, first peripheral circuit 812 is word line driver 308, and 3D transistors 816 of first peripheral circuit 812 are coupled to the word lines (e.g., conductive layers 834) of second semiconductor structure 804.

In some implementations, second semiconductor structure 804 includes a NAND Flash memory device in which memory cells are provided in the form of an array of 3D NAND memory strings 838 above interconnect layer 830 and bonding layer 826. Each 3D NAND memory string 838 extends vertically through a plurality of pairs each including a conductive layer 834 and a dielectric layer 836, according to some implementations. The stacked and interleaved conductive layers 834 and dielectric layer 836 are also referred to herein as a stack structure, e.g., a memory stack 832. Interleaved conductive layers 834 and dielectric layers 836 in memory stack 832 alternate in the vertical direction, according to some implementations. Each conductive layer 834 can include a gate electrode (gate line) surrounded by an adhesive layer and a gate dielectric layer. The gate electrode of stack conductive layer 834 can extend laterally as a word line, ending at one or more staircase structures of memory stack 832.

In some implementations, each 3D NAND memory string 838 is a "charge trap" type of NAND memory string including a semiconductor channel and a memory film. In some implementations, the semiconductor channel includes silicon, such as amorphous silicon, polysilicon, or single crystalline silicon. In some implementations, the memory film is a composite dielectric layer including a tunneling layer, a storage layer (also known as "charge trap/storage layer"), and a blocking layer. Each 3D NAND memory string 838 can have a cylinder shape (e.g., a pillar shape). The semiconductor channel, the tunneling layer, the storage layer, and the blocking layer of the memory film are arranged along a direction from the center toward the outer surface of the pillar in this order, according to some implementations. In some implementations, 3D NAND memory strings 838 further include a plurality of control gates (each being part of a word line). Each conductive layer 834 in memory stack 832 can act as a control gate for each memory cell of 3D NAND memory string 838.

In some implementations, second semiconductor structure 804 further includes a semiconductor layer 848 disposed above memory stack 832 and 3D NAND memory strings 838. Semiconductor layer 848 can be a thinned substrate on which memory stack 832 and 3D NAND memory strings 838 are formed. In some implementations, semiconductor layer 848 includes single crystalline silicon. Semiconductor layer 848 can also include isolations and doped regions (e.g., functioning as an array common source (ACS) for 3D NAND memory strings 838, not shown). It is understood that 3D NAND memory strings 838 are not limited to the "charge trap" type of 3D NAND memory strings and may be "floating gate" type of 3D NAND memory strings in other examples. Semiconductor layer 848 may include polysilicon as the source plate of the "floating gate" type of 3D NAND memory strings.

As shown in FIG. 8A, second semiconductor structure 804 can further include a pad-out interconnect layer 850 above semiconductor layer 848. Pad-out interconnect layer 850 can include interconnects, e.g., contact pads 852, in one or more ILD layers. Pad-out interconnect layer 850 and interconnect layer 830 can be formed at opposite sides of semiconductor layer 848. In some implementations, the interconnects in pad-out interconnect layer 850 can transfer electrical signals between 3D memory device 800 and outside circuits, e.g., for pad-out purposes. In some implementations, second semiconductor structure 804 further includes one or more contacts 854 extending through semiconductor layer 848 to electrically connect pad-out interconnect layer 850 and interconnect layers 830 and 820. As a result, peripheral circuits 812 and 814 can be coupled to array of 3D NAND memory strings 838 through interconnect layers 830 and 820 as well as bonding contacts 828 and 824. That is, array of 3D NAND memory strings 838 can be coupled to 3D transistors 816 and planar transistors 818 across bonding interface 806. Moreover, peripheral circuits 812 and 814 and array of 3D NAND memory strings 838 can be coupled to outside circuits through contacts 854 and pad-out interconnect layer 850.

Figure 8B:
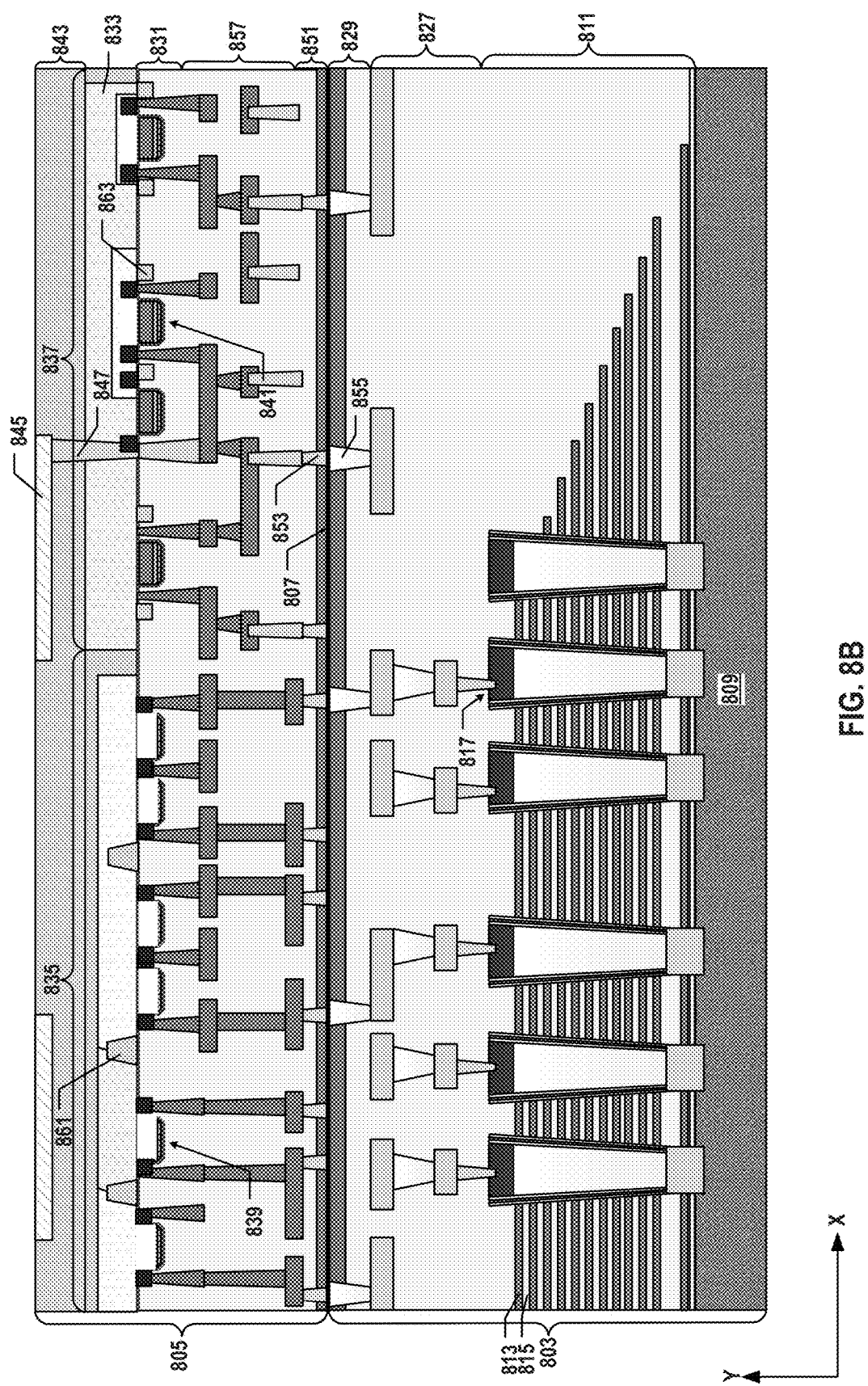
FIG. 8B illustrates a side view of a cross-section of another 3D memory device, according to some aspects of the present disclosure.

FIG. 8B illustrates a cross-section of another exemplary 3D memory device 801, according to some aspects of the present disclosure. It is understood that FIG. 8B is for illustrative purposes only and may not necessarily reflect the actual device structure (e.g., interconnections) in practice. As one example of 3D memory device 101 described above with respect to FIG. 1B, 3D memory device 801 is a bonded chip including a second semiconductor structure 803 and a first semiconductor structure 805 stacked over second semiconductor structure 803. Similar to 3D memory device 800 described above in FIG. 8A, 3D memory device 801 represents an example of a bonded chip in which first semiconductor structure 805 and second semiconductor structure 803 are formed separately and bonded in a face-to-face manner at a bonding interface 807. It is understood that the details of similar structures (e.g., materials, fabrication process, functions, etc.) in both 3D memory devices 800 and 801 may not be repeated below.

Second semiconductor structure 803 can include a substrate 809 and a memory stack 811 including interleaved conductive layers 813 and dielectric layers 815 above substrate 809. In some implementations, an array of 3D NAND memory strings 817 each extends vertically through interleaved conductive layers 813 and dielectric layers 815 in memory stack 811 above substrate 809. Each 3D NAND memory string 817 can include a semiconductor channel and a memory film. 3D NAND memory strings 817 can be "charge trap" type of 3D NAND memory strings or "floating gate" type of 3D NAND memory strings.

In some implementations, second semiconductor structure 803 also includes an interconnect layer 827 above memory stack 811 and 3D NAND memory strings 817 to transfer electrical signals to and from 3D NAND memory strings 817. Interconnect layer 827 can include a plurality of interconnects, including interconnect lines and via contacts. In some implementations, the interconnects in interconnect layer 827 also include local interconnects, such as bit lines, bit line contacts and word line contacts. In some implementations, second semiconductor structure 803 further includes a bonding layer 829 at bonding interface 807 and above interconnect layer 827 and memory stack 811 and 3D NAND memory strings 817. Bonding layer 829 can include a plurality of bonding contacts 855 and dielectrics surrounding and electrically isolating bonding contacts 855.

As shown in FIG. 8B, first semiconductor structure 805 includes another bonding layer 851 at bonding interface 807 and above bonding layer 829. Bonding layer 851 can include a plurality of bonding contacts 853 and dielectrics surrounding and electrically isolating bonding contacts 853. Bonding contacts 853 are in contact with bonding contacts 855 at bonding interface 807, according to some implementations. In some implementations, first semiconductor structure 805 also includes an interconnect layer 857 above bonding layer 851 to transfer electrical signals. Interconnect layer 857 can include a plurality of interconnects, including interconnect lines and via contacts.

First semiconductor structure 805 can further include a device layer 831 above interconnect layer 857 and bonding layer 851. In some implementations, device layer 831 includes a first peripheral circuit 835 (e.g., page buffer 304, word line driver 308, and/or I/O circuit 316 and 318), and a second peripheral circuit 837 (e.g., control logic 312, registers 314, etc.). In some implementations, peripheral circuit 835 includes a plurality of 3D transistors 839 (e.g., corresponding to 3D transistor 500), and peripheral circuits 837 include a plurality of planar transistors 841 (e.g., corresponding to planar transistor 400). Trench isolations 861 and 863 (e.g., STIs) and doped regions (e.g., wells, sources, and drains of transistors 839 and 841) can be formed on or in a semiconductor layer 833 (e.g., a thinned substrate) as well. In some implementations, trench isolation 861 is below semiconductor layer 833 and laterally between two adjacent 3D transistors 839, and trench isolation 863 extends into semiconductor layer 833 and laterally between two adjacent planar transistors 841 in the plan view. In some implementations, trench isolation 861 and trench isolation 863 have different depths (e.g., the top surfaces thereof are in different planes in they-direction) as they separate different types of transistors—planar transistors 841 and 3D transistors 839, respectively. For example, as shown in FIG. 8B, trench isolation 863 may have a greater depth than trench isolation 861. It is understood that depending on the different fabrication processes, in some examples, trench isolation 863 and trench isolation 861 have the same depth (e.g., the top surfaces thereof are in the same plane in the y-direction).

In some implementations, first peripheral circuit 835 is page buffer 304, and 3D transistors 839 of first peripheral circuit 835 are coupled to the bit lines of second semiconductor structure 803. In some implementations, first peripheral circuit 835 is word line driver 308, and 3D transistors 839 of first peripheral circuit 835 are coupled to the word lines (e.g., conductive layers 834) of second semiconductor structure 803.

In some implementations, first semiconductor structure 805 further includes semiconductor layer 833 disposed above device layer 831. Semiconductor layer 833 can be above and in contact with peripheral circuits 835 and 837. Semiconductor layer 833 can be a thinned substrate on which transistors 839 and 841 are formed. In some implementations, semiconductor layer 833 includes single crystalline silicon. Semiconductor layer 833 can also include isolations and doped regions.

As shown in FIG. 8B, first semiconductor structure 805 can further include a pad-out interconnect layer 843 above semiconductor layer 833. Pad-out interconnect layer 843 can include interconnects, e.g., contact pads 845, in one or more ILD layers. In some implementations, the interconnects in pad-out interconnect layer 843 can transfer electrical signals between 3D memory device 801 and outside circuits, e.g., for pad-out purposes. In some implementations, first semiconductor structure 805 further includes one or more contacts 847 extending through semiconductor layer 833 to couple pad-out interconnect layer 843 and interconnect layers 857 and 827. As a result, peripheral circuits 835 and 837 can also be coupled to array of 3D NAND memory strings 817 through interconnect layers 857 and 827 as well as bonding contacts 853 and 855. That is, array of 3D NAND memory strings 817 can be coupled to 3D transistors 839 and planar transistors 841 across bonding interface 807. Moreover, peripheral circuits 835 and 837 and array of 3D NAND memory strings 817 can be electrically connected to outside circuits through contacts 847 and pad-out interconnect layer 843.

Figure 8C:
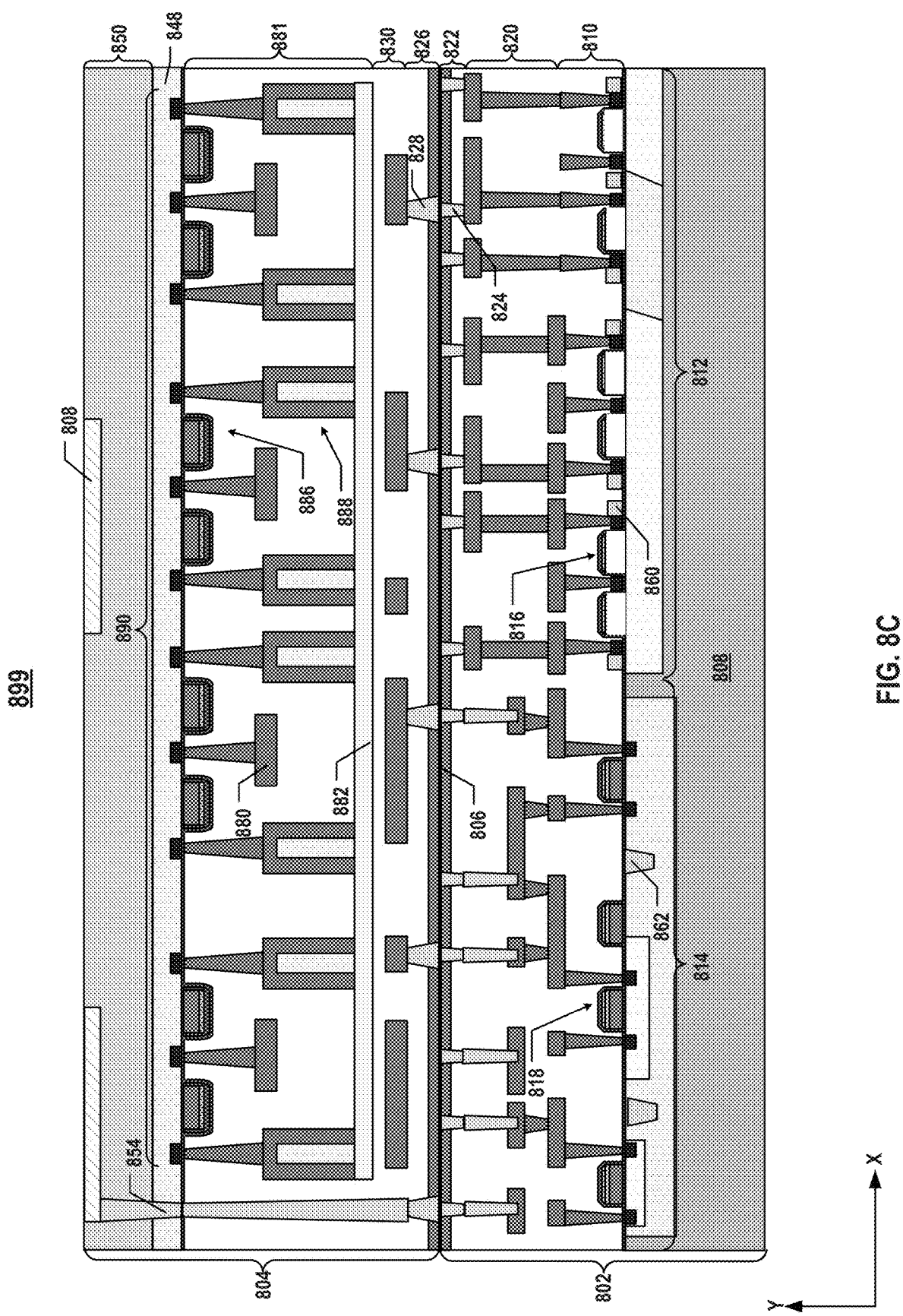
FIG. 8C illustrates a side view of a cross-section of still another 3D memory device, according to some aspects of the present disclosure.

As described above, the memory cell array in semiconductor structure 102 is not limited to NAND Flash memory cell array as shown in FIGS. 8A and 8B and may include any other suitable memory cell array, such as DRAM cell array. For example, FIG. 8C illustrates a cross-section of another exemplary 3D memory device 899, according to some aspects of the present disclosure. It is understood that FIG. 8C is for illustrative purposes only and may not necessarily reflect the actual device structure (e.g., interconnections) in practice. 3D memory device 899 is similar to 3D memory device 800 in FIG. 8A except that the memory cell array includes an array of DRAM cells 890, as opposed to an array of NAND memory strings 838. It is understood that the details of similar structures (e.g., materials, fabrication process, functions, etc. of first semiconductor structure 802) in both 3D memory devices 800 and 899 may not be repeated below.

As shown in FIG. 8C, second semiconductor structure 804 can be bonded on top of first semiconductor structure 802 that includes 3D transistors 816 in a face-to-face manner at bonding interface 806. In some implementations, bonding interface 806 is disposed between bonding layers 822 and 826 as a result of hybrid bonding.

In some implementations, second semiconductor structure 804 of semiconductor device 899 further includes an interconnect layer 830 above bonding layer 826 to transfer electrical signals to and from DRAM cells 890. Interconnect layer 830 can include a plurality of interconnects, such as MEOL interconnects and BEOL interconnects. In some implementations, the interconnects in interconnect layer 830 also include local interconnects, such as bit line contacts and word line contacts. Interconnect layer 830 can further include one or more ILD layers in which the interconnect lines and via contacts can form.

Second semiconductor structure 804 of semiconductor device 899 can further include a device layer 881 above interconnect layer 830 and bonding layer 826. In some embodiments, device layer 881 includes an array of DRAM cells 890 above interconnect layer 830 and bonding layer 826. In some embodiments, each DRAM cell 890 includes a DRAM selection transistor 886 and a capacitor 888. DRAM cell 890 can be a 1T1C cell consisting of one transistor and one capacitor. It is understood that DRAM cell 890 may be of any suitable configurations, such as 2T1C cell, 3T1C cell, etc. In some implementations, DRAM selection transistors 886 are formed "on" a semiconductor layer 848, in which the entirety or part of DRAM selection transistors 886 are formed in semiconductor layer 848 (e.g., below the top surface of semiconductor layer 848) and/or directly on semiconductor layer 848. Isolation regions (e.g., STIs) and doped regions (e.g., source regions and drain regions of DRAM selection transistors 886) can be formed in semiconductor layer 848 as well. In some implementations, capacitors 888 are disposed below DRAM selection transistors 886. Each capacitor 888 includes two electrodes, one of which is electrically connected to one node of respective DRAM selection transistor 886, according to some implementations. Another node of each DRAM selection transistor 886 is coupled to a bit line 880 of DRAM, according to some implementations. Another electrode of each capacitor 888 can be coupled to a common plate 882, e.g., a common ground. It is understood that the structure and configuration of DRAM cell 890 are not limited to the example in FIG. 8C and may include any suitable structure and configuration. For example, capacitor 888 may be a planar capacitor, a stack capacitor, a multi-fins capacitor, a cylinder capacitor, a trench capacitor, or a substrate-plate capacitor.

In some implementations, second semiconductor structure 804 further includes semiconductor layer 848 disposed above device layer 881. Semiconductor layer 848 can be above and in contact with array of DRAM cells 890. Semiconductor layer 848 can be a thinned substrate on which DRAM selection transistors 886 are formed. In some implementations, semiconductor layer 848 includes single-crystal silicon. In some implementations, semiconductor layer 848 can include polysilicon, amorphous silicon, SiGe, GaAs, Ge, or any other suitable materials. Semiconductor layer 848 can also include isolation regions and doped regions (e.g., as the sources and drains of DRAM selection transistors 886).

Figure 9:
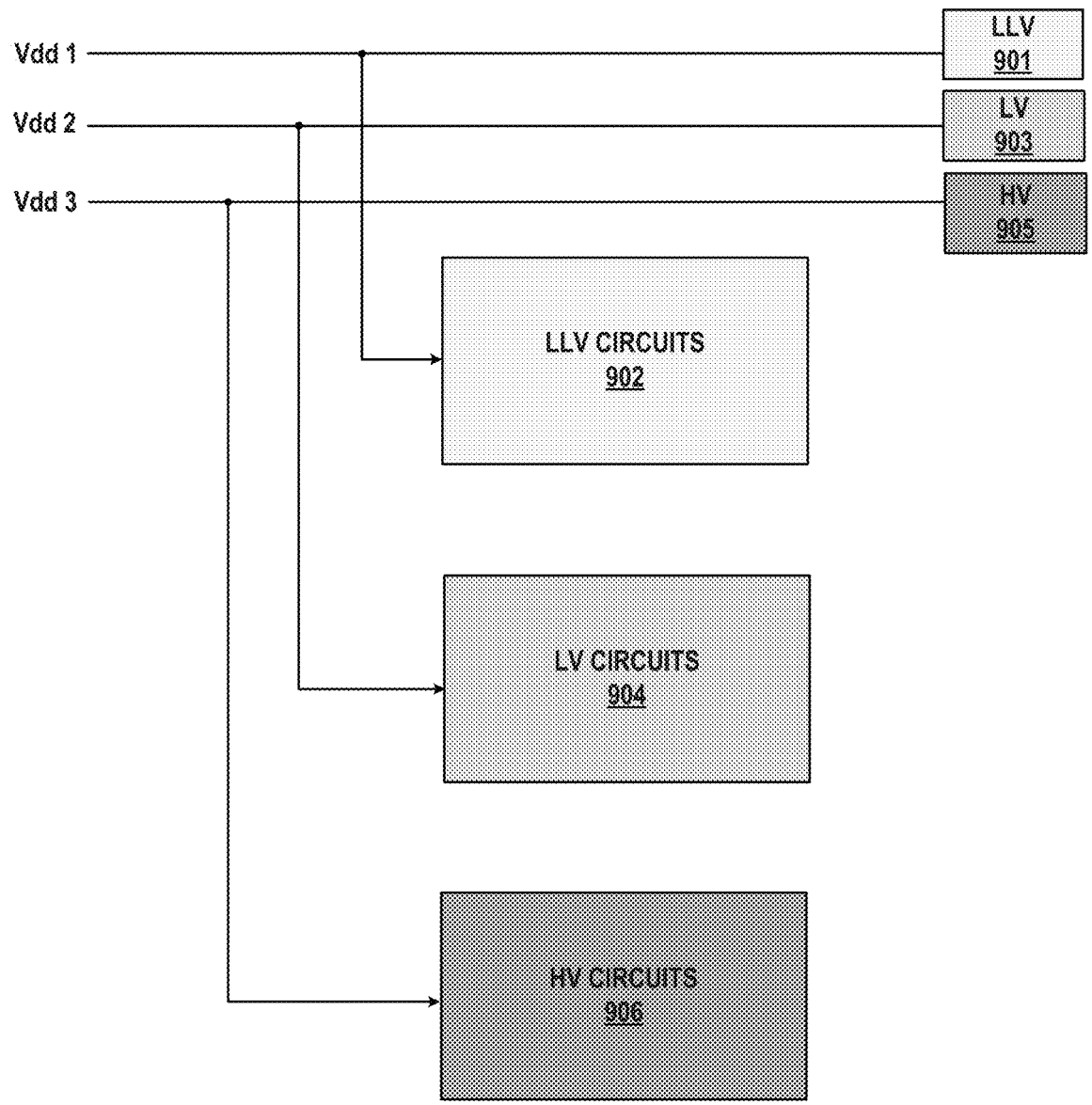
FIG. 9 illustrates a block diagram of peripheral circuits provided with various voltages, according to some aspects of the present disclosure.

As described above, different from logic devices, memory devices, such as 3D NAND Flash memory, requires a wide range of voltages to be supplied to different memory peripheral circuits, including a higher voltage (e.g., 3.3 V or above) that is not suitable for logical devices (e.g., microprocessors) in particular using advanced CMOS technology nodes (e.g., sub-22 nm), but is needed for memory operations. For example, FIG. 9 illustrates a block diagram of peripheral circuits provided with various voltages, according to some aspects of the present disclosure. In some implementations, a memory device (e.g., memory device 200) includes a low low voltage (LLV) source 901, a low voltage (LV) source 903, and a high voltage (HV) source 905, each of which is configured to provide a voltage at a respective level (Vdd1, Vdd2, or Vdd3, where Vdd1<Vdd2<Vdd3). Each voltage source 901, 903, or 905 can receive a voltage input at a suitable level from an external power source (e.g., a battery). Each voltage source 901, 903, or 905 can also include voltage converters and/or voltage regulators to convert the external voltage input to the respective level (Vdd1, Vdd2, or Vdd3) and maintain and output the voltage at the respective level (Vdd1, Vdd2, or Vdd3) through a corresponding power rail. In some implementations, voltage generator 310 of memory device 200 is part of voltage sources 901, 903, and 905.

In some implementations, LLV source 901 is configured to provide a voltage between 0.9 V and 2.0 V (e.g., 0.9 V, 0.95 V, 1 V, 1.05 V, 1.1 V, 1.15 V, 1.2 V, 1.25 V, 1.3 V, 1.35 V, 1.4 V, 1.45V, 1.5V, 1.55 V, 1.6 V, 1.65 V, 1.7 V, 1.75 V, 1.8 V, 1.85 V, 1.9 V, 1.95 V, any range bounded by the lower end by any of these values, or in any range defined by any two of these values). In one example, the voltage is 1.2 V. In some implementations, LV source 903 is configured to provide a voltage between 2 V and 3.3 V (e.g., 2 V, 2.1 V, 2.2 V, 2.3 V, 2.4 V, 2.5 V, 2.6 V, 2.7 V, 2.8 V, 2.9 V, 3 V, 3.1 V, 3.2 V, 3.3 V, any range bounded by the lower end by any of these values, or in any range defined by any two of these values). In one example, the voltage is 3.3 V. In some implementations, HV source 905 is configured to provide a voltage greater than 3.3 V. In one example, the voltage is between 5 V and 30 V (e.g., 5 V, 6 V, 7 V, 8 V, 9 V, 10 V, 11 V, 12 V, 13 V, 14 V, 15 V, 16 V, 17 V, 18 V, 19 V, 20 V, 21 V, 22 V, 23 V, 24 V, 25 V, 26 V, 27 V, 28 V, 29 V, 30 V, any range bounded by the lower end by any of these values, or in any range defined by any two of these values). It is understood that the voltage ranges described above with respect to HV source 905, LV source 903, and LLV source 901 are for illustrative purposes and non-limiting, and any other suitable voltage ranges may be provided by HV source 905, LV source 903, and LLV source 901. Nevertheless, at least the voltage levels provided by LV source 903 and HV source 905 (e.g., 2 V and above) may not be suitable for the 3D transistors (e.g., FinFET) in logic devices using advanced CMOS technology nodes (e.g., sub-22 nm).

Based on their suitable voltage levels (Vdd1, Vdd 2, or Vdd3), the memory peripheral circuits (e.g., peripheral circuits 202) can be categories into LLV circuits 902, LV circuits 904, and HV circuits 906, which can be coupled to LLV source 901, LV source 903, and HV source 905, respectively. In some implementations, HV circuits 906 includes one or more drivers that are coupled to the memory cell array (e.g., memory cell array 201) through word lines, bit lines, SSG lines, DSG lines, source lines, etc., and configured to drive the memory cell array by applying a voltage at a suitable level to the word lines, bit lines, SSG lines, DSG lines, source lines, etc., when performing memory operations (e.g., read, program, or erase). In one example, HV circuit 906 may include a word line driver (e.g., row decoder/word line driver 308) that applies a program voltage (Vprog) or a pass voltage (Vpass) in the range of, for example, 5 V and 30 V, to word lines during program operations. In another example, HV circuit 906 may include a bit line driver (e.g., column decoder/bit line driver 306) that applies an erase voltage (Veras) in the range of, for example, 5 V and 30 V, to bit lines during erase operations. In some implementations, LV circuits 904 includes a page buffer (e.g., page buffer 304) configured to buffer the data read from or programmed to the memory cell array. For example, the page buffer may be provided with a voltage of, for example, 3.3 V, by LV source 903. In some implementations, LLV circuits 902 includes an I/O circuit (e.g., interface 316 and/or data bus 318) configured to interface the memory cell array with a memory controller. For example, the I/O circuit may be provided with a voltage of, for example, 1.2 V, by LLV source 901.

At least one of LLV circuits 902, LV circuits 904, or HV circuits 906 can include 3D transistors disclosed herein (e.g., 3D transistor 500). In some implementations, each of LLV circuits 902, LV circuits 904, and HV circuits 906 include 3D transistors. In some implementations, each of LLV circuits 902 and LV circuits 904 include 3D transistors, while HV circuits 906 include planar circuits disclosed herein (e.g., planar transistor 400). Moreover, LLV circuits 902, LV circuits 904, or HV circuits 906 can be implemented with 3D transistors and/or planar transistors in any suitable combinations disclosed herein as peripheral circuits 812, 814, 835, and 837 in FIGS. 8A-8C.

Figure 10:
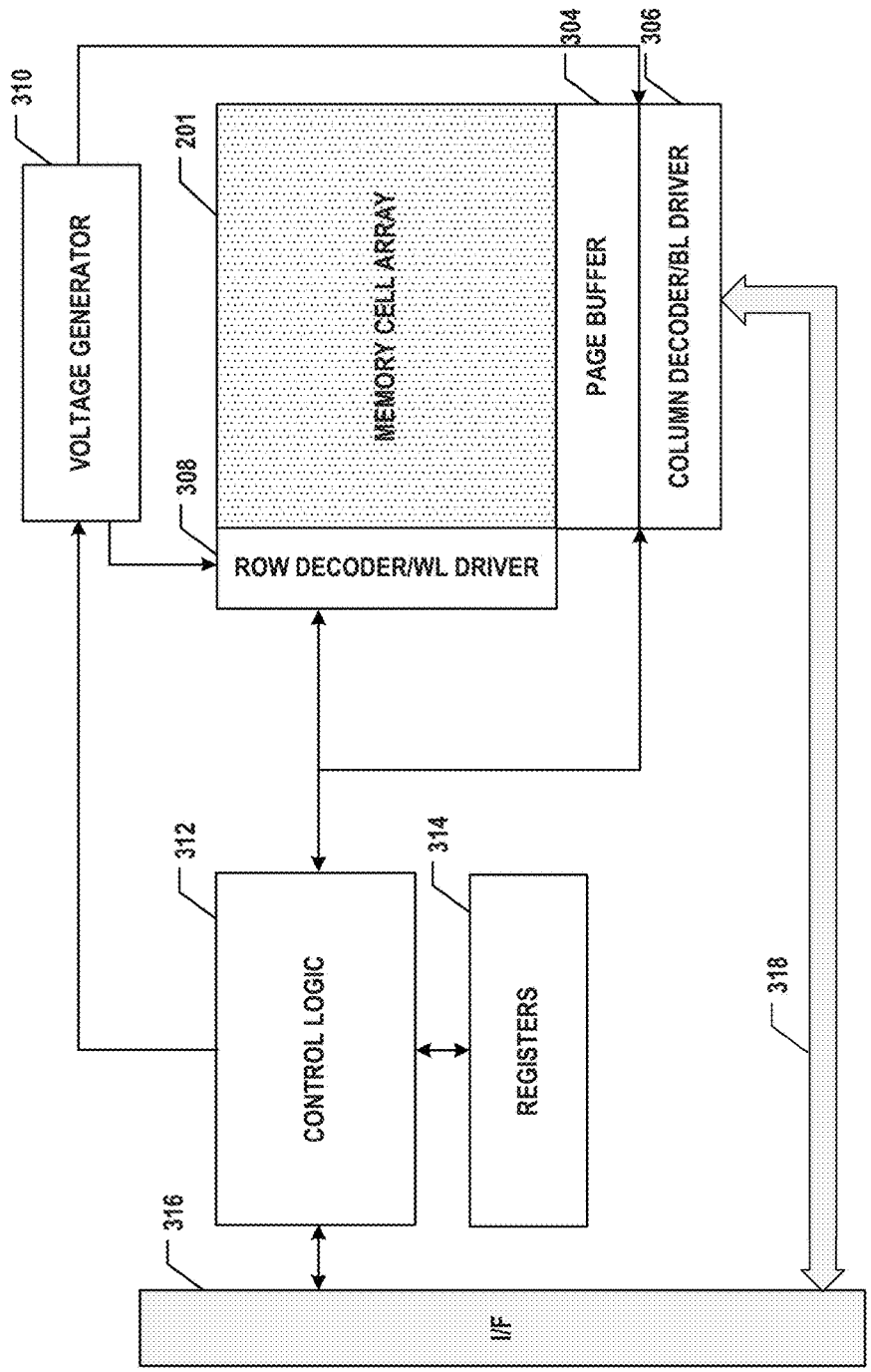
FIG. 10 illustrates a block diagram of a memory device including an input/output (I/O) circuit, according to some aspects of the present disclosure.

Consistent with the scope of the present disclosure, various designs of 3D transistors are described below in detail that are suitable to be used in LLV circuits 902, LV circuits 904, and HV circuits 906, respectively. According to some aspects of the present disclosure, as shown in FIG. 10, LLV circuits 902 of memory device 200 may be represented by an I/O circuit including, for example, interface 316 and data bus 318. The I/O circuit can be configured to interface memory cell array 201 with a memory controller. In some implementations, the I/O circuit is provided with a voltage between 0.9 V and 2.0 V, for example, 1.2 V, by LLV source 901.

Figure 11A:
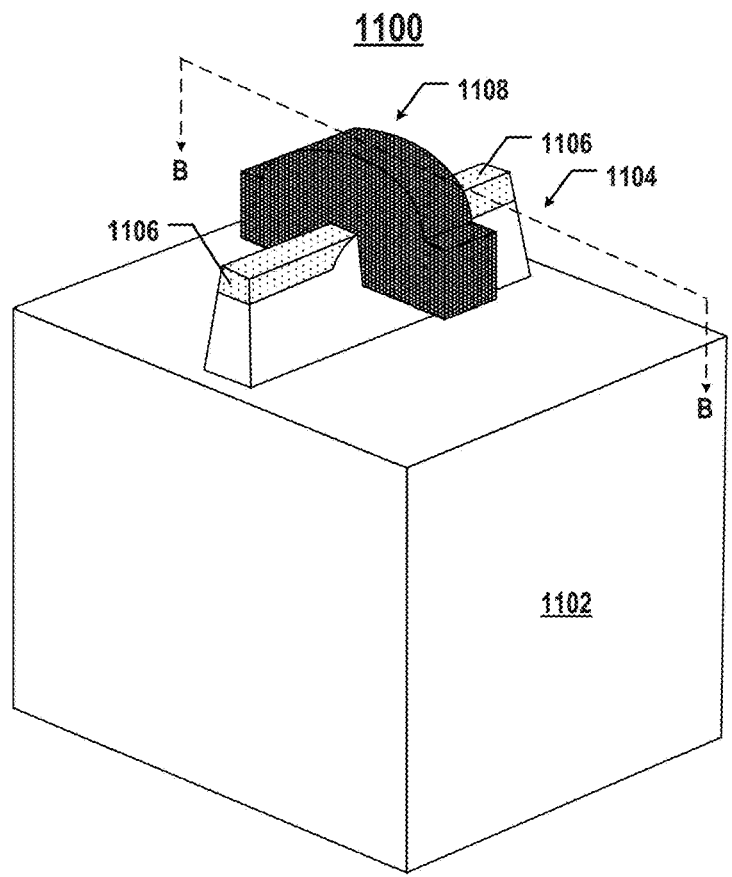
FIGS. 11A and 11B illustrate a perspective view and a side view, respectively, of a 3D transistor in the I/O circuit of FIG. 10, according to some aspects of the present disclosure.
Figure 11B:
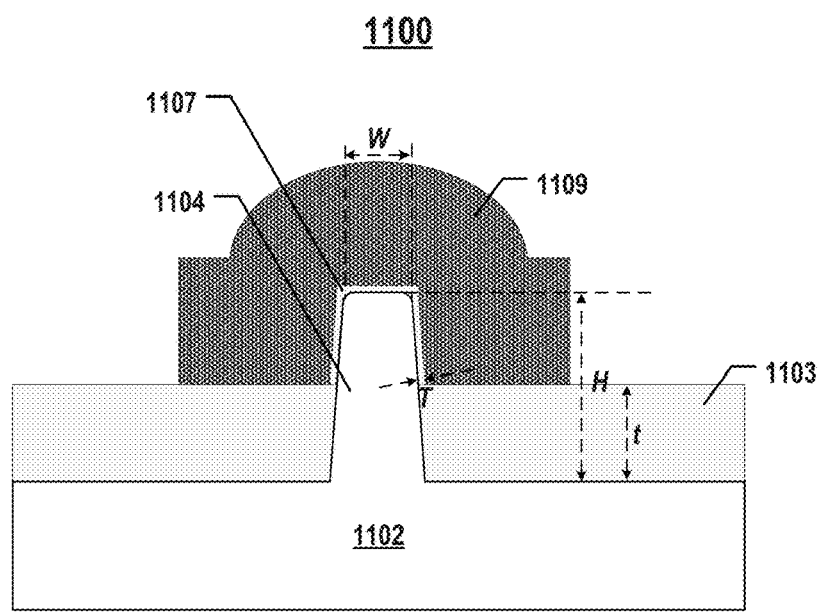

FIGS. 11A and 11B illustrate a perspective view and a side view, respectively, of a 3D transistor 1100 in the I/O circuit of FIG. 10, according to some aspects of the present disclosure. 3D transistor 1100 may be one example of 3D transistor 500 in FIGS. 5, 6A, and 6B and designed to meet the specific requirements of the I/O circuit or any other suitable LLV circuits 902, as described below in detail. FIG. 11B illustrates the side view of the cross-section of 3D transistors 1100 in FIG. 11A in the BB plane. As shown in FIGS. 11A and 11B, 3D transistor 1100 can include a 3D semiconductor body 1104 above a substrate 1102, and a gate structure 1108 in contact with a plurality of sides (e.g., the top surface and both side surfaces) of 3D semiconductor body 1104. It is understood that 3D transistor 1100 may be any suitable multi-gate transistor, for example, as shown in FIGS. 7A-7I. In some implementations, gate structure 1108 includes a gate dielectric 1107 in contact with multiple sides of 3D semiconductor body 1104 and a gate electrode 1109 in contact with gate dielectric 1107. As shown in FIGS. 11A and 11B, the top surface of gate structure 1108 (e.g., gate electrode 1109) is curved.

As shown in FIGS. 11A and 11B, 3D transistor 1100 can also include a pair of a source and a drain 1106 in 3D semiconductor body 1104 and separated by gate structure 1108 in the plan view. As shown in FIG. 11B, trench isolations 1103 (e.g., STI) can be formed in substrate 1102, such that gate structure 1108 can be formed on trench isolation 1103. In some implementations, trench isolation 1103 is also formed laterally between adjacent 3D transistors 1100 to reduce leakage current. It is understood that for ease of illustration, trench isolation 1103 is shown in FIG. 11B, but not in FIG. 11A. It is also understood that 3D transistor 1100 may include additional components not shown in FIGS. 11A and 11B, such as wells and spacers.

For 3D transistor 1100 used in an I/O circuit of memory device 200, switch speed is an important characteristic. In particular, when memory device 200 is a bonded chip, like 3D memory devices 800 and 801, which can achieve high-speed I/O throughput with reduced power consumption by using direct, short-distance (e.g., micron-level) electrical connections between two bonded semiconductor structures, the switching speed of the transistors that form the I/O circuit may become the performance bottleneck of the I/O circuit. In order to increase the switching speed, as described above, the on-state current ($I_{on}$ or $I_{dsat}$) of the transistor needs to be increased. However, at the same time, the off-state leakage current ($I_{off}$) cannot be increased as well, which is difficult to achieve by planar transistors.

Figure 12A:
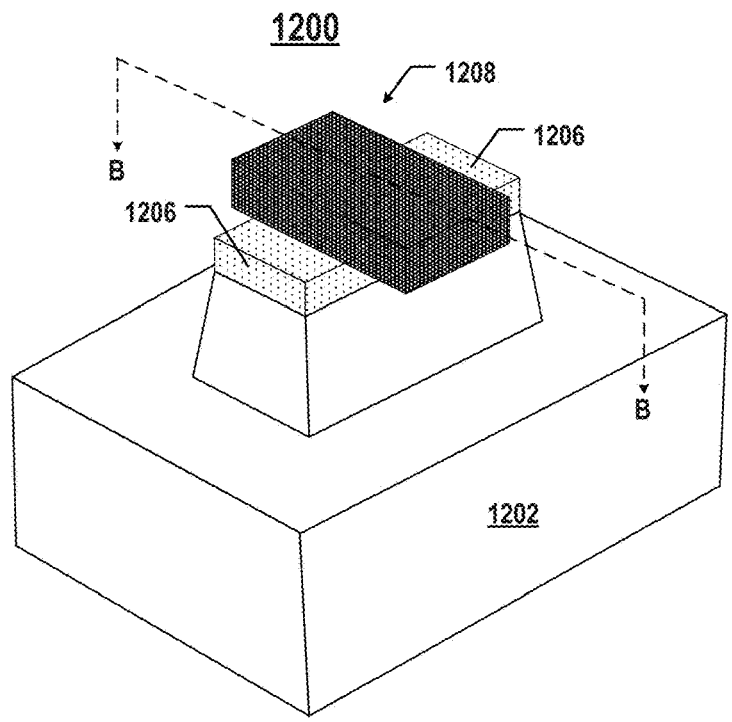
FIGS. 12A and 12B illustrate a perspective view and a side view, respectively, of a planar transistor.
Figure 12B:
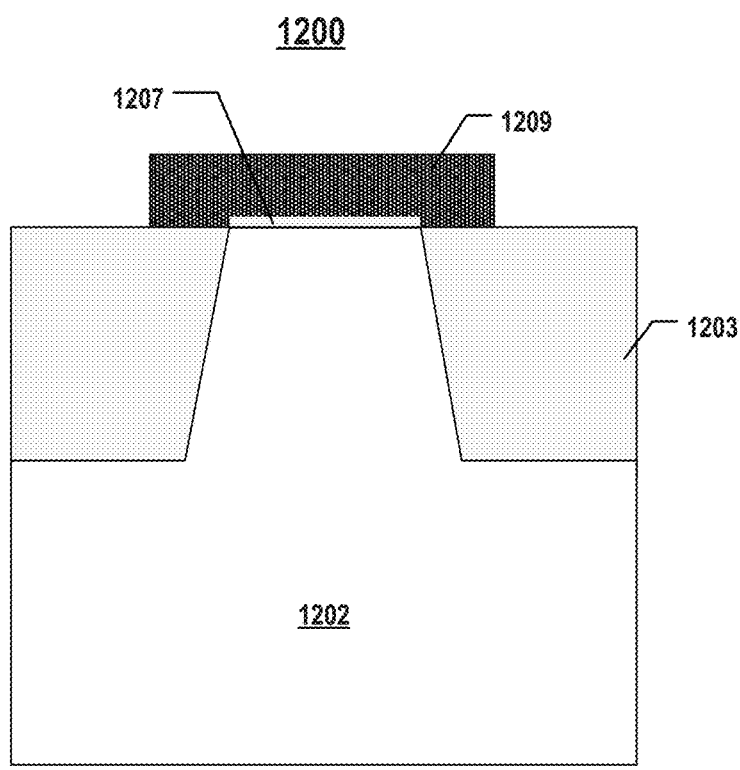

For example, FIGS. 12A and 12B illustrate a perspective view and a side view, respectively, of a planar transistor 1200. Planar transistor 1200 may be one example of planar transistor 400 in FIG. 4. Planar transistors 1200 includes a gate structure 1208 on a substrate 2102, i.e., being above and in contact with the top surface of substrate 1202. Gate structure 1208 includes a planar gate dielectric 1207 above and in contact with the top surface of substrate 1202, and a gate electrode 1209 on planar gate dielectric 1207. Planar transistor 1200 also includes a pair of a source and a drain 1206 in substrate 1202 and separated by gate structure 1208 in the plan view. Trench isolations 1203 (e.g., STI) are formed in substrate 1202 and laterally between adjacent planar transistors 1200. It is understood that for ease of illustration, trench isolation 1203 is shown in FIG. 12B, but not in FIG. 12A. Due to the smaller number of channels and gates compared with 3D transistor 1100, the channel control and subthreshold swing of planar transistor 1200 may be inferior. As a result, at the same dimensions and leakage current (off-state current), the saturated drain current (on-state current) of 3D transistor 1100 can be several times (e.g., over twice) higher than that of planar transistor 1200, according to the studies performed by the inventors. On the other hand, to maintain the same switch speed and leakage current as planar transistor 1200, the dimensions of 3D transistor 1100 can be reduced. Moreover, to further improve the electric performance of the I/O circuit, HKMG can be used in gate structure 1108 of 3D transistor 1100, which are not used by planar transistor 1200 with larger dimensions.

Referring back to FIGS. 11A and 11B, in some implementations, gate electrode 1109 of 3D transistor 1100 in the I/O circuit of memory device 200 includes a metal, such as Cu. In some implementations, gate dielectric 1107 of 3D transistor 1100 includes a high-k dielectric, such as hafnium dioxide zirconium dioxide, titanium dioxide, or any other dielectrics that have a dielectric constant higher than silicon nitride, e.g., above 3.9. That is, HKMG can be used for forming gate structure 1108 of 3D transistor 1100 in the I/O circuit of memory device 200. It is understood that in some examples, gate poly and gate oxide may be used as gate structure 1108 as well.

In some implementations, as shown in FIG. 11B, the thickness (T) of gate dielectric 1107 is between 1.8 nm and 10 nm. For example, the thickness of gate dielectric 1107 may be between 2 nm and 4 nm (e.g., 2 nm, 2.1 nm, 2.2 nm, 2.3 nm, 2.4 nm, 2.5 nm, 2.6 nm, 2.7 nm, 2.8 nm, 2.9 nm, 3 nm, 3.1 nm, 3.2 nm, 3.3 nm, 3.4 nm, 3.5 nm, 3.6 nm, 3.7 nm, 3.8 nm, 3.9 nm, 4 nm, any range bounded by the lower end by any of these values, or in any range defined by any two of these values). The thickness of gate dielectric 1107 may be greater than (e.g., one or more times) that of the 3D transistors (e.g., FinFET) used in logic devices using advanced technology nodes (e.g., sub-22 nm) and may be commensurate with the LLV voltage range applied to the I/O circuit, as described above in detail, such as between 0.9 V and 2.0 V (e.g., 1.2 V).

In some implementations, as shown in FIG. 11B, the width (W) of 3D semiconductor body 1104 is between 10 nm and 180 nm. The width of 3D semiconductor body 1104 may refer to the width at the top of 3D semiconductor body 1104 (e.g., the top critical dimension (CD)), as shown in FIG. 11B. For example, the width of 3D semiconductor body 1104 may be between 30 nm and 100 nm (e.g., 30 nm, 40 nm, 50 nm, 60 nm, 70 nm, 80 nm, 90 nm, 100 nm, any range bounded by the lower end by any of these values, or in any range defined by any two of these values). The width of 3D transistor 1100 may be greater than (e.g., one or more times) that of the 3D transistors (e.g., FinFET) used in logic devices using advanced technology nodes (e.g., sub-22 nm). On the other hand, the width of 3D transistor 1100 may be smaller than that of planar transistor 1200 used in the I/O circuit of existing memory devices. It is understood that in some examples, 3D semiconductor body 1104 may have a "dumbbell" shape that the width of 3D semiconductor body 1104 at the two sides where source and drain 1106 are formed is larger than the width of semiconductor body 1104 between source and drain 1106 due to the relatively small width of 3D semiconductor body 1104 that is not sufficient to form source and drain 1106.

In some implementations, the channel length of 3D transistor 1100 between source and drain 1106 is between 30 nm and 180 nm. The channel length of 3D transistor 1100 may refer to the distance between source and drain 1106, i.e., the dimension of gate structure 1104 that is in contact with the top surface of the channel. For example, the channel length of 3D transistor 1100 may be between 50 nm and 120 nm (e.g., 50 nm, 60 nm, 70 nm, 80 nm, 90 nm, 100 nm, 110 nm, 120 nm, any range bounded by the lower end by any of these values, or in any range defined by any two of these values). The channel length of 3D transistor 1100 may be greater than (e.g., one or more times) that of the 3D transistors (e.g., FinFET) used in logic devices using advanced technology nodes (e.g., sub-22 nm). On the other hand, the channel length of 3D transistor 1100 may be smaller than that of planar transistor 1200 used in the I/O circuit of existing memory devices.

In some implementations, as shown in FIG. 11B, the height (H) of 3D semiconductor body 1104 is between 40 nm and 300 nm. For example, the height of 3D semiconductor body 1104 may be between 50 nm and 100 nm (e.g., 50 nm, 60 nm, 70 nm, 80 nm, 90 nm, 100 nm, any range bounded by the lower end by any of these values, or in any range defined by any two of these values). The height of 3D semiconductor body 1104 may be greater than (e.g., one or more times) that of the 3D transistors (e.g., FinFET) used in logic devices using advanced technology nodes (e.g., sub-22 nm).

In some implementations, as shown in FIG. 11B, the thickness (t) of trench isolation 1103 is the same as the height of 3D semiconductor body 1104. For example, the thickness of trench isolation 1103 may be between 50 nm and 100 nm (e.g., 50 nm, 60 nm, 70 nm, 80 nm, 90 nm, 100 nm, any range bounded by the lower end by any of these values, or in any range defined by any two of these values). The thickness of trench isolation 1103 may be greater than (e.g., one or more times) that of the 3D transistors (e.g., FinFET) used in logic devices using advanced technology nodes (e.g., sub-22 nm).

Figure 13:
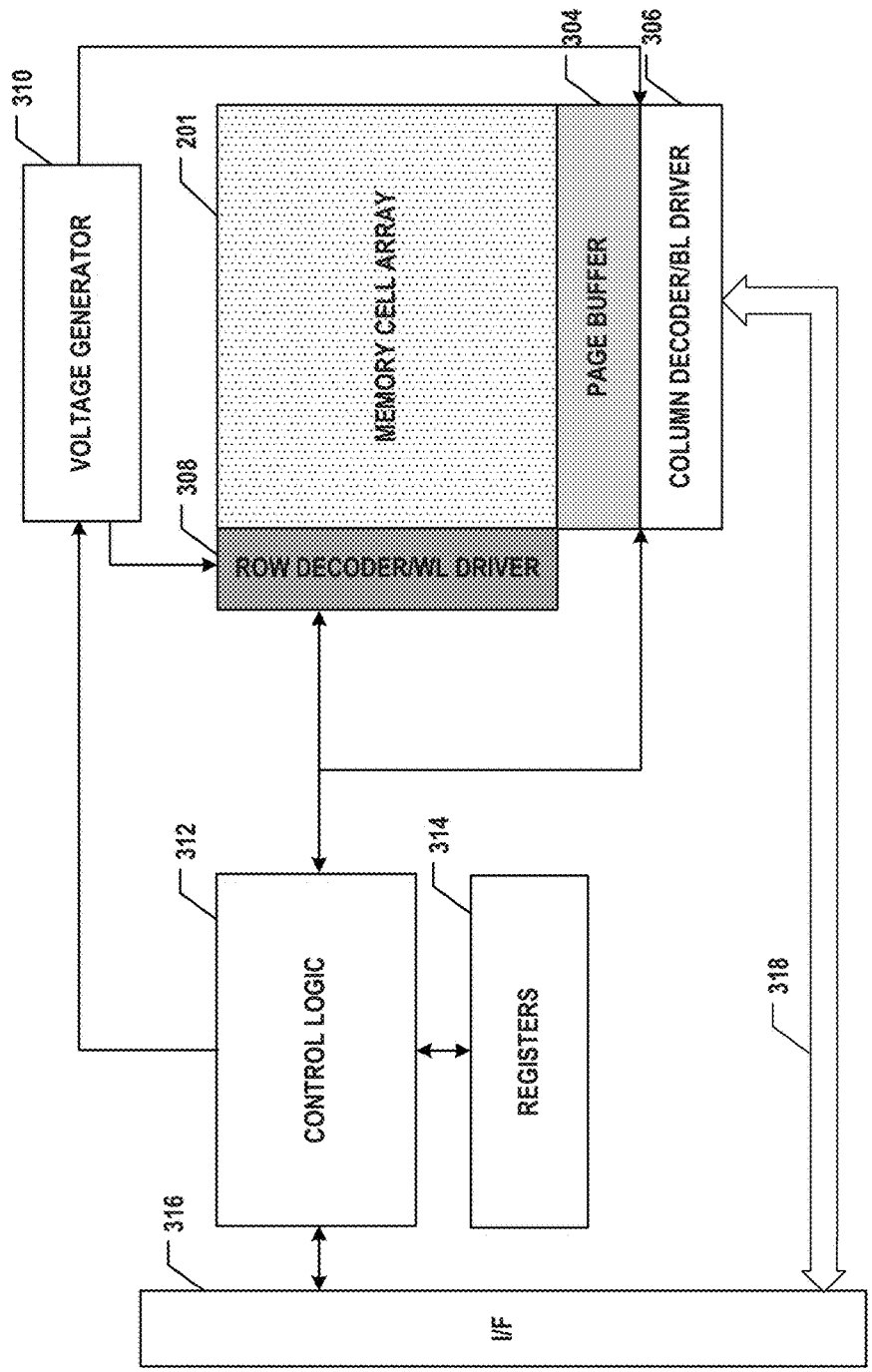
FIG. 13 illustrates a block diagram of a memory device including a word line driver and a page buffer, according to some aspects of the present disclosure.

According to some aspects of the present disclosure, as shown in FIG. 13, LV circuits 904 of memory device 200 may be represented by, for example, page buffer 304. Page buffer 304 can be configured to buffer data read from or programmed to memory cell array 201. In some implementations, page buffer 304 is provided with a voltage between 2 V and 3.3 V, for example, 3.3 V, by LV source 903. According to some aspects of the present disclosure, as shown in FIG. 13, HV circuits 906 of memory device 200 may be represented by, for example, word line driver 308. Word line driver 308 can be configured to drive memory cell array 201 through the word lines. In some implementations, word line driver 308 is provided with a voltage greater than 3.3 V, for example, between 5 V and 30 V, by HV source 905.

Figure 14:
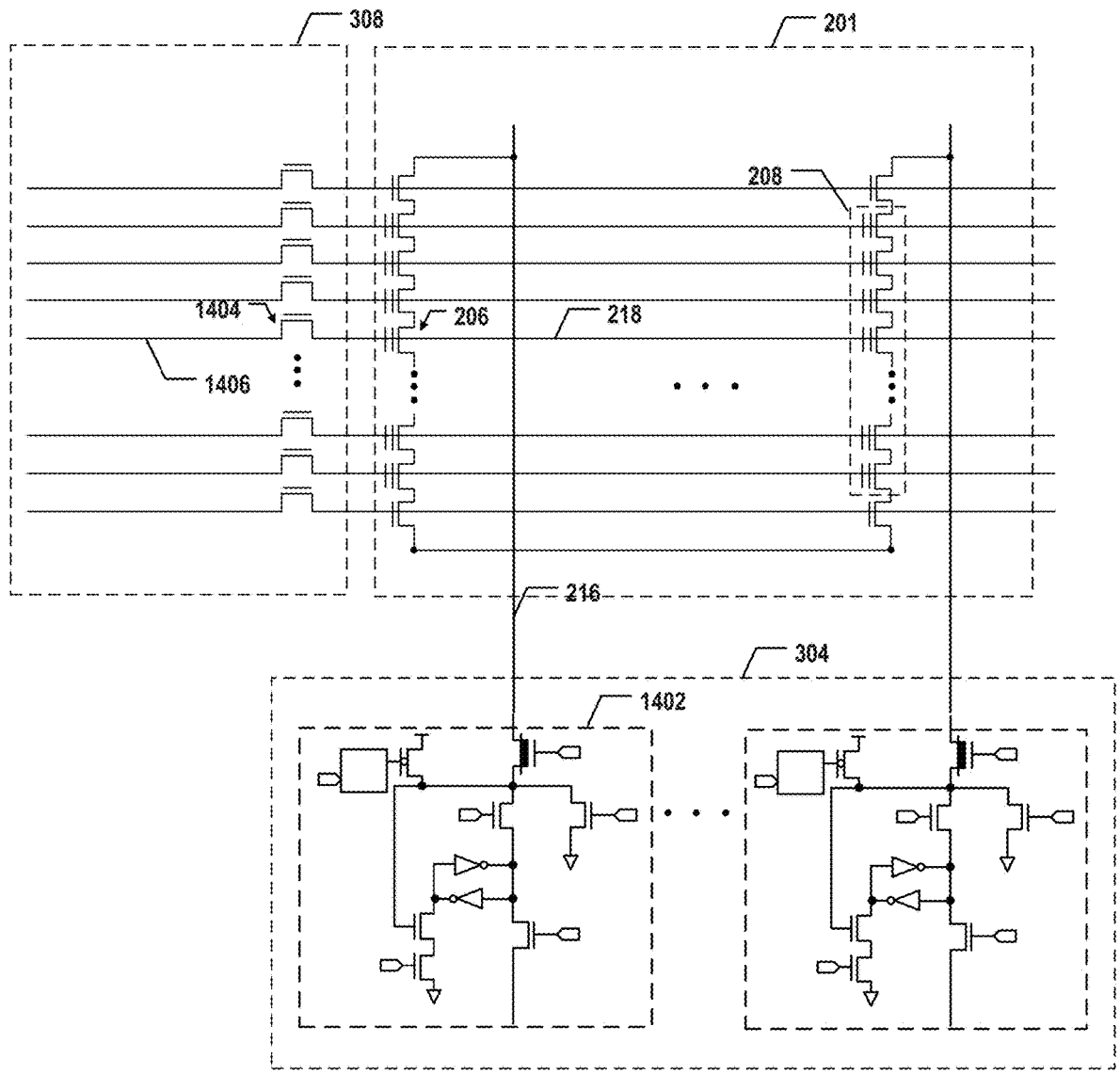
FIG. 14 illustrates schematic circuit diagrams of the word line driver and the page buffer in FIG. 13, according to some aspects of the present disclosure.

FIG. 14 illustrates schematic circuit diagrams of word line driver 308 and page buffer 304 in FIG. 13, according to some aspects of the present disclosure. In some implementations, page buffer 304 includes a plurality of sub-page buffer circuits 1402 each coupled to one 3D NAND memory string 208 via a respective bit line 216. That is, memory device 200 can include bit lines 216 respectively coupled to 3D NAND memory strings 208, and page buffer 304 can include sub-page buffer circuits 1402 respectively coupled to bit lines 216 and 3D NAND memory strings 208. Each sub-page buffer circuit 1402 can include one or more latches, switches, supplies, nodes (e.g., data nodes and I/O nodes), current mirrors, verify logic, sense circuits, etc. In some implementations, each sub-page buffer circuit 1402 is configured to store sensing data received from a respective bit line 216, e.g., sensing current, corresponding to read data. Each sub-page buffer circuit 1402 can be configured to also output the stored sensing data to at the time of the read operation. Each sub-page buffer circuit 1402 can be further configured to store program data and output the stored program data to a respective bit line 216 at the time of the program operation.

As shown in FIG. 14, each sub-page buffer circuit 1402 can include a plurality of transistors, such as 3D transistors 2000 disclosed below with respect to FIGS. 20A and 20B in detail. 3D transistor 2000 may be one example of 3D transistor 500 that is suitable for forming elements of sub-page buffer circuit 1402 in page buffer 304. In some implementations, 3D transistor 2000 in page buffer 304 is coupled to bit line 216. Thus, 3D transistors 2000 in page buffer 304 can be coupled to memory cell array 201 through bit lines 216.

In some implementations, word line driver 308 includes a plurality of string drivers 1404 (a.k.a. driving elements) respectively coupled to word lines 218. Word line driver 308 can also include a plurality of local word lines 1406 (LWLs) respectively coupled to string drivers 1404. Each string driver 1404 can include a gate coupled to a decoder (not shown), a source/drain coupled to a respective local word line 1406, and another source/drain coupled to a respective word line 218. In some memory operations, the decoder can select certain string drivers 1404, for example, by applying a voltage signal greater than the threshold voltage of string drivers 1404, and a voltage (e.g., program voltage, pass voltage, or erase voltage) to each local word line 1406, such that the voltage is applied by each selected string driver 1404 to a respective word line 218. In contrast, the decoder can also deselect certain string drivers 1404, for example, by applying a voltage signal smaller than the threshold voltage of string drivers 1404, such that each deselected string driver 1404 floats a respective word line 218 during the memory operation.

As shown in FIG. 14, each string driver 1404 can include one or more transistors, such as 3D transistors 2100 disclosed below with respect to FIGS. 21A and 21B in detail. 3D transistor 2100 may be one example of 3D transistor 500 that is suitable for forming elements of string driver 1404 in word line driver 308. In some implementations, 3D transistor 2100 in word line driver 308 is coupled to word line 218. Thus, 3D transistors 2100 in word line driver 308 can be coupled to memory cell array 201 through word lines 218.

Figure 15:
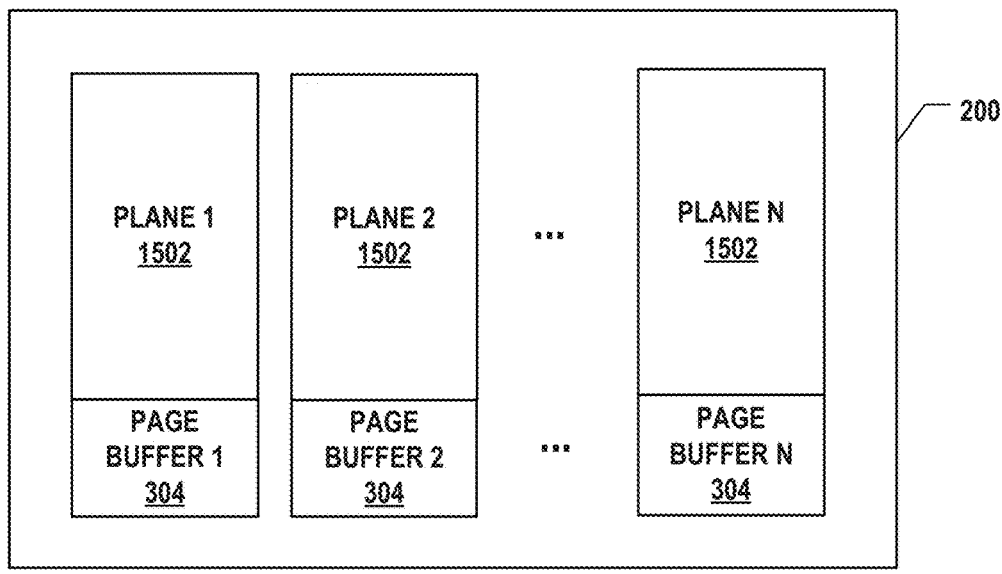
FIG. 15 illustrates a schematic plan view of a memory device having multiple planes and page buffers, according to some aspects of the present disclosure.

As shown in FIG. 15, in some implementations, memory cell array 201 is arranged in multiple planes 1502, each of which has multiple blocks 204 and its own page buffer 304. That is, memory device 200 can include multiple planes 1502 of memory cells 206 and multiple page buffers 304 respective coupled to multiple planes 1502. Although not shown in FIG. 15, it is understood that in some examples, each plane 1502 may have its own set of page buffer 304, row decoder/word line driver 308, and column decoder/bit line driver 306, such that control logic 312 can control the operations of multiple planes 1502 in parallel in a synchronous manner or asynchronous manner to increase the operating speed of memory device 200. As described above with respect to FIGS. 2 and 14, it is understood that the number of page buffers 304, and the number of sub-page buffer circuits 1402 in each page buffer 304 may increase as the number of memory cells increase due to the increased numbers of planes 1502, blocks 204, and/or 3D NAND memory strings 208 (bit lines 216). Thus, the total area of page buffers 304 keeps increasing if the device size of each transistor forming sub-page buffer circuit 1402 does not decrease. Similarly, the number of string drivers 1404 may increase as the number of memory cells increase due to the increased numbers of planes 1502, blocks 204, and/or rows 220 (word lines 218). Thus, the total area of word line driver 308 keeps increasing if the device size of each transistor forming string driver 1404 does not decrease.

Figure 16:
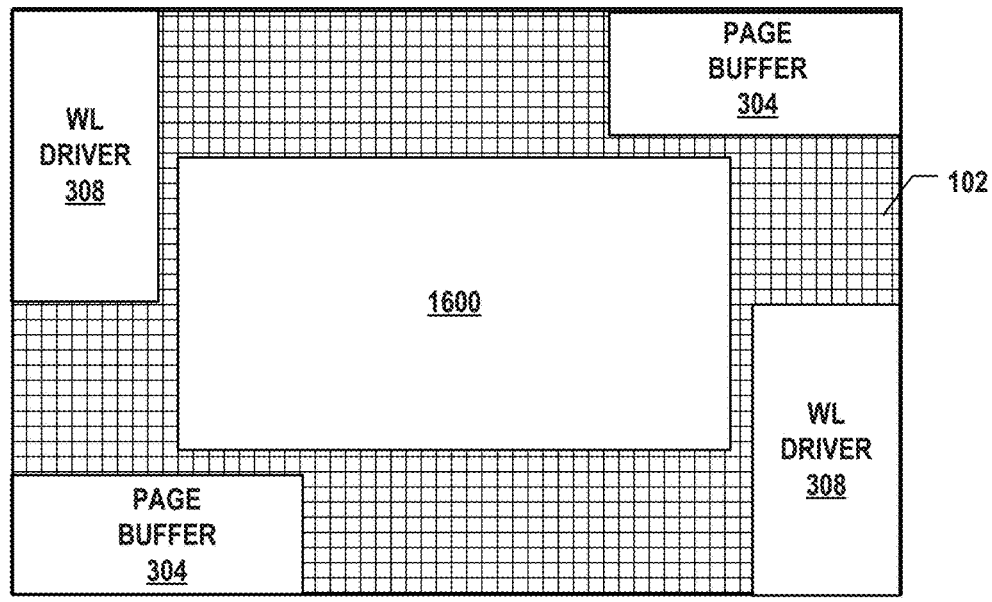
FIG. 16 illustrates a schematic plan view of a memory device having a memory cell array and peripheral circuits including page buffers and word line drivers, according to some aspects of the present disclosure.

Moreover, in 3D memory device 100 or 101 in which the peripheral circuits and the memory cell array are stacked over one another in a bonded chip, the size of 3D memory device 100 or 101 depends on the larger size of first or second semiconductor structure 102 or 104. As shown in FIG. 16, as the area of page buffers 304 continuously increases, the size of second semiconductor structure 104 (e.g., shown in FIGS. 1A and 1B) having page buffers 304, word line drivers 308, and other peripheral circuits 1600 (e.g., I/O circuits, etc.) may eventually become greater than the size of first semiconductor structure 102 having the memory cell array and thus, dominates the size of 3D memory device 100 or 101. As a result, to compensate for the size increase of memory device 200 (and in particular, 3D memory device 100 or 101), the device size of each transistor forming page buffer 304 and word line driver 308 needs to decrease without sacrificing much the performance, such as the transistor current leakage, and production yield and cost, as described above.

As described above, compared with planar transistors used for forming existing memory peripheral circuits, such as sub-page buffer circuits and string drivers, 3D transistors can shrink the device dimension without sacrificing much of the performance, such as leakage current, and manufacturing complexity and cost, due to the larger gate control area, higher on-state current, and lower off-state current. For example, FIG. 17 illustrate a design layout of planar transistors in a word line driver or a page buffer, and as a comparison, FIG. 18 illustrate a design layout of 3D transistors in word line driver 308 or page buffer 304 in FIG. 13, according to some aspects of the present disclosure.

Figure 18:
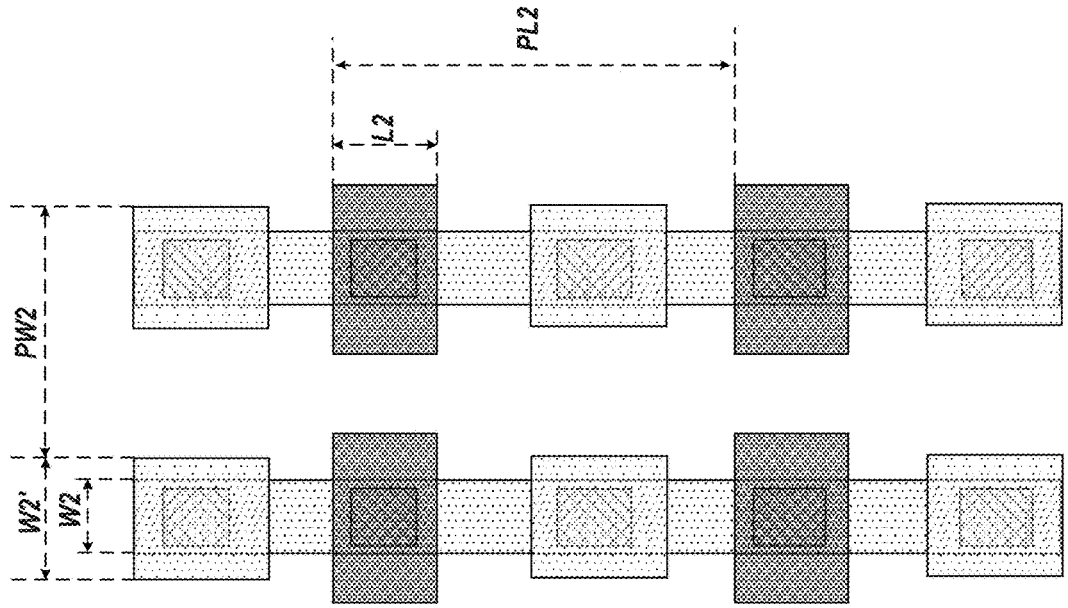
FIG. 18 illustrates a design layout of 3D transistors in the word line driver or the page buffer in FIG. 13, according to some aspects of the present disclosure.
Figure 17:
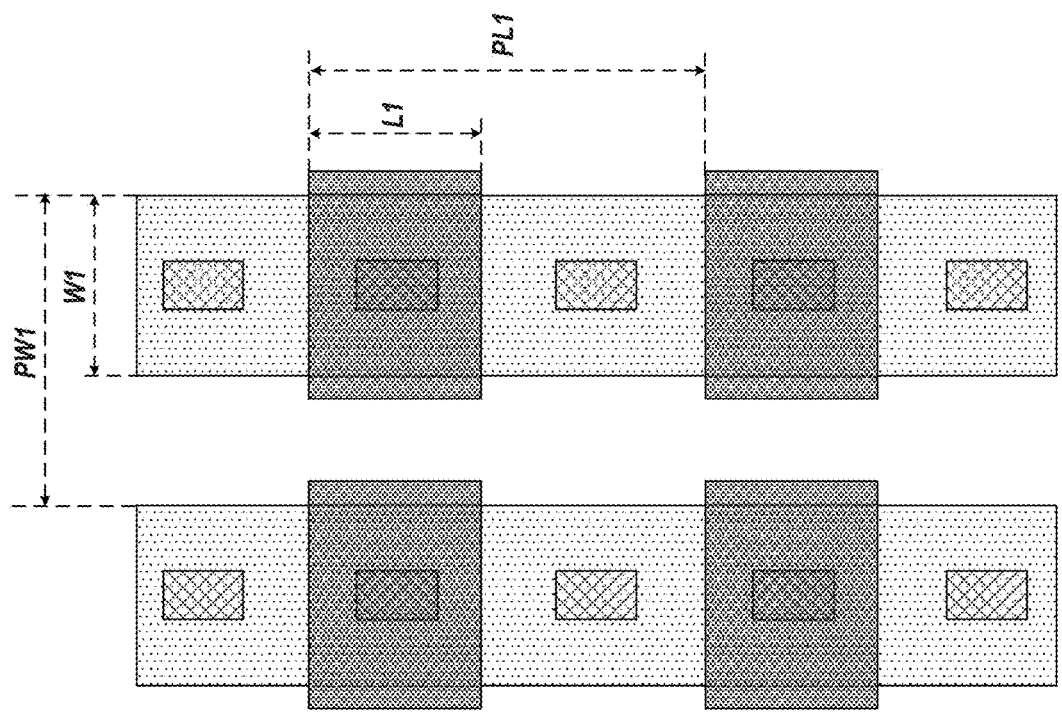
FIG. 17 illustrates a design layout of planar transistors in a word line driver or a page buffer.

As shown in FIGS. 17 and 18, the width (W) of the active region (i.e., the channel width) and/or the length (L) of the gate structure (i.e., the channel length) can be affected by switching from the planar transistors to 3D transistors. As a result, the pitch (PW) in the width direction and/or the pitch (PL) of length direction in word line driver 308 or page buffer 304 can be reduced. In some implementations, for page buffer 304, using planar transistors to form sub-page buffer circuits 1402 can only achieve a minimum channel width (W1) of 180 nm without introducing a significant leakage current increase. In contrast, according to the studies by the inventors, using 3D transistors to form sub-page buffer circuits 1402, the channel width (W2) can be reduced to below 180 nm without introducing a significant leakage current increase. For example, at the same leakage current, the pitch in the width direction can be reduced by 5% to 50% (e.g., 25%) by replacing the planar transistors with 3D transistors in forming sub-page buffer circuits 1402, thereby reducing the total area of page buffers 304. Moreover, since bit lines 216 may be arranged along the width direction, the reduction of the pitch along the width direction for sub-page buffer circuits 1402 can also accommodate more bit lines 216 and 3D NAND memory strings 208.

In some implementations, for word line driver 308, similar to page buffer 304, using 3D transistors, instead of planar transistors, to form string drivers 1404, the channel width can be reduced without introducing a significant leakage current increase, for example, from 1,900 nm to 500 nm, thereby reducing the total area of word line driver 308. Moreover, the channel length can also be reduced by replacing planar transistors with 3D transistors in string drivers 1404. As a result, the distance between the gate structure to the boundary of the well can be increased by using 3D transistors, thereby enlarging the margin for breakdown voltage (BV), which is an important characteristic of HV circuits 906, such as word line driver 308. Further, since word lines 218 may be arranged along the length direction, the reduction of the pitch along the length direction for string drivers 1404 can also accommodate more word lines 218. The size reduction of string driver 1404 can allow more string drivers 1404 to be facing the staircase structure of a bonded 3D memory device (e.g., 3D memory devices 800 and 801) and thus, reduce the metal routing and metal layers. In some implementations, for word line drivers 308 or any other HV circuits 906, the channel length (L2) is greater than the channel width (W2) of 3D transistors as shown in FIG. 18, which is different from planar transistors forming word line drivers 308 (e.g., shown in FIG. 17). It is understood that for word line drivers 308 or any other HV circuits 906, different from what is shown in FIG. 18, the width (W2') of the source/drain of a 3D transistor may be the same as the channel width (W2, i.e., the width of the 3D semiconductor body/active region between the source and the drain) of the 3D transistor, such that the 3D semiconductor body of the 3D transistor may not have a dumbbell shape in the plan view but rather a uniform width along the channel length direction.

For example, FIG. 19 illustrates a side view of a cross-section of a 3D memory device 1900 including string drivers having 3D transistors, according to some aspects of the present disclosure. 3D memory device 1900 may be one example of 3D memory device 800. As shown in FIG. 19, 3D memory device 1900 can include a first semiconductor structure 1902 and a second semiconductor structure 1904 bonded to each other in a face-to-face manner at a bonding interface 1915. It is understood that the relative positions of first and second semiconductor structures may be switched in other examples. First semiconductor structure 1902 can include a stack structure, e.g., a memory stack 1906, including interleaved word lines 1905 and dielectric layers 1907. In some implementations, edges of interleaved word lines 1905 and dielectric layers 1907 define one or more staircase structures 1908 on one or more sides of memory stack 1906. Staircase structures 1908 can be used for interconnecting word lines 1905 through word line contacts 1912. First semiconductor structure 1902 can also include an array of memory cells, such as an array of 3D NAND memory strings 1910 each extending vertically through memory stack 1906.

Second semiconductor structure 1904 can include a plurality of string drivers 1914 corresponding to word lines 1905, respectively. Each string driver 1914 can include a 3D transistor for HV circuits 906 disclosed herein. As shown in FIG. 19, by reducing each transistor size using 3D transistors, string drivers 1914 can face staircase structure 1908 across bonding interface 1915 to allow each word line contact 1912 electrically connect a pair of word line 1905 and string driver 1914 without routing outside of the staircase region in the plan view. That is, all string drivers 1914 can be arranged directly below or above staircase structure 1908. Thus, extra metal routing outside of the staircase region and the resulting extra metal layers can be avoided by replacing planar transistors with 3D transistors in string drivers 1914. It is understood that word line contact 1912 in FIG. 19 is for illustrative purpose only and may include interconnects in various interconnect layers and bonding layers (not shown) of 3D memory device 1900. As shown in FIGS. 8A and 8B, first and second semiconductor structures 1902 and 1904 may also include their own interconnect layers and bonding layers, such that the 3D transistors of string drivers 1914 may be coupled to word lines 1905, respectively, through the first and second interconnect layers, and the first and second bonding layers.

Figure 20A:
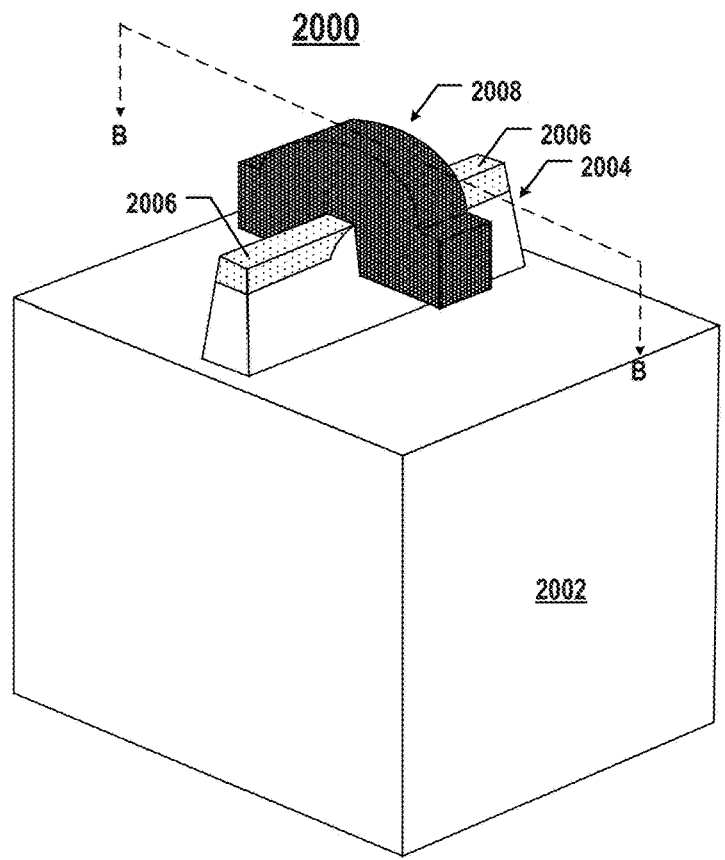
FIGS. 20A and 20B illustrate a perspective view and a side view, respectively, of a 3D transistor in the page buffer of FIG. 13, according to some aspects of the present disclosure.
Figure 20B:
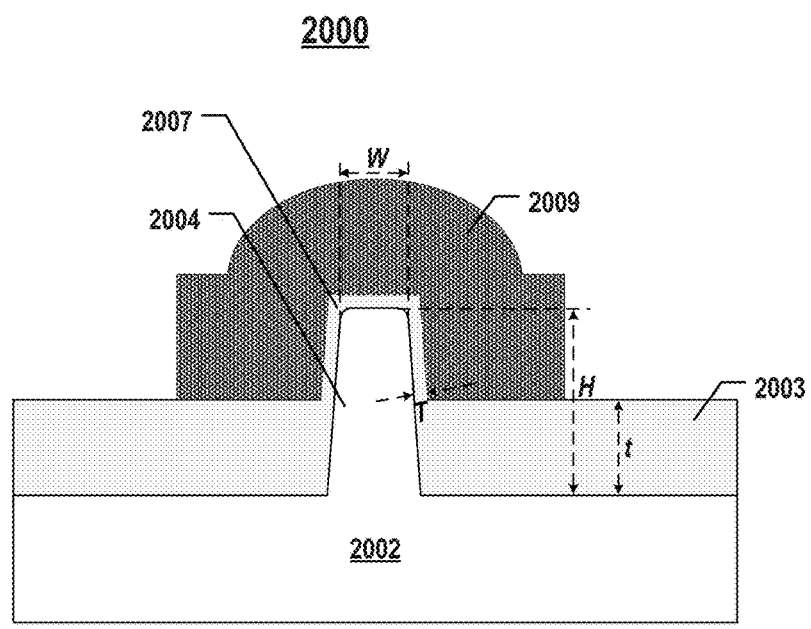

FIGS. 20A and 20B illustrate a perspective view and a side view, respectively, of a 3D transistor 2000 in page buffer 304 of FIG. 13, according to some aspects of the present disclosure. 3D transistor 2000 may be one example of 3D transistor 500 in FIGS. 5, 6A, and 6B and designed to meet the specific requirements of page buffer 304 or any other suitable LV circuits 904, as described below in detail. FIG. 20B illustrates the side view of the cross-section of 3D transistors 2000 in FIG. 20A in the BB plane. As shown in FIGS. 20A and 20B, 3D transistor 2000 can include a 3D semiconductor body 2004 above a substrate 2002, and a gate structure 2008 in contact with a plurality of sides (e.g., the top surface and both side surfaces) of 3D semiconductor body 2004. It is understood that 3D transistor 2000 may be any suitable multi-gate transistor, for example, as shown in FIGS. 7A-7I. In some implementations, gate structure 2008 includes a gate dielectric 2007 in contact with multiple sides of 3D semiconductor body 2004 and a gate electrode 2009 in contact with gate dielectric 2007. As shown in FIGS. 20A and 20B, the top surface of gate structure 2008 (e.g., gate electrode 2009) is curved.

As shown in FIGS. 20A and 20B, 3D transistor 1100 can also include a pair of a source and a drain 2006 in 3D semiconductor body 2004 and separated by gate structure 2008 in the plan view. As shown in FIG. 20B, trench isolations 2003 (e.g., STI) can be formed in substrate 2002, such that gate structure 2008 can be formed on trench isolation 2003. In some implementations, trench isolation 2003 is also formed laterally between adjacent 3D transistors 2000 to reduce leakage current. It is understood that for ease of illustration, trench isolation 2003 is shown in FIG. 20B, but not in FIG. 20A. It is also understood that 3D transistor 2000 may include additional components not shown in FIGS. 20A and 20B, such as wells and spacers.

As described above, for 3D transistor 2000 used in page buffer 304 of memory device 200, device dimensions are important characteristics. On the other hand, the off-state leakage current (Ioff) cannot be increased as well to reduce current leakage, which is difficult to achieve by planar transistors. Moreover, as an LV circuit 904 operating at a voltage, for example, between 2 V and 3.3 V (e.g., 3V), the size reduction of 3D transistors 2000 cannot rely on the voltage reduction, which is difficult to achieve by the 3D transistors used in logic devices using advanced CMOS technology nodes (e.g., sub-22 nm). It is understood that page buffer 304 can include both HV circuits 906 and LV circuits 904. In one example, LV circuits 904 of page buffer 304 may include 3D transistors 2000, while HV circuits 906 of page buffer 304 may include planar transistors (e.g., planar transistors 400). In another example, one of LV circuits 904 in page buffer 304 may include a 3D transistor with a structure like in FIGS. 11A and 11B. One of HV circuits 906 in page buffer includes a 3D transistor with a structure like FIGS. 21A and 21B. Two 3D transistors in a page buffer have different structures and different sizes. The size of a 3D transistor in HV circuits 906 is larger than the size of a 3D transistor in LV circuits 904. The size of 3D transistor includes at least one of the channel length of the 3D transistor, the height of the 3D semiconductor body of the 3D transistor, the width of the 3D semiconductor body of the 3D transistor, or the area of the 3D transistor. In some implementations, in peripheral circuits, a page buffer and other circuits all include 3D transistors, the 3D transistor in the page buffer includes a single fin, and the 3D transistors in other peripheral circuits includes more than one fin.

In some implementations, as shown in FIG. 20B, the thickness (T) of gate dielectric 2007 is between 1.8 nm and 10 nm. For example, the thickness of gate dielectric 2007 may be between 2 nm and 8 nm (e.g., 2 nm, 2.1 nm, 2.2 nm, 2.3 nm, 2.4 nm, 2.5 nm, 2.6 nm, 2.7 nm, 2.8 nm, 2.9 nm, 3 nm, 3.1 nm, 3.2 nm, 3.3 nm, 3.4 nm, 3.5 nm, 3.6 nm, 3.7 nm, 3.8 nm, 3.9 nm, 4 nm, 4.5 nm, 5 nm, 5.5 nm, 6 nm, 6.5 nm, 7 nm, 7.5 nm, 8 nm, any range bounded by the lower end by any of these values, or in any range defined by any two of these values). The thickness of gate dielectric 2007 may be greater than (e.g., one or more times) that of the 3D transistors (e.g., FinFET) used in logic devices using advanced technology nodes (e.g., sub-22 nm) and may be commensurate with the LV voltage range applied to page buffer 304, as described above in detail, such as between 2 V and 3.3 V (e.g., 3.3 V). Also, compared with 3D transistor 1100 in LLV circuits 902, such as the I/O circuit, in some implementations, the thickness of gate dielectric 2007 of 3D transistor 2000 is thicker due to the higher working voltage, for example, between 4 nm and 8 nm, such as between 5 nm and 8 nm.

In some implementations, as shown in FIG. 20B, the width (W) of 3D semiconductor body 2004 is between 10 nm and 180 nm. The width of 3D semiconductor body 2004 may refer to the width at the top of 3D semiconductor body 2004 (e.g., the top CD), as shown in FIG. 20B. For example, the width of 3D semiconductor body 1104 may be between 30 nm and 100 nm (e.g., 30 nm, 40 nm, 50 nm, 60 nm, 70 nm, 80 nm, 90 nm, 100 nm, any range bounded by the lower end by any of these values, or in any range defined by any two of these values). The width of 3D transistor 2000 may be greater than (e.g., one or more times) that of the 3D transistors (e.g., FinFET) used in logic devices using advanced technology nodes (e.g., sub-22 nm). On the other hand, the width of 3D transistor 2000 may be smaller than that of planar transistor used in the page buffer of existing memory devices, for example, greater than 180 nm, as described above. It is understood that in some examples, 3D semiconductor body 2004 may have a "dumbbell" shape that the width of 3D semiconductor body 2004 at the two sides where source and drain 2006 are formed is larger than the width of 3D semiconductor body 2004 between source and drain 2006 due to the relatively small width of 3D semiconductor body 2004 that is not sufficient to form source and drain 2006. For example, as shown in FIG. 18, the width (W2') of the source/drain of a 3D transistor may be larger than the channel width (W2, i.e., the width of the 3D semiconductor body/active region between the source and the drain) of the 3D transistor.

In some implementations, the channel length of 3D transistor 2000 between source and drain 2006 is between 30 nm and 180 nm. The channel length of 3D transistor 2000 may refer to the distance between source and drain 2006, i.e., the dimension of gate structure 2008 that is in contact with the top surface of the channel. For example, the channel length of 3D transistor 2000 may be between 50 nm and 120 nm (e.g., 50 nm, 60 nm, 70 nm, 80 nm, 90 nm, 100 nm, 110 nm, 120 nm, any range bounded by the lower end by any of these values, or in any range defined by any two of these values). The channel length of 3D transistor 2000 may be greater than (e.g., one or more times) that of the 3D transistors (e.g., FinFET) used in logic devices using advanced technology nodes (e.g., sub-22 nm). On the other hand, the channel length of 3D transistor 2000 may be smaller than that of planar transistor used in the page buffer of existing memory devices, for example, greater than 180 nm.

In some implementations, as shown in FIG. 20B, the height (H) of 3D semiconductor body 2004 is between 40 nm and 300 nm. For example, the height of 3D semiconductor body 2004 may be between 50 nm and 100 nm (e.g., 50 nm, 60 nm, 70 nm, 80 nm, 90 nm, 100 nm, any range bounded by the lower end by any of these values, or in any range defined by any two of these values). The height of 3D semiconductor body 2004 may be greater than (e.g., one or more times) that of the 3D transistors (e.g., FinFET) used in logic devices using advanced technology nodes (e.g., sub-22 nm).

In some implementations, as shown in FIG. 20B, the thickness (t) of trench isolation 2003 is the same as the height of 3D semiconductor body 2004. For example, the thickness of trench isolation 2003 may be between 50 nm and 100 nm (e.g., 50 nm, 60 nm, 70 nm, 80 nm, 90 nm, 100 nm, any range bounded by the lower end by any of these values, or in any range defined by any two of these values). The thickness of trench isolation 2003 may be greater than (e.g., one or more times) that of the 3D transistors (e.g., FinFET) used in logic devices using advanced technology nodes (e.g., sub-22 nm).

Compared with the 3D transistors (e.g., FinFET) used in logic devices using advanced technology nodes (e.g., sub-22 nm), the production yield and cost of 3D transistors 2000 can be improved as well, for example, by changing the materials and/or simplifying the structures and process. In some implementations, instead of using HKMG, gate electrode 2009 of 3D transistor 2000 in page buffer 304 of memory device 200 includes polysilicon, for example, polysilicon doped with nitride (N). In some implementations, gate dielectric 2007 of 3D transistor 2000 includes silicon oxide. That is, gate poly and gate oxide can be used as gate structure 2008 to reduce the fabrication complexity and cost. In some implementations, 3D transistor 2000 does not include a stressor at source and drain 2006 and/or does not use strained semiconductor materials in 3D semiconductor body 2004 to reduce the manufacturing complexity and cost.

Figure 21A:
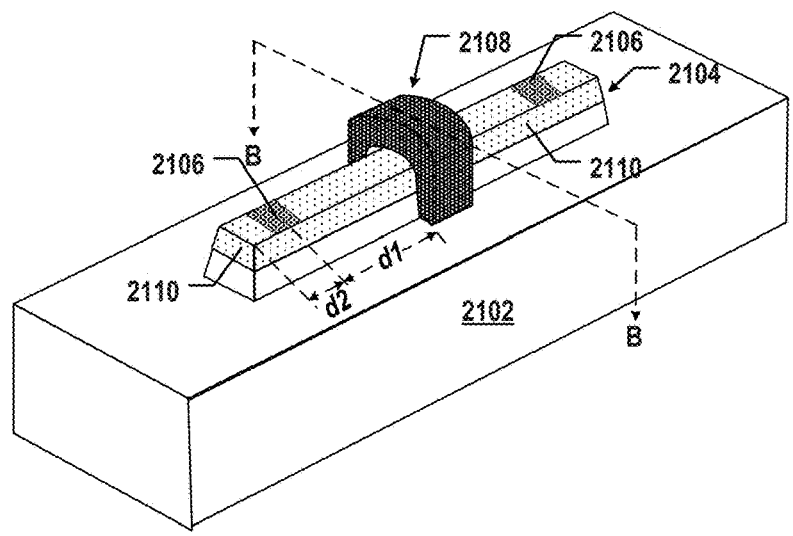
FIGS. 21A and 21B illustrate a perspective view and a side view, respectively, of a 3D transistor in the word line driver of FIG. 13, according to some aspects of the present disclosure.
Figure 21B:
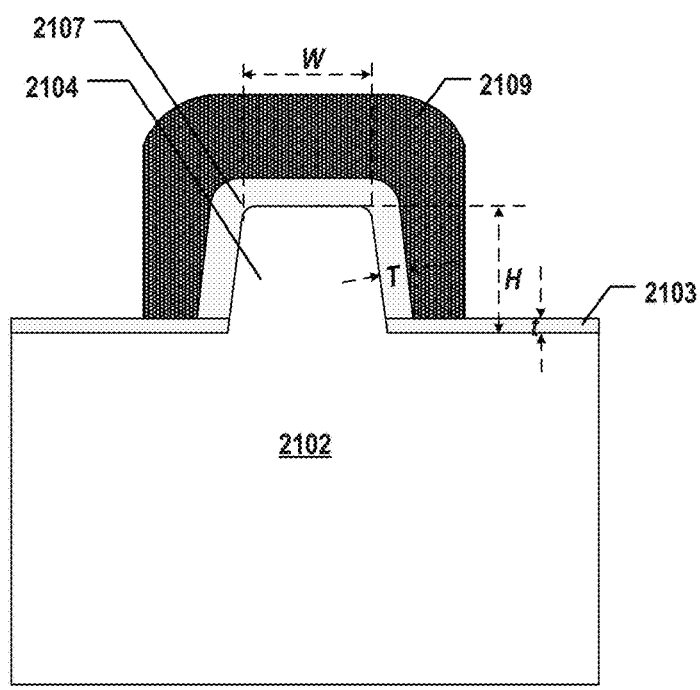

FIGS. 21A and 21B illustrate a perspective view and a side view, respectively, of a 3D transistor 2100 in word line driver 308 of FIG. 13, according to some aspects of the present disclosure. 3D transistor 2100 may be one example of 3D transistor 500 in FIGS. 5, 6A, and 6B and designed to meet the specific requirements of word line driver 308 or any other suitable HV circuits 906, as described below in detail. FIG. 21B illustrates the side view of the cross-section of 3D transistors 2100 in FIG. 21A in the BB plane. As shown in FIGS. 21A and 21B, 3D transistor 2100 can include a 3D semiconductor body 2104 above a substrate 2102, and a gate structure 2108 in contact with a plurality of sides (e.g., the top surface and both side surfaces) of 3D semiconductor body 2104. It is understood that 3D transistor 2100 may be any suitable multi-gate transistor, for example, as shown in FIGS. 7A-7I. In some implementations, gate structure 2108 includes a gate dielectric 2107 in contact with multiple sides of 3D semiconductor body 2104 and a gate electrode 2109 in contact with gate dielectric 2107.

As shown in FIGS. 21A and 21B, 3D transistor 2100 can also include a pair of a source and a drain 2106 in 3D semiconductor body 2104 and separated by gate structure 2108 in the plan view. Due to the relatively high voltage applied to 3D transistors 2100 used in HV circuits 906, 3D transistor 2100 can further include drift regions 2110 in 3D semiconductor body 2104. Source and drain 2106 can be in contact with drift region 2110. It is understood that in some examples, 3D transistors 1100 and 2000 used in LLV circuits 902 and LV circuits 904 may not include drift regions 2110 due to the lower voltages applied to 3D transistors 1100 and 2000 as well as the less breakdown concerns. Drift regions 2110 can be a doped region in 3D semiconductor body 2104, like source and drain 2106, but with a smaller doping concentration than source and drain 2106. That is, source and drain 2106 can be heavily doped regions formed in lightly doped regions (i.e., drift regions 2110) in 3D transistors 2100. In some implementations, drift regions 2110 and source and drain 2106 are doped with N-type dopants, such that source and drain 2106 become heavily N-type doped regions (N+) in lightly N-typed doped regions (N, i.e., drift regions 2110). To sustain the relatively high voltage applied to 3D transistors 2100 used in HV circuits 906 and avoid breakdown, in some implementations, the distance (d1) between source/drain 2106 and gate structure 2108 is greater than the distance (d2) between source/drain 2106 and the edge of 3D semiconductor structure 2104. For example, d1 may be two or more times larger than d2. As shown in FIG. 21B, trench isolations 2103 (e.g., STI) can be formed in substrate 2102, such that gate structure 2108 can be formed on trench isolation 2103. In some implementations, trench isolation 2103 is also formed laterally between adjacent 3D transistors 2100 to reduce leakage current. It is understood that for ease of illustration, trench isolation 2103 is shown in FIG. 21B, but not in FIG. 21A. It is also understood that 3D transistor 2100 may include additional components not shown in FIGS. 21A and 21B, such as wells and spacers.

As described above, for 3D transistor 2100 used in word line driver 308 of memory device 200, device dimensions are important characteristics. On the other hand, the off-state leakage current ($I_{off}$) cannot be increased as well to reduce current leakage, which is difficult to achieve by planar transistors. Moreover, as an HV circuit 906 operating at a voltage, for example, greater than 3.3 V (e.g., between 5 V and 30 V), the size reduction of 3D transistors 2100 cannot rely on the voltage reduction, which is difficult to achieve by the 3D transistors used in logic devices using advanced CMOS technology nodes (e.g., sub-22 nm).

In some implementations, as shown in FIG. 21B, the thickness (T) of gate dielectric 2107 is greater than 10 nm. For example, the thickness of gate dielectric 2107 may be between 20 nm and 80 nm (e.g., 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 45 nm, 50 nm, 55 nm, 60 nm, 65 nm, 70 nm, 75 nm, 80 nm, any range bounded by the lower end by any of these values, or in any range defined by any two of these values). The thickness of gate dielectric 2107 may be significantly greater than (e.g., one or more orders of magnitude) that of the 3D transistors (e.g., FinFET) used in logic devices using advanced technology nodes (e.g., sub-22 nm) and may be commensurate with the HV voltage range applied to word line driver 308, as described above in detail, such as greater than 3.3 V (e.g., between 5 V and 30 V).

Also, compared with 3D transistor 1100 in LLV circuits 902, such as the PO circuit, as well as 3D transistor 2000 in LV circuit 904, such as page buffer 304, in some implementations, the thickness of gate dielectric 2107 of 3D transistor 2100 is thicker due to the higher working voltage.

In some implementations, as shown in FIG. 21B, the width (W) of 3D semiconductor body 2104 is greater than 100 nm. The width of 3D semiconductor body 2104 may refer to the width at the top of 3D semiconductor body 2104 (e.g., the top CD), as shown in FIG. 21B. For example, the width of 3D semiconductor body 1104 may be between 300 nm and 1,000 nm (e.g., 300 nm, 400 nm, 500 nm, 600 nm, 700 nm, 800 nm, 900 nm, 1,000 nm, any range bounded by the lower end by any of these values, or in any range defined by any two of these values). The width of 3D transistor 2100 may be significantly greater than (e.g., one or more orders of magnitude) that of the 3D transistors (e.g., FinFET) used in logic devices using advanced technology nodes (e.g., sub-22 nm). On the other hand, the width of 3D transistor 2100 may be smaller than that of planar transistor used in the word line driver of existing memory devices, for example, 1,900 nm, as described above. Also, compared with 3D transistor 1100 in LLV circuits 902, such as the I/O circuit, as well as 3D transistor 2000 in LV circuit 904, such as page buffer 304, in some implementations, the width of 3D semiconductor body 2104 of 3D transistor 2100 is greater due to the higher working voltage. It is understood that in some examples, different from some examples in which 3D semiconductor bodies 1104 and 2004 have a dumbbell shape in the plan view, since 3D semiconductor body 1104 may have a relatively large width that is sufficient to form source and drain 2106, 3D semiconductor body 2104 may not have the dumbbell shape in the plan view, i.e., having a uniform width.

In some implementations, the channel length of 3D transistor 2100 between source and drain 2106 is greater than 120 nm. The channel length of 3D transistor 2100 may refer to the distance between source and drain 2106, i.e., the dimension of gate structure 2108 that is in contact with the top surface of the channel. For example, the channel length of 3D transistor 2100 may be between 500 nm and 1,200 nm (e.g., 500 nm, 600 nm, 700 nm, 800 nm, 900 nm, 1,000 nm, 1,100 nm, 1,200 nm, any range bounded by the lower end by any of these values, or in any range defined by any two of these values). The channel length of 3D transistor 2100 may be significantly greater than (e.g., one or more orders of magnitude) that of the 3D transistors (e.g., FinFET) used in logic devices using advanced technology nodes (e.g., sub-22 nm). On the other hand, the channel length of 3D transistor 2100 may be smaller than that of planar transistor used in the word line driver of existing memory devices, for example, 900 nm. Also, compared with 3D transistor 1100 in LLV circuits 902, such as the I/O circuit, as well as 3D transistor 2000 in LV circuit 904, such as page buffer 304, in some implementations, the channel length of 3D transistor 2100 is greater due to the higher working voltage.

In some implementations, as shown in FIG. 21B, the height (H) of 3D semiconductor body 2104 is greater than 50 nm. For example, the height of 3D semiconductor body 2104 may be between 300 nm and 500 nm (e.g., 300 nm, 350 nm, 400 nm, 450 nm, 500 nm, any range bounded by the lower end by any of these values, or in any range defined by any two of these values). The height of 3D semiconductor body 2104 may be significantly greater than (e.g., one or more orders of magnitude) that of the 3D transistors (e.g., FinFET) used in logic devices using advanced technology nodes (e.g., sub-22 nm). Also, compared with 3D transistor 1100 in LLV circuits 902, such as the I/O circuit, as well as 3D transistor 2000 in LV circuit 904, such as page buffer 304, in some implementations, the height of 3D semiconductor body 2104 of 3D transistor 2100 is greater due to the higher working voltage.

In some implementations, as shown in FIG. 21B, the thickness (t) of trench isolation 2103 is smaller than, such as not greater than one-third (⅓) of, the height of 3D semiconductor body 2104. For example, the thickness of trench isolation 2103 may be between 100 nm and 200 nm (e.g., 100 nm, 110 nm, 120 nm, 130 nm, 140 nm, 150 nm, 160 nm, 170 nm, 180 nm, 190 nm, 200 nm, any range bounded by the lower end by any of these values, or in any range defined by any two of these values). The thickness of trench isolation 2103 may be greater than (e.g., one or more times) that of the 3D transistors (e.g., FinFET) used in logic devices using advanced technology nodes (e.g., sub-22 nm). Also, compared with 3D transistor 1100 in LLV circuits 902, such as the I/O circuit, as well as 3D transistor 2000 in LV circuit 904, such as page buffer 304, in some implementations, the thickness of trench isolation 2103 of 3D transistor 2100 is smaller due to the higher working voltage.

Compared with the 3D transistors (e.g., FinFET) used in logic devices using advanced technology nodes (e.g., sub-22 nm), the production yield and cost of 3D transistors 2100 can be improved as well, for example, by changing the materials and/or simplifying the structures and process. In some implementations, instead of using HKMG, gate electrode 2109 of 3D transistor 2100 in word line driver 308 of memory device 200 includes polysilicon, for example, polysilicon doped with P-type dopants or N-type dopants, and gate dielectric 2107 of 3D transistor 2100 includes silicon oxide doped with nitrogen ($N_2$). In some implementations, gate dielectric 2107 of 3D transistor 2100 includes silicon oxide. That is, gate poly and gate oxide can be used as gate structure 2108 to reduce the fabrication complexity and cost. In some implementations, 3D transistor 2100 does not include a stressor at source and drain 2106 and/or does not use strained semiconductor materials in 3D semiconductor body 2104 to reduce the manufacturing complexity and cost.

Consistent with the scope of the present disclosure, peripheral circuits 202 can include LLV circuit 902 (e.g., the I/O circuit of interface 316 and data bus 318) and having 3D transistors 1100, LV circuit 904 (e.g., part of page buffer 304) having 3D transistors 2000, and HV circuit 906 (e.g., word line driver 308) having 3D transistors 2100. LLV source 901 can be coupled to LLV circuit 902 and configured to provide Vdd1 to 3D transistors 1100, LV source 903 can be coupled to LV circuit 904 and configured to provide Vdd2 to 3D transistors 2000, and HV source 905 can be coupled to HV circuit 906 and configured to provide Vdd3 to 3D transistors 2100, where Vdd3>Vdd2>Vdd1. 3D transistors 2100, for example, in word line driver 308, can be coupled to memory cell array 201 through word lines 218, and 3D transistors 2000, for example, in page buffer 304, can be coupled to memory cell array 201 through bit liens 216. Due to different working voltages, the gate dielectric thickness (T) of 3D transistors 2100 can be greater than that of 3D transistors 2000, which in turn can be greater than that of 3D transistors 1100. It is understood that other sizes/dimensions of 3D transistors 2100 may be greater than those of 3D transistors 2000 and/or 3D transistors 2100, such as the channel length (L), the height (H) of the 3D semiconductor body, the width (W) of the 3D semiconductor body, etc., due to the higher working voltage applied to 3D transistors 2100, as described above in detail. In some implementations, different from 3D transistors 1100 and 2000 of LLV circuit 902 and LV circuit 904, 3D transistors 2100 of HV circuit 906 further includes drift regions 2110, which has a lower doping concentration than that of source/drain 2106 in order to sustain the higher voltage of Vdd3 than Vdd2 and Vdd1. In some implementations, different from 3D transistors 2000 and 2100 having gate structures 2008 and 2108 of poly gate and gate oxide, 3D transistors 1100 have gate structures 1108 of HKMG to achieve a faster switch speed than 3D transistors 2000 and 2100.

Figure 25:
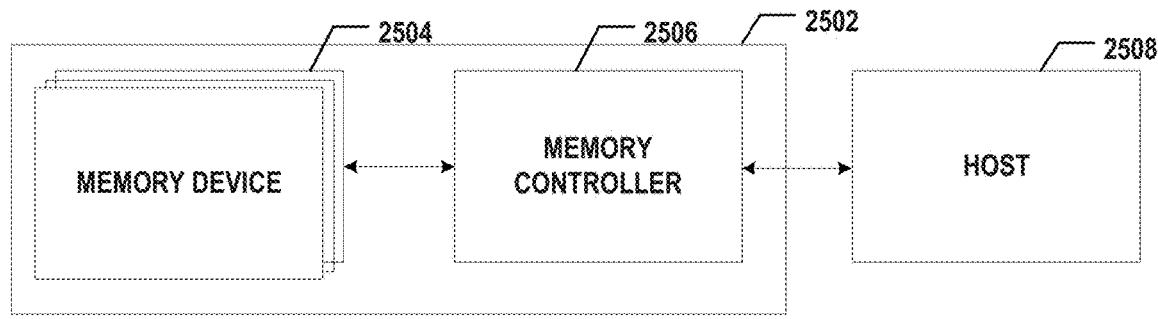
FIG. 25 illustrates a block diagram of an exemplary system having a memory device, according to some aspects of the present disclosure.

FIG. 25 illustrates a block diagram of a system 2500 having a memory device, according to some aspects of the present disclosure. System 2500 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 25, system 2500 can include a host 2508 and a memory system 2502 having one or more memory devices 2504 and a memory controller 2506. Host 2508 can be a processor of an electronic device, such as a central processing unit (CPU), or a system-on-chip (SoC), such as an application processor (AP). Host 2508 can be configured to send or receive the data to or from memory devices 2504.

Memory device 2504 can be any memory devices disclosed herein, such as 3D memory devices 100 and 101, memory device 200, 3D memory devices 800, 801, and 1900. In some implementations, each memory device 2504 includes a peripheral circuit having a 3D transistor, as described above in detail.

Memory controller 2506 is coupled to memory device 2504 and host 2508 and is configured to control memory device 2504, according to some implementations. Memory controller 2506 can manage the data stored in memory device 2504 and communicate with host 2508. In some implementations, memory controller 2506 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 2506 is designed for operating in a high duty-cycle environment SSDs or embedded multi-media-cards (eMMCs) used as data storage for mobile devices, such as smartphones, tablets, laptop computers, etc., and enterprise storage arrays. Memory controller 2506 can be configured to control operations of memory device 2504, such as read, erase, and program operations. Memory controller 2506 can also be configured to manage various functions with respect to the data stored or to be stored in memory device 2504 including, but not limited to bad-block management, garbage collection, logical-to-physical address conversion, wear leveling, etc. In some implementations, memory controller 2506 is further configured to process error correction codes (ECCs) with respect to the data read from or written to memory device 2504. Any other suitable functions may be performed by memory controller 2506 as well, for example, formatting memory device 2504. Memory controller 2506 can communicate with an external device (e.g., host 2508) according to a particular communication protocol. For example, memory controller 2506 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI)

protocol, an enhanced small disk interface (ESDI) protocol, an integrated drive electronics (IDE) protocol, a Firewire protocol, etc.

Figures 26A, 26B:
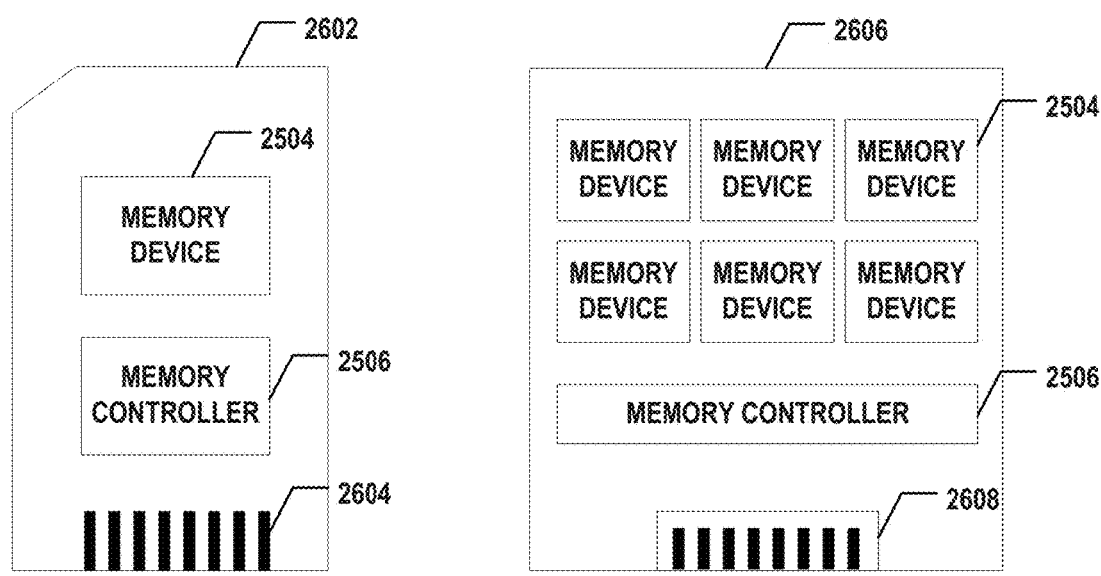
FIG. 26A illustrates a diagram of an exemplary memory card having a memory device, according to some aspects of the present disclosure.
FIG. 26B illustrates a diagram of an exemplary solid-state drive (SSD) having a memory device, according to some aspects of the present disclosure.

Memory controller 2506 and one or more memory devices 2504 can be integrated into various types of storage devices, for example, be included in the same package, such as a universal Flash storage (UFS) package or an eMMC package. That is, memory system 2502 can be implemented and packaged into different types of end electronic products. In one example as shown in FIG. 26A, memory controller 2506 and a single memory device 2504 may be integrated into a memory card 2602. Memory card 2602 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 2602 can further include a memory card connector 2604 coupling memory card 2602 with a host (e.g., host 2508 in FIG. 25). In another example as shown in FIG. 26B, memory controller 2506 and multiple memory devices 2504 may be integrated into an SSD 2606. SSD 2606 can further include an SSD connector 2608 coupling SSD 2606 with a host (e.g., host 2508 in FIG. 25). In some implementations, the storage capacity and/or the operation speed of SSD 2606 is greater than those of memory card 2602.

Figure 23:
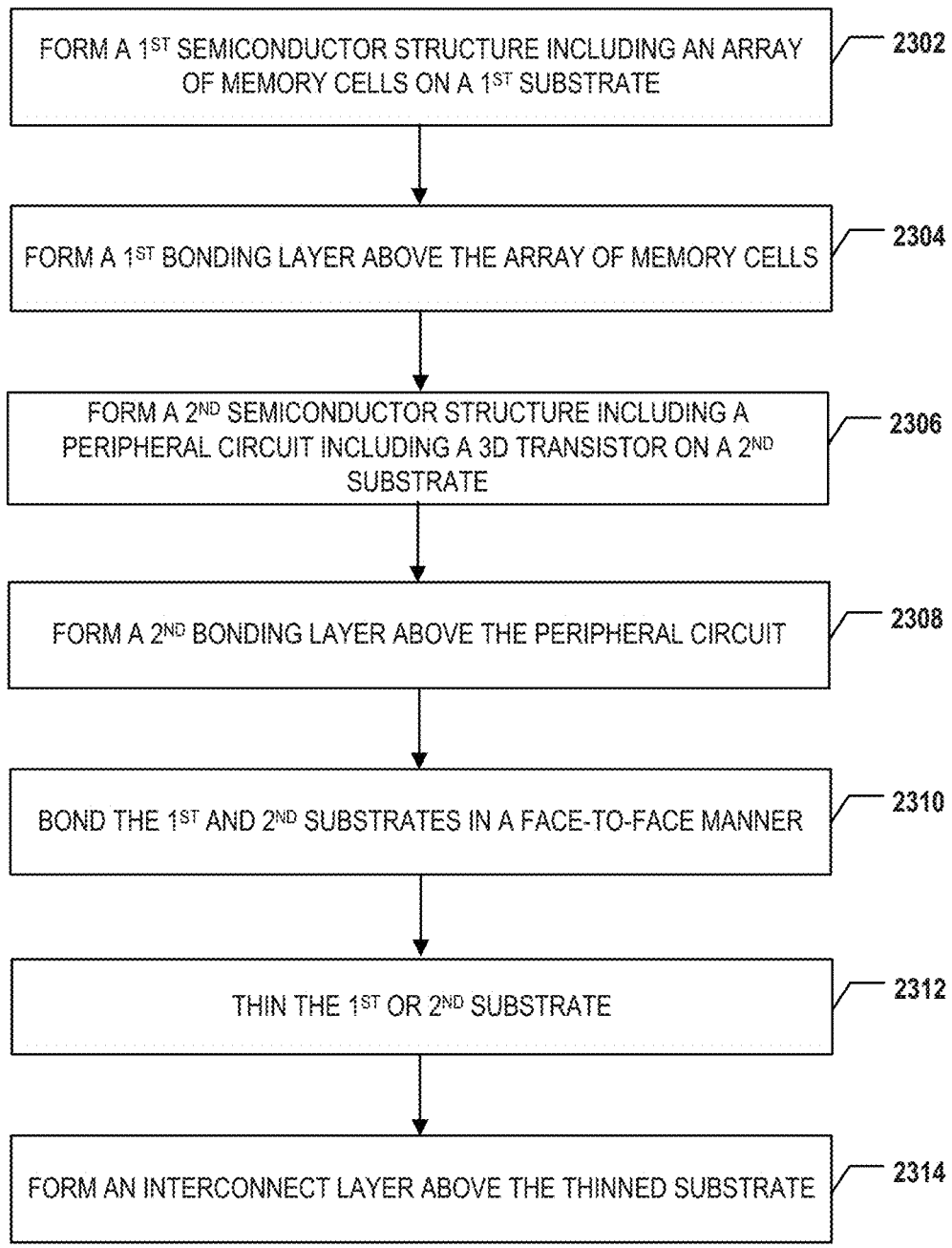
FIG. 23 illustrates a flowchart of a method for forming an exemplary 3D memory device, according to some aspects of the present disclosure.
Figure 24A:
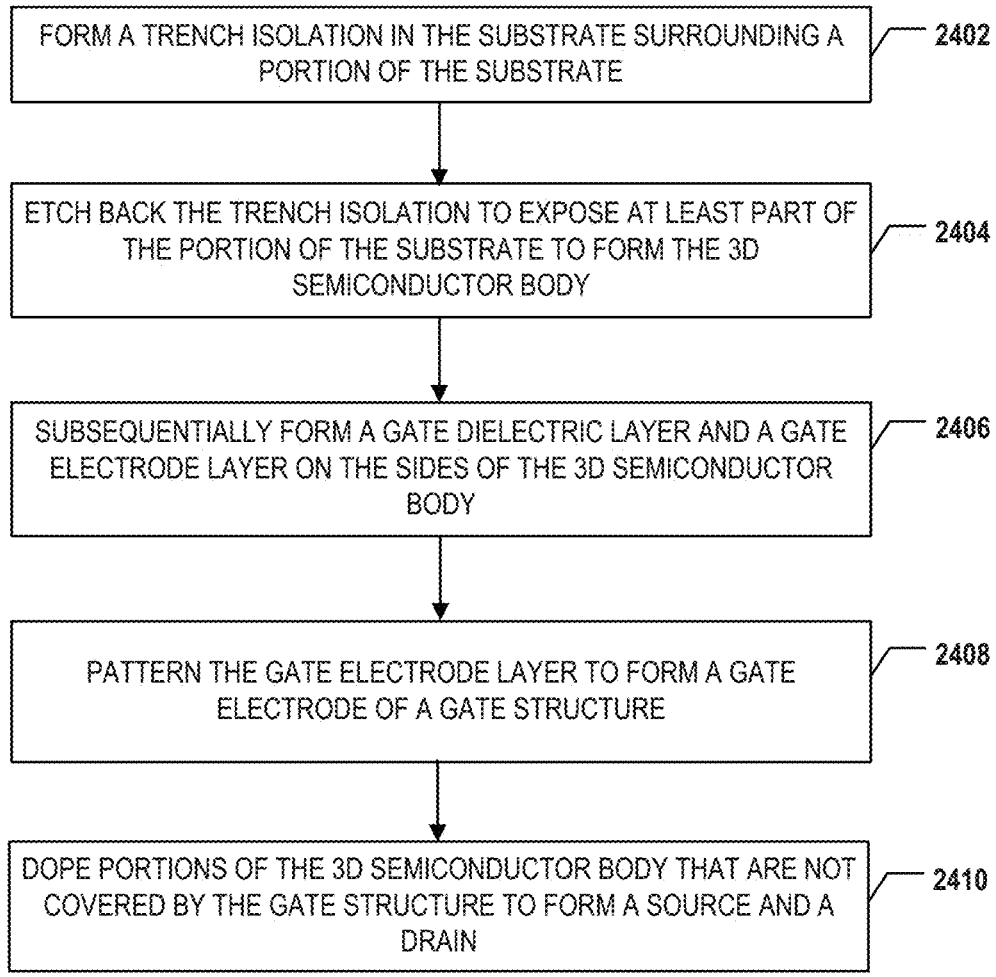
FIG. 24A illustrates a flowchart of a method for forming a 3D transistor, according to some aspects of the present disclosure.
Figure 24B:
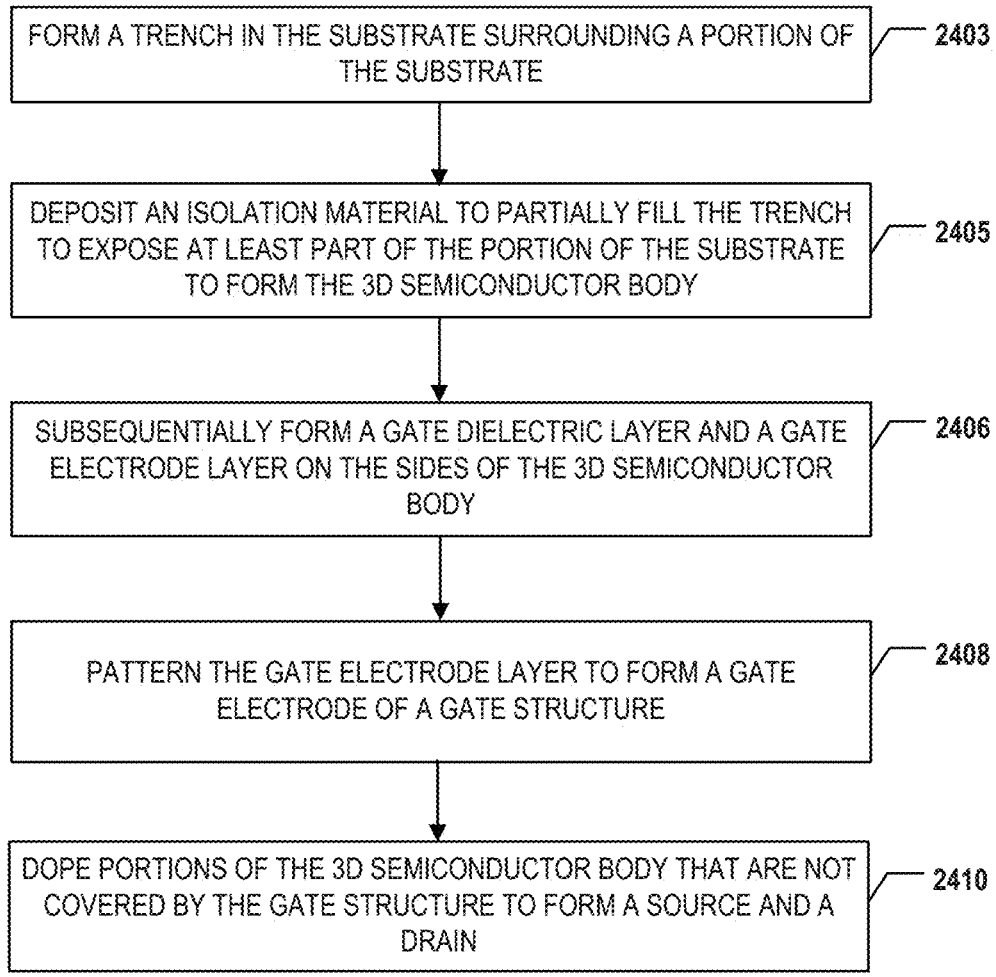
FIG. 24B illustrates a flowchart of another method for forming a 3D transistor, according to some aspects of the present disclosure.

FIGS. 22A-22J illustrate a fabrication process for forming a 3D transistor, according to some aspects of the present disclosure. FIG. 23 illustrates a flowchart of a method 2300 for forming an exemplary 3D memory device, according to some aspects of the present disclosure. FIG. 24A illustrates a flowchart of a method 2400 for forming a 3D transistor, according to some aspects of the present disclosure. FIG. 24B illustrates a flowchart of another method 2401 for forming a 3D transistor, according to some aspects of the present disclosure. Examples of the 3D memory devices depicted in FIG. 23 include 3D memory devices 800, 801, and 899 depicted in FIGS. 8A-8C. Examples of the 3D transistors depicted in FIGS. 22A-22J, 24A, and 24B include 3D transistors 500, 1100, 2000, and 2100, depicted in FIGS. 5, 11A, 11A, 20A, and 21A. FIGS. 22A-22J, 23, 24A, and 24B will be described together. It is understood that the operations shown in methods 2300, 2400, and 2401 are not exhaustive and that other operations can be performed as well before, after, or between any of the illustrated operations. Further, some of the operations may be performed simultaneously, or in a different order than shown in FIGS. 23, 24A, and 24B.

Referring to FIG. 23, method 2300 starts at operation 2302, in which a first semiconductor structure including an array of memory cells is formed on a first substrate. In some implementations, to form the array of memory cells, an array of 3D NAND memory strings are formed. For example, as illustrated in FIG. 8B, an array of 3D NAND memory strings 817 is formed on substrate 809. Method 2300 proceeds to operation 2304, as illustrated in FIG. 23, in which a first bonding layer including a plurality of first bonding contacts is formed above the array of NAND memory strings. For example, as illustrated in FIG. 8B, bonding layer 829 including bonding contacts 855 is formed above array of 3D NAND memory strings 817.

Method 2300 proceeds to operation 2306, as illustrated in FIG. 23, in which a second semiconductor structure including a peripheral circuit including a 3D transistor is formed on a second substrate. The recess gate transistor can include a recess gate structure protruding into the second substrate. To form the second semiconductor structure, a 3D semiconductor body is formed from the second substrate, and a gate structure is formed in contact with a plurality of sides of the 3D semiconductor body.

The 3D semiconductor body may be formed using various fabrication processes. In some implementations, to form the 3D semiconductor body, as shown in FIG. 24A, at operation 2402, a trench isolation is formed in the second substrate surrounding a portion of the second substrate. The substrate can be a silicon substrate.

Figure 22A:
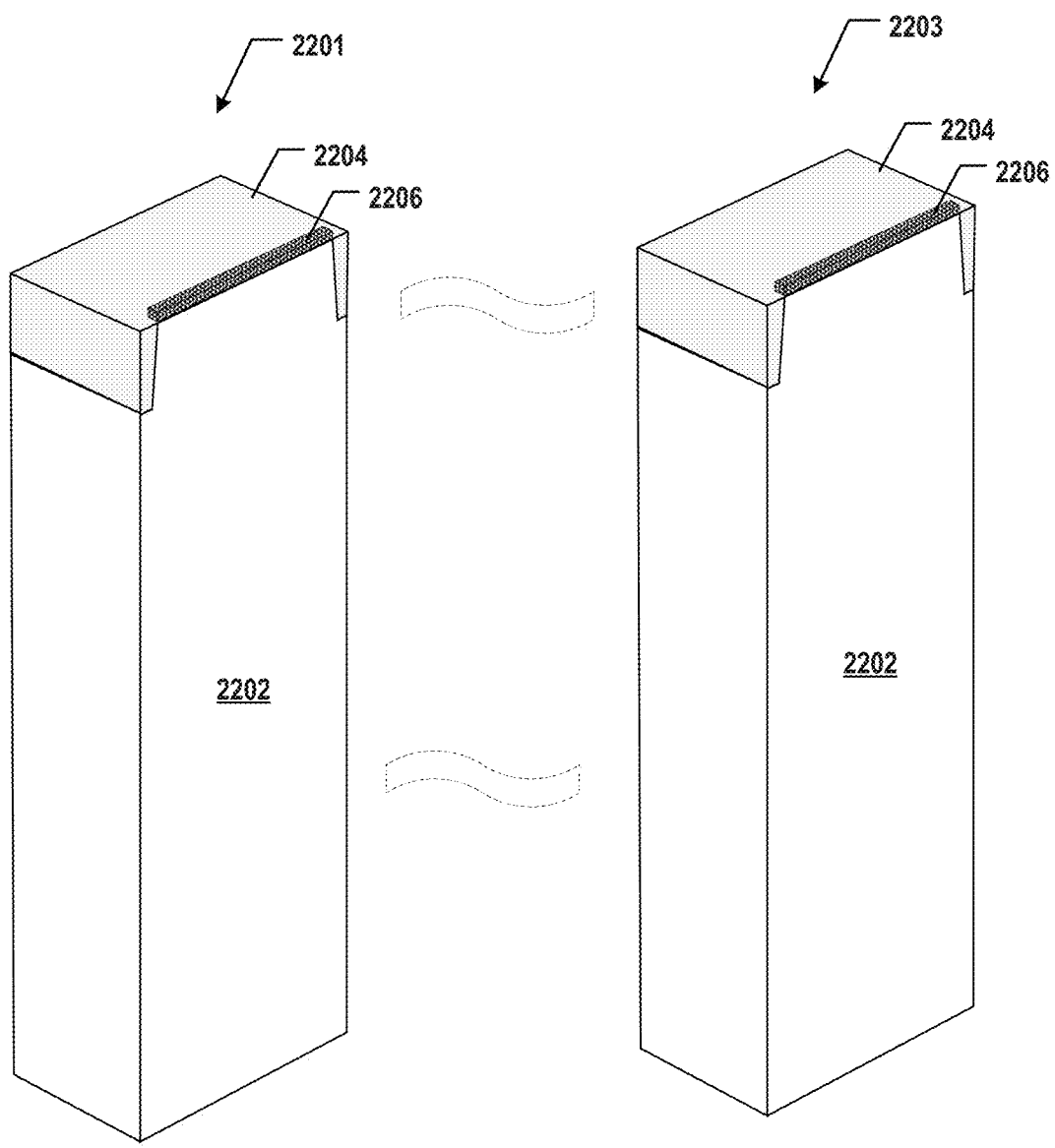
FIGS. 22A-22J illustrate a fabrication process for forming a 3D transistor, according to some aspects of the present disclosure.

As illustrated in FIG. 22A, a trench isolation 2204, such as STIs, is formed in a silicon substrate 2202, for example, using wet/dry etch and thin film deposition of silicon oxide. The top surface of trench isolation 2204 can be planarized using, for example, chemical mechanical polishing (CMP). Trench isolations 2204 can divide silicon substrate 2202 into multiple regions in which multiple 3D transistors can be formed, respectively. Prior to forming trench isolation 2204, a sacrificial layer 2206 can be formed to cover the region in which the 3D semiconductor body of the 3D transistor is to be formed. In some implementations, a layer of sacrificial material different from silicon substrate 2202 and trench isolation 2204, such as silicon nitride, is deposited using one or more thin film deposition processes including, but not limited to, chemical vapor deposition (CVD), physical vapor deposition (PVD), atomic layer deposition (ALD), or any combination thereof. The deposited sacrificial material layer can then be patterned using lithography and wet/dry etch to form sacrificial layer 2206. Trench isolation 2204 thus cannot be formed in part of silicon substrate 2202 that is covered by sacrificial layer 2206. As a result, as shown in FIG. 22A, trench isolation 2204 surrounds a portion of silicon substrate 2202 that is covered by sacrificial layer 2206. Although not shown, wells may be subsequently formed in silicon substrate 2202. The wells may be patterned and aligned between trench isolations 2204 using lithography, followed by ion implantation of N-type dopants and/or P-type dopants.

Figure 22B:
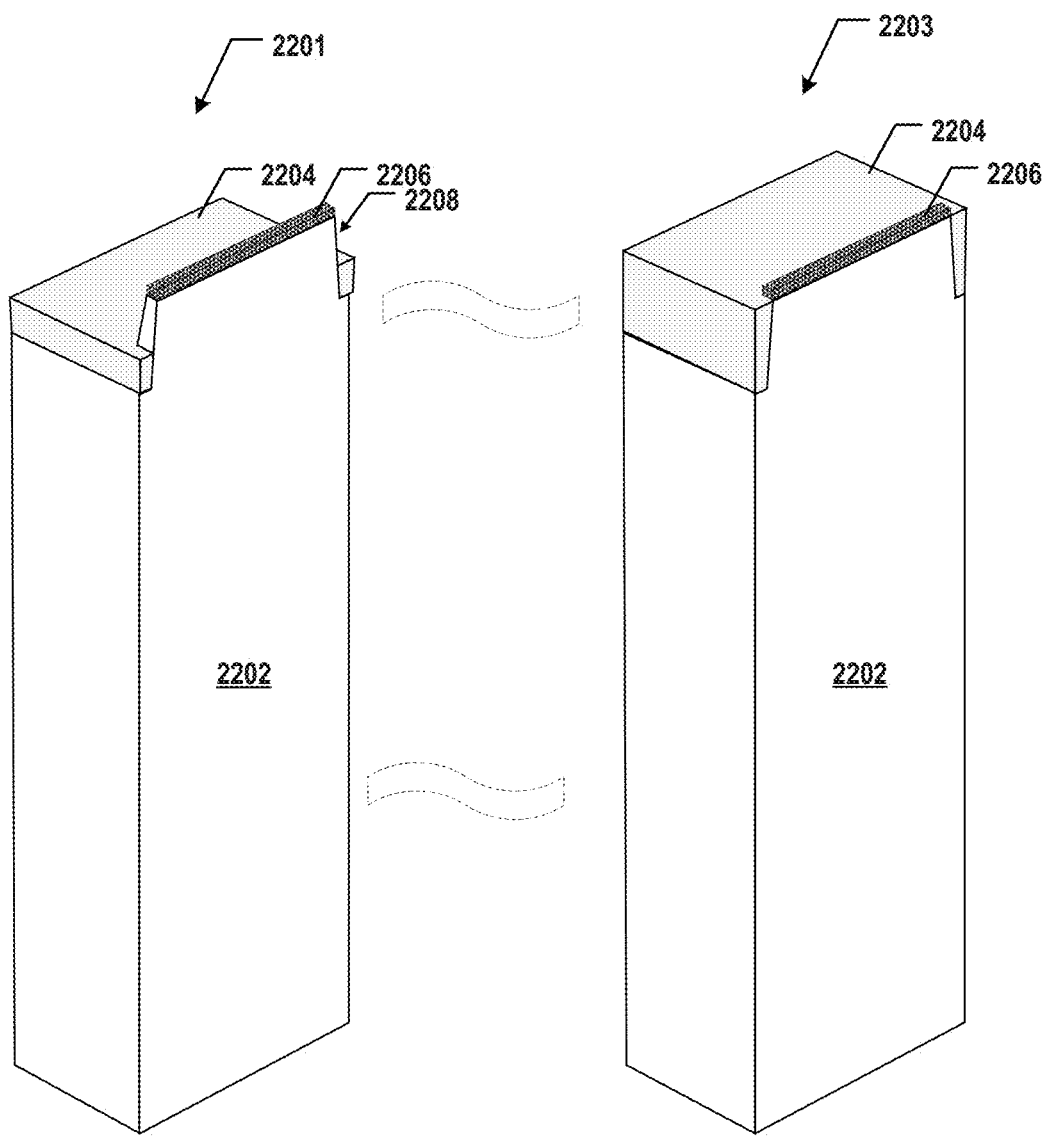
Figure 22C:
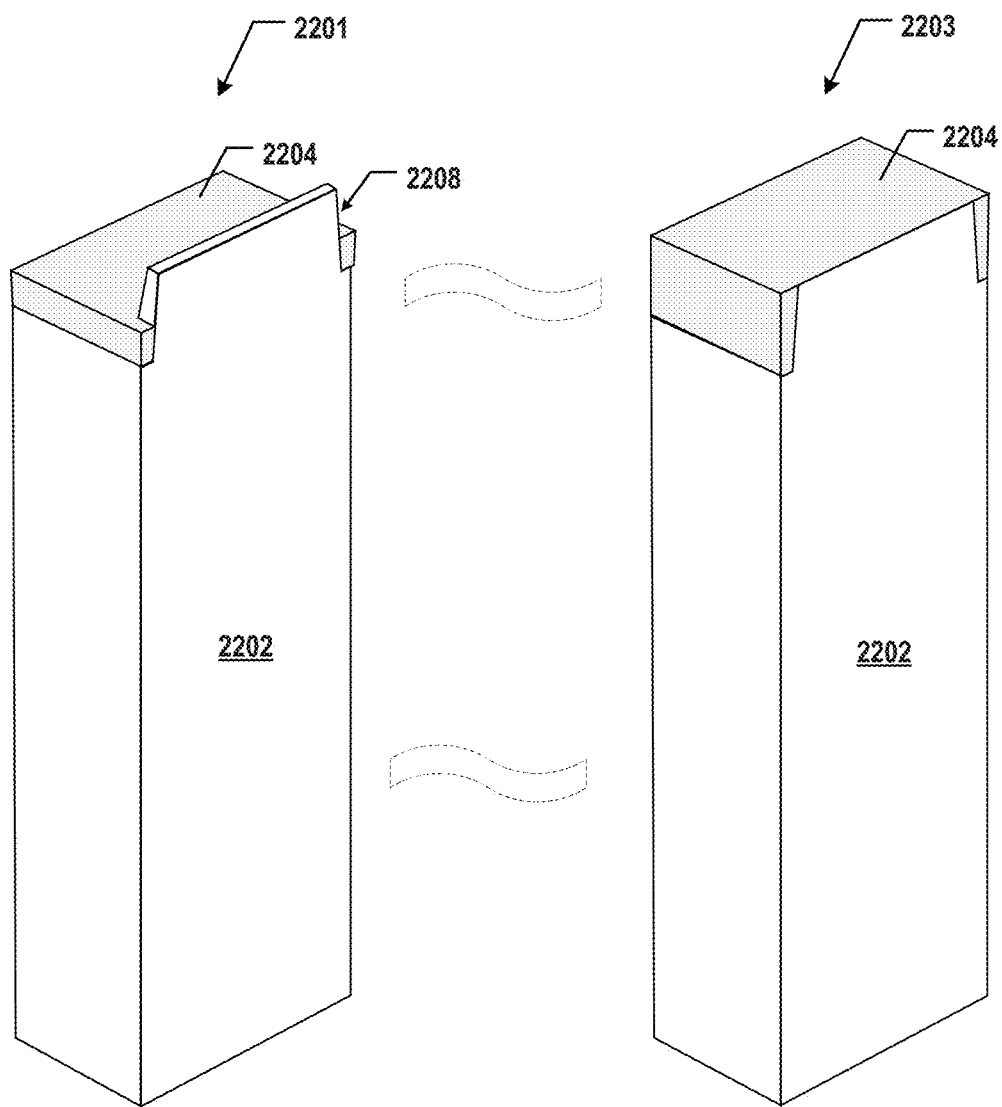

As shown in FIG. 24A, at operation 2404, the trench isolation is etched back to expose at least part of the portion of the second substrate. As illustrated in FIG. 22B, a recess is formed in trench isolation 2204 by etching back trench isolation 2204, for example, using wet/dry etch, to expose at least part of the portion of silicon substrate 2202 that is covered by sacrificial layer 2206 and that was surrounded by trench isolation 2204 (e.g., in FIG. 22A), according to some implementations. As a result, the exposed portion of silicon substrate 2202 now becomes a 3D semiconductor body 2208 that is above the resulting top surfaces of silicon substrate 2202 and trench isolation 2204 after recessing (etching back), according to some implementations.

Figure 22D:
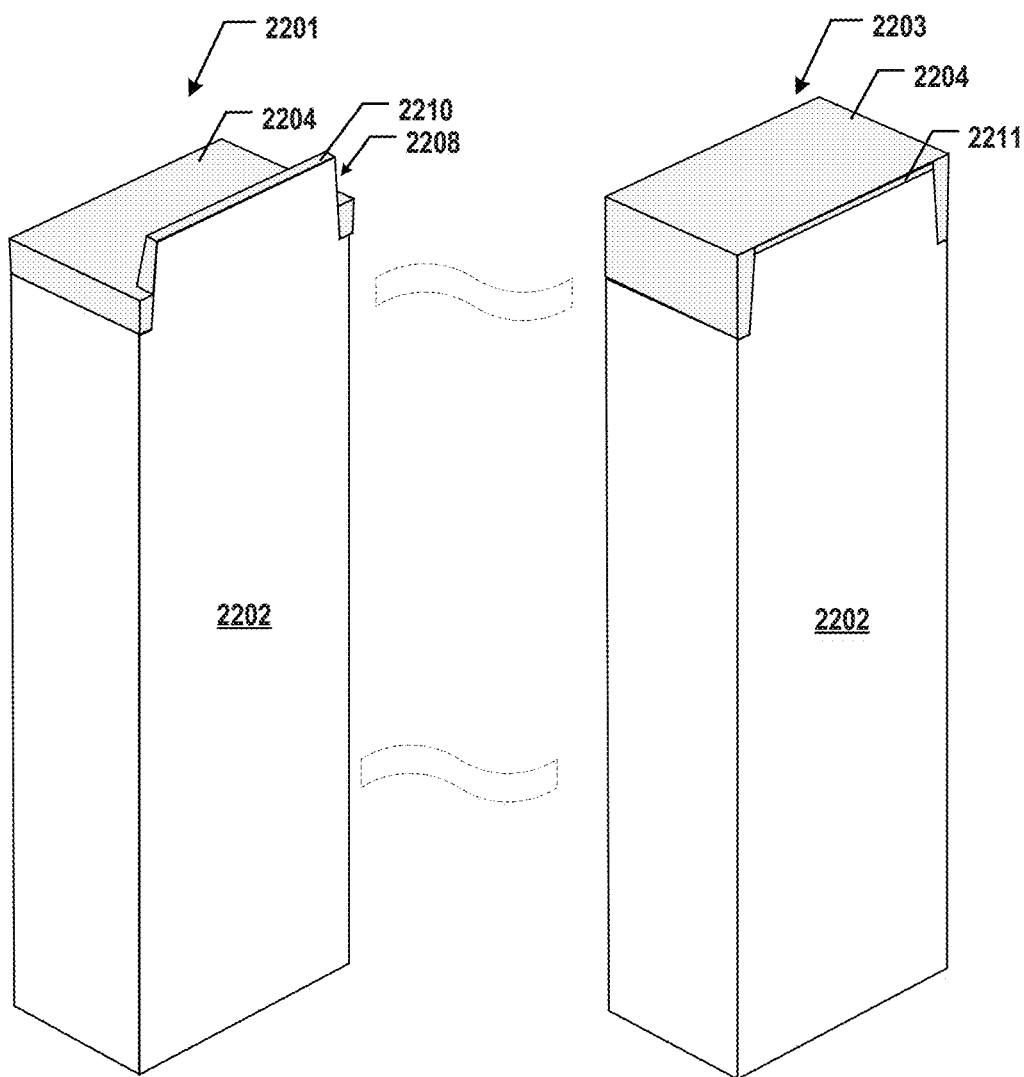
Figure 22E:
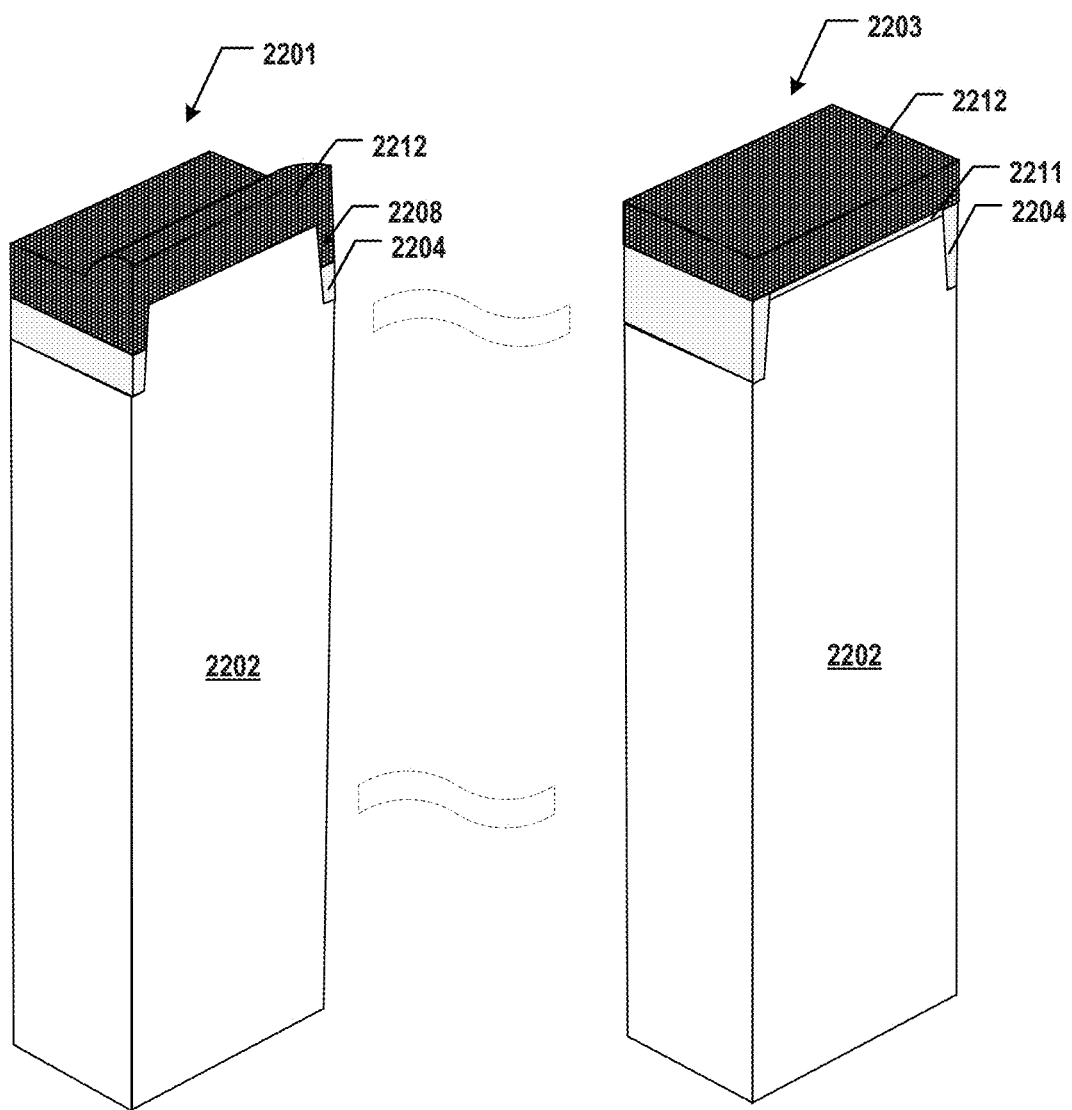
Figure 22F:
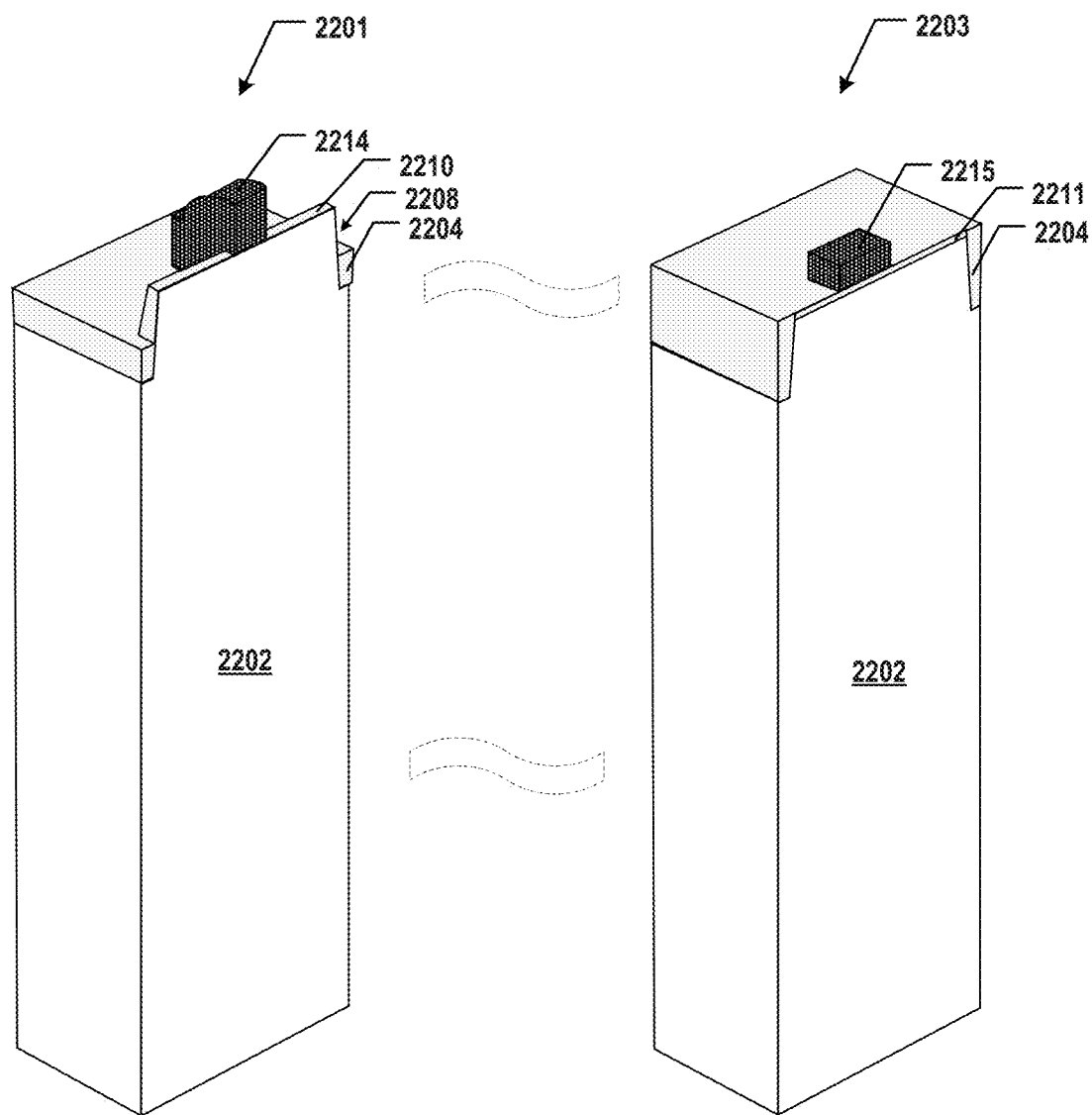
Figure 22G:
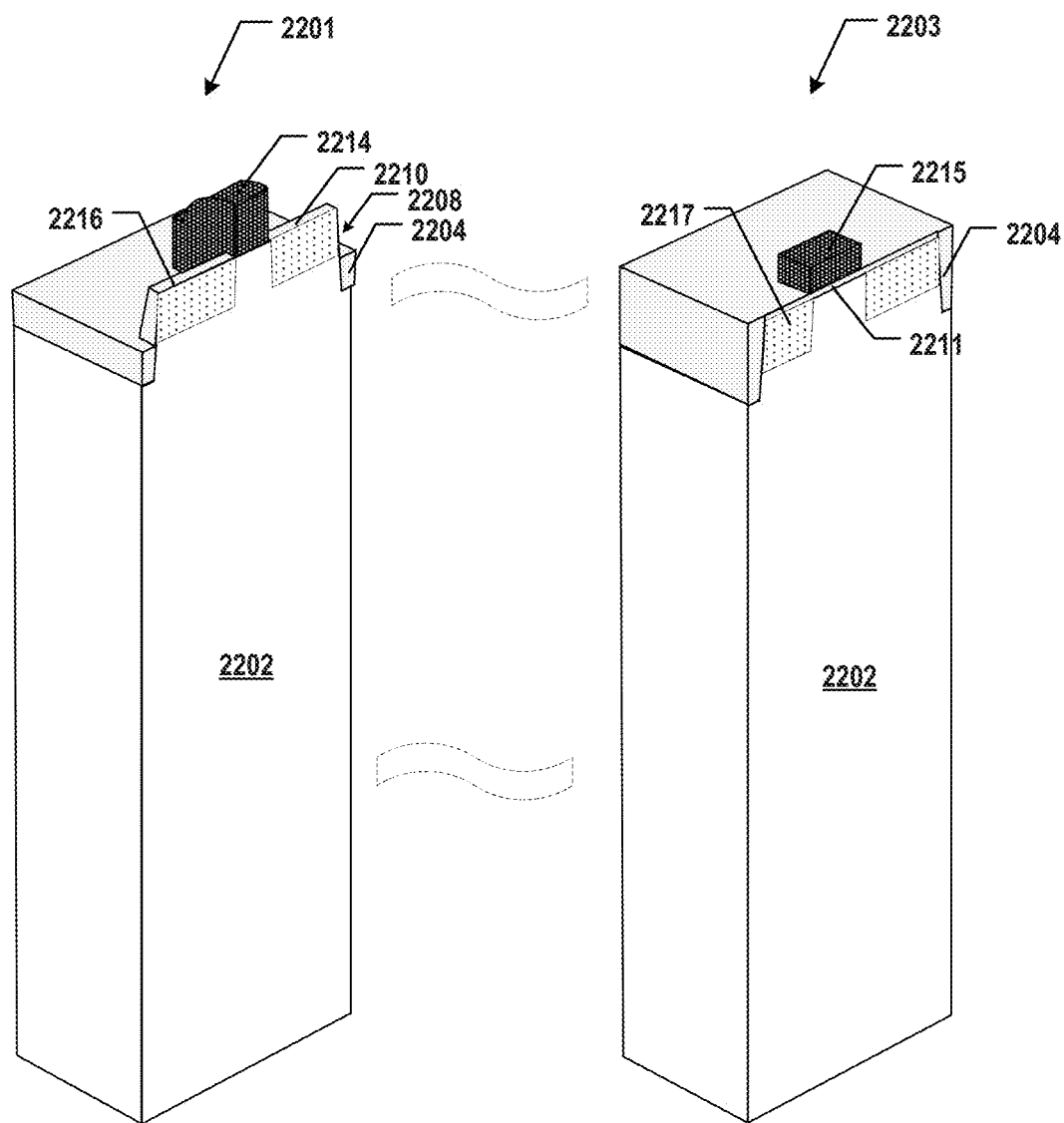
Figure 22H:
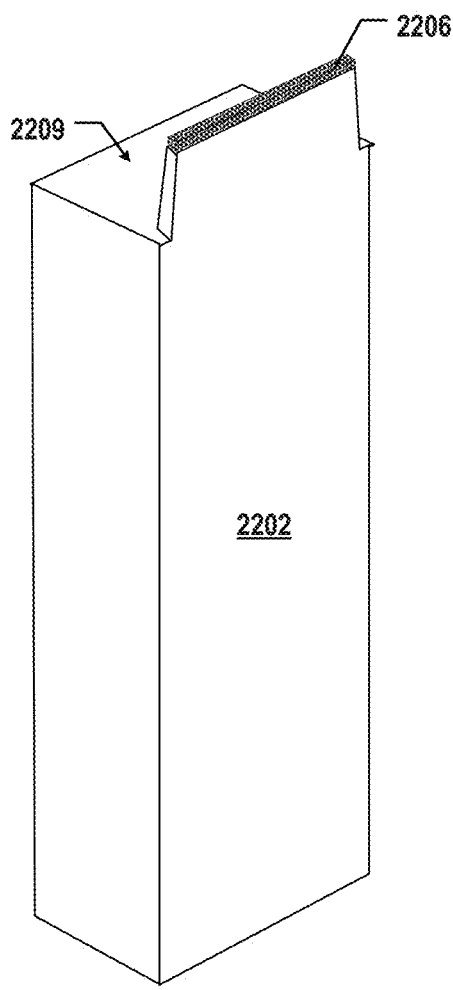
Figure 22I:
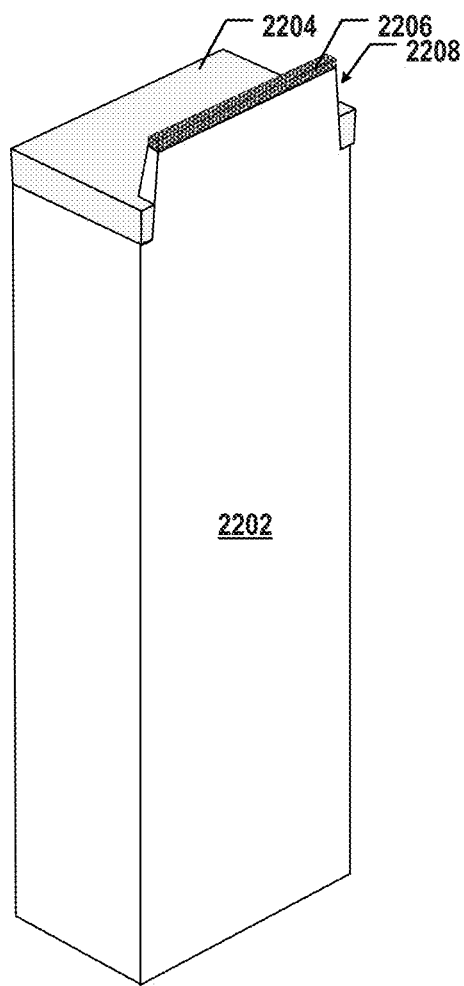

Instead of forming the 3D semiconductor body after forming the trench isolation, as shown in FIGS. 22A, 22B, and 24A, the 3D semiconductor body may be formed prior to forming the trench isolation, as shown in FIGS. 22H, 22I, and 24B. In some implementations, to form the 3D semiconductor body, as shown in FIG. 24B, at operation 2403, a trench is formed in the second substrate surrounding a portion of the second substrate. As shown in FIG. 22H, a trench 2209 is formed in silicon substrate 2202, for example, by etching silicon substrate 2202 using dry/wet etch. In some implementations, sacrificial layer 2206 is formed prior to the etching to cover part of silicon substrate 2202 from which 3D semiconductor body 2208 is to be formed. As a result, a portion of silicon substrate 2202 is surrounded by trench 2209, according to some implementations.

As shown in FIG. 24B, at operation 2405, an isolation material is deposited to partially fill the trench to expose at least part of the portion of the second substrate. As shown in FIG. 22I, trench isolation 2204 is formed in trench 2209 (e.g., shown in FIG. 22H) by depositing an isolation material, such as silicon oxide, into trench 2209 using one or more thin film deposition processes including, but not limited to, CVD, PVD, ALD, or any combination thereof. In order to form 3D semiconductor body 2208, the deposition rate and/or duration can be controlled to partially fill trench 2209 to expose at least part of the portion of silicon substrate 2202. As a result, the exposed portion of silicon substrate 2202 now becomes 3D semiconductor body 2208 that is above the resulting top surfaces of silicon substrate 2202 and trench isolation 2204 after the formation of trench isolation 2204, according to some implementations.

Referring back to FIG. 22C, after the formation of 3D semiconductor body 2208 regardless of whether it is formed prior to or after the formation of trench isolation 2204, sacrificial layer 2206 (e.g., shown in FIGS. 22B and 22I) is removed, for example, by wet/dry etch.

In some implementations, to form the gate structure, as shown in FIGS. 24A and 24B, at operation 2406, a gate dielectric layer and a gate electrode layer are sub sequentially formed on the plurality of sides of the 3D semiconductor body. As illustrated in FIG. 22D, a gate dielectric layer 2210, such as silicon oxide layer or a high-k dielectric layer, is formed on multiple sides of 3D semiconductor body 2208. In some implementations, a layer of dielectric material is deposited onto all exposed surfaces of 3D semiconductor body 2208 using one or more thin film deposition processes including, but not limited to, CVD, PVD, ALD, or any combination thereof. In some implementations in which gate dielectric layer 2210 is a silicon oxide layer, dry/wet oxidation is used to oxide parts of silicon in 3D semiconductor body 2208 at the exposed surfaces to form gate dielectric layer 2210.

As illustrated in FIG. 22E, a gate electrode layer 2212, such as doped polysilicon layer or a metal layer, is formed over gate dielectric layer 2210. In some implementations, a layer of semiconductor or conductive material is deposited over gate dielectric layer 2210 using one or more thin film deposition processes including, but not limited to, CVD, PVD, ALD, or any combination thereof. In some implementations in which gate electrode layer 2212 is a polysilicon layer, in-situ doping is performed to dope the polysilicon layer, or a doping process, such as ion implantation, is performed after the deposition to dope the polysilicon layer.

In some implementations, to form the gate structure, as shown in FIGS. 24A and 24B, at operation 2408, the gate electrode layer is patterned to form a gate electrode. As illustrated in FIG. 22F, gate electrode layer 2212 (e.g., shown in FIG. 22E) is patterned to form a gate electrode 2214, for example, using lithography and wet/dry etch.

As shown in FIGS. 24A and 24B, at operation 2410, a source and a drain are formed in the 3D semiconductor body. In some implementations, to form the source and the drain, portions of the 3D semiconductor body that are not covered by the gate structure are doped. As illustrated in FIG. 22G, a pair of source and drain 2216 are formed in 3D semiconductor body 2208 by doping portions of 3D semiconductor body 2208 that are not covered by gate electrode 2214, for example, using ion implantation. As a result, source and drain 2216 are not formed directly under gate electrode 2214 to allow the formation of the channel between source and drain 2216, according to some implementations. Although not shown, in some implementations, parts of gate dielectric layer 2210 covering source and drain 2216 are removed, for example, by dry etching/we etching, to expose parts of source and drain 2216 on which source and drain contacts (not shown) can be formed.

A 3D transistor having 3D semiconductor boy 2208, gate electrode 2214, gate dielectric layer 2210, and source and drain 2216 is thereby formed, according to some implementations. It is understood that since the fabrication processes described above for forming the 3D transistor are compatible with the fabrication processes for forming planar transistors, in some examples, a planar transistor having the same trench isolation depth or a different trench isolation depth as the 3D transistor may be formed using the same fabrication processes described above. In one example, the fabrication process described in FIG. 24A may be used to form 3D transistors and planar transistors having the same trench isolation depth. The same trench isolation depth may be determined by the formation of trench isolation 2204 prior to the formation of 3D semiconductor body 2208. In another example, fabrication process described in FIG. 24B may be used to form 3D transistors and planar transistors having different trench isolation depths.

To form 3D transistors and planar transistors having the same trench isolation depth, as shown in FIGS. 22A-22G, a 3D transistor may form in a first region 2201 and a planar transistor may form in a second region 2203 of same silicon substrate 2202. As shown in FIG. 22A, trench isolation 2204, such as STIs, can be formed in both first region 2201 and second region 2203 for forming the 3D transistor and the planar transistor, respectively, in the same fabrication process described above in detail with respect to FIG. 22A. Thus, trench isolation 2204 for the 3D transistor and the trench isolation 2204 for the planar transistor can have the same depth. As shown in FIG. 22B, the etching back of trench isolation 2204 can be performed only in first region 2201, but not in second region 2203. In other words, trench isolation 2204 for the planar transistor in second region 2203 remains unchanged without recess when forming the recess of trench isolation 2204 for 3D transistor in first region 2201, according to some implementations. In some implementations, an etch mask is patterned to cover second region 2203 and expose only first region 2201 before etching back trench isolation 2204 in first region 2201 to protect trench isolation 2204 in second region 2203. As shown in FIG. 22C, sacrificial layers 2206 in both first and second regions 2201 and 2203 can be removed in the same fabrication process described above in detail with respect to FIG. 22C. As shown in FIG. 22D, a gate dielectric layer 2211 of the planar transistor in second region 2203 can be formed in the same fabrication process for forming gate dielectric layer 2210 of the 3D transistor in first region 2201 as described above in detail with respect to FIG. 22D. As shown in FIG. 22E, gate electrode layer 2212 can be formed over gate dielectric layers 2210 and 2211 in both first and second regions 2201 and 2203 in the same fabrication process as described above in detail with respect to FIG. 22E. As shown in FIG. 22F, a gate electrode 2215 of the planar transistor in second region 2203 can be patterned from gate electrode layer 2212 in the same fabrication process for patterning gate electrode 2214 of the 3D transistor in first region 2201, as described above in detail with respect to FIG. 22F. As shown in FIG. 22G, a pair of source and drain 2217 of the planar transistor in second region 2203 can be formed in the same fabrication process for forming pair of source and drain 2216 of the 3D transistor in first region 2201, as described above in detail with respect to FIG. 22G. A planar transistor having gate electrode 2215, gate dielectric layer 2211, and source and drain 2217 is thereby formed in the same process flow (except for the etching back process in FIG. 22B) for forming the 3D transistor having 3D semiconductor boy 2208, gate electrode 2214, gate dielectric layer 2210, and source and drain 2216, according to some implementations.

Figure 22J:
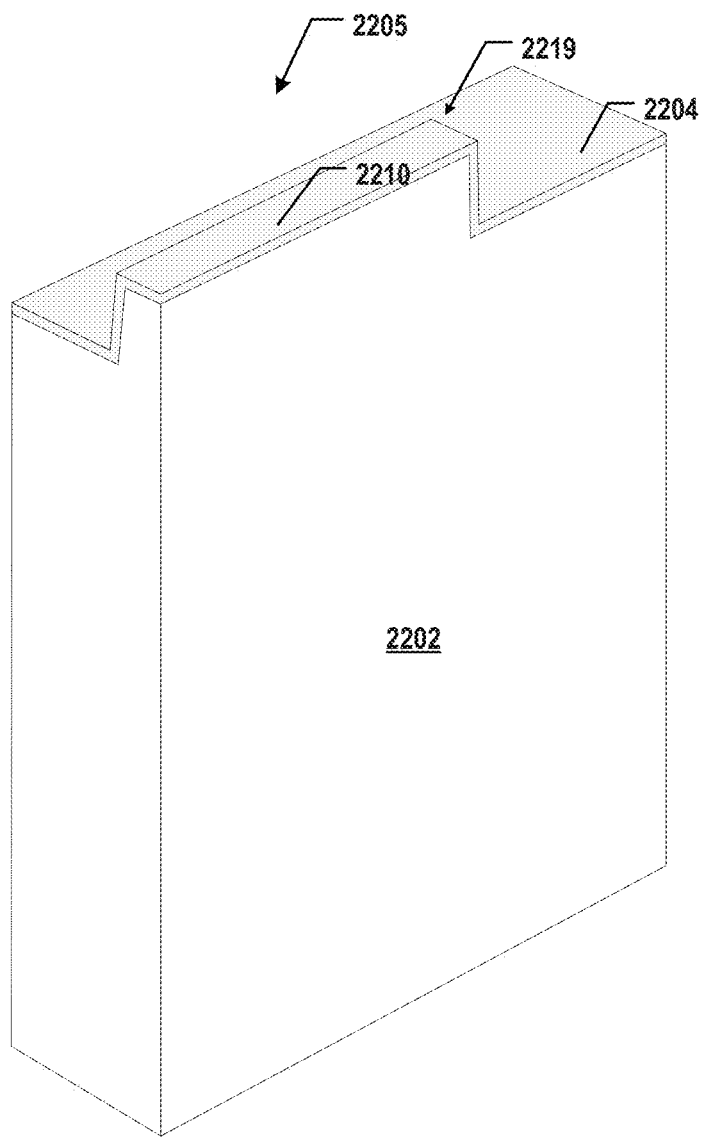

It is further understood that 3D transistors having different isolation trench depths, e.g., for peripheral circuits with different applied voltages (e.g., LLV circuits 902, LV circuits 904, and HV circuits 906) may be formed by varying the recess depth when etching back trench isolation 2204. As shown in FIG. 22J, a 3D semiconductor body 2219 in a third region 2205 of silicon substrate 2202 can have a different recess depth from 3D semiconductor body 2208 in first region 2201 in FIG. 22D by etching back different recess depths of trench isolations 2204 in first region 2201 and in third region 2205. In some implementations, 3D semiconductor body 2219 is part of a 3D transistor in HV circuits 906, and 3D semiconductor body 2208 is part of a 3D transistor in LLV circuits 902 and/or LV circuits 904, and the first recess depth for forming 3D semiconductor body 2219 is greater than the second recess depth for forming 3D semiconductor body 2208. In one example, the first recess depth may be between 300 nm and 400 nm, and the second recess depth may be between 50 nm and 100 nm.

Referring to FIG. 23, method 2300 proceeds to operation 2308 in which a second bonding layer including a plurality of second bonding contacts is formed above the peripheral circuit. For example, as illustrated in FIG. 8B, bonding layer 851 including bonding contacts 853 is formed above 3D transistors 839 in peripheral circuit 835. Method 2300 proceeds to operation 2310, as illustrated in FIG. 23, in which the first semiconductor structure and the second semiconductor structure are bonded in a face-to-face manner, such that the array of memory cells is coupled to the peripheral circuit across a bonding interface. The bonding can be hybrid bonding. In some implementations, the second semiconductor structure is above the first semiconductor structure after the bonding. In some implementations, the first semiconductor structure is above the second semiconductor structure after the bonding.

As illustrated in FIG. 8A, second semiconductor structure 804 having 3D NAND memory strings 838 is flipped upside down. Bonding layer 826 facing down is bonded with bonding layer 822 facing up, i.e., in a face-to-face manner, thereby forming a bonding interface 806. In some implementations, a treatment process, e.g., a plasma treatment, a wet treatment, and/or a thermal treatment, is applied to the bonding surfaces prior to the bonding. After the bonding, bonding contacts 828 in bonding layer 826 and bonding contacts 824 in bonding layer 822 are aligned and in contact with one another, such that 3D NAND memory strings 838 can be coupled to device layer 810 (e.g., peripheral circuits 812 and 814). Similarly, as illustrated in FIG. 8B, first semiconductor structure 805 having peripheral circuits 835 and 837 is flipped upside down. Bonding layer 851 facing down is bonded with bonding layer 829 facing up, i.e., in a face-to-face manner, thereby forming a bonding interface 807. After the bonding, bonding contacts 853 in bonding layer 851 and bonding contacts 855 in bonding layer 829 are aligned and in contact with one another, such that 3D NAND memory strings 817 can be coupled to device layer 831 (e.g., peripheral circuits 835 and 837).

Method 2300 proceeds to operation 2312, as illustrated in FIG. 23, in which one of the first and second substrates that is above another one of the first and second substrates after the bonding is thinned. As illustrated in FIG. 8A, as the substrate of second semiconductor structure 804 having 3D NAND memory strings 838 is above the substrate of first semiconductor structure 802 having peripheral circuits 812 and 814, the substrate of second semiconductor structure 804 is thinned to form semiconductor layer 848 using CMP and/or etching processes. Similarly, as illustrated in FIG. 8B, as the substrate of first semiconductor structure 805 having peripheral circuits 835 and 837 is above the substrate of second semiconductor structure 803 having 3D NAND memory strings 817, the substrate of first semiconductor structure 805 is thinned to form semiconductor layer 833 using CMP and/or etching processes.

Method 2300 proceeds to operation 2314, as illustrated in FIG. 23, in which an interconnect layer is formed on the thinned first or second substrate. As illustrated in FIG. 8A, pad-out interconnect layer 850 is formed above semiconductor layer 848 (the thinned top substrate). Similarly, as illustrated in FIG. 8B, pad-out interconnect layer 843 is formed above semiconductor layer 833 (the thinned top substrate).

According to one aspect of the present disclosure, a memory device includes an array of memory cells, a plurality of word lines coupled to the array of memory cells, and a plurality of peripheral circuits coupled to the array of memory cells and configured to control the array of memory cells. A first peripheral circuit of the plurality of peripheral circuits includes a first 3D transistor coupled to the array of memory cells through at least one of the plurality of word lines. The first 3D transistor includes a 3D semiconductor body, and a gate structure in contact with a plurality of sides of the 3D semiconductor body. The gate structure includes a gate dielectric and a gate electrode.

In some implementations, the first 3D transistor further includes a drift region in the 3D semiconductor body.

In some implementations, the first 3D transistor further includes a source and a drain in contact with the drift region, and a doping concentration of the source and the drain is greater than a doping concentration of the drift region.

In some implementations, a channel length of the first 3D transistor is greater than a channel width of the first 3D transistor.

In some implementations, the gate dielectric includes silicon oxide and has a thickness greater than 10 nm.

In some implementations, the thickness of the gate dielectric is between 20 nm and 80 nm.

In some implementations, the first 3D transistor is a multi-gate transistor.

In some implementations, the gate electrode includes polysilicon.

In some implementations, a width of the 3D semiconductor body is greater than 100 nm. In some implementations, the width of the 3D semiconductor body is between 300 nm and 1,000 nm.

In some implementations, a channel length of the 3D semiconductor body is greater than 120 nm. In some implementations, the channel length of the 3D semiconductor body is between 500 nm and 1,200 nm.

In some implementations, a height of the 3D semiconductor body is greater than 50 nm. In some implementations, the height of the 3D semiconductor body is between 300 nm and 500 nm.

In some implementations, the first peripheral circuit further includes another 3D transistor, and a trench isolation between the first 3D transistor and the another 3D transistor. In some implementations, a thickness of the trench isolation is smaller than the height of the 3D semiconductor body.

In some implementations, the thickness of the trench isolation is not greater than one third of the height of the 3D semiconductor body.

In some implementations, the memory device further includes a first voltage source coupled to the first peripheral circuit and configured to provide a first voltage to the first 3D transistor. In some implementations, the first voltage is greater than 3.3 V.

In some implementations, the first voltage is between 5 V and 30 V.

In some implementations, the first peripheral circuit is a word line driver. In some implementations, the word line driver includes a string driver.

In some implementations, a second peripheral circuit of the plurality of peripheral circuits includes a second 3D transistor, and a thickness of a gate dielectric of the second 3D transistor is smaller than the thickness of the gate dielectric of the first 3D transistor.

In some implementations, the memory device further includes a second voltage source coupled to the second peripheral circuit and configured to provide a second voltage to the second 3D transistor. In some implementations, the second voltage is different from the first voltage.

In some implementations, a third peripheral circuit of the plurality of peripheral circuits includes a planar transistor.

In some implementations, the array of memory cells includes an array of 3D NAND memory strings.

According to another aspect of the present disclosure, a memory device includes an array of memory cells, a plurality of word lines coupled to the array of memory cells, and a plurality of string drivers coupled to the plurality of word lines, respectively, and configured to drive the array of memory cells through the plurality of word lines. Each of the plurality of string drivers includes a 3D transistor.

In some implementations, the memory device further includes a voltage source coupled to the plurality of string drivers and configured to provide a voltage to the 3D transistors.

In some implementations, the voltage is greater than 3.3 V.

In some implementations, the voltage is between 5 V and 30 V.

In some implementations, the first 3D transistor is a multi-gate transistor.

In some implementations, the multi-gate transistor includes a FinFET.

In some implementations, the multi-gate transistor includes a GAA FET.

In some implementations, the first 3D transistor includes a 3D semiconductor body, and a gate structure in contact with a plurality of sides of the 3D semiconductor body. The gate structure can include a gate dielectric and a gate electrode. In some implementations, the gate dielectric comprises silicon oxide and has a thickness greater than 10 nm.

In some implementations, the thickness of the gate dielectric is between 20 nm and 80 nm.

In some implementations, the gate electrode includes polysilicon.

In some implementations, a width of the 3D semiconductor body is greater than 100 nm. In some implementations, the width of the 3D semiconductor body is between 300 nm and 1,000 nm.

In some implementations, a channel length of the 3D semiconductor body is greater than 120 nm. In some implementations, the channel length of the 3D semiconductor body is between 500 nm and 1,200 nm.

In some implementations, a height of the 3D semiconductor body is greater than 50 nm. In some implementations, the height of the 3D semiconductor body is between 300 nm and 500 nm.

In some implementations, the array of memory cells includes an array of 3D NAND memory strings.

According to still another aspect of the present disclosure, a system includes a memory device configured to store data. The memory device includes an array of memory cells, a plurality of word lines coupled to the array of memory cells, and a plurality of string drivers coupled to the plurality of word lines, respectively, and configured to drive the array of memory cells through the plurality of word lines. Each of the plurality of string drivers includes a 3D transistor. The system also includes a memory controller coupled to the memory device and configured to control the array of memory cells through the plurality of string drivers.

According to yet another aspect of the present disclosure, a 3D memory device includes a first semiconductor structure, a second semiconductor structure, and a bonding interface between the first semiconductor structure and the second semiconductor structure. The first semiconductor structure includes a stack structure including interleaved word lines and dielectric layers, and an array of 3D NAND memory strings extending through the stack structure. Edges of the interleaved word lines and dielectric layers define a staircase structure on a side of the stack structure. The second semiconductor structure includes a plurality of string drivers. Each of the plurality of string drivers includes a 3D transistor. The plurality of string drivers face the staircase structure across the bonding interface.

In some implementations, the first semiconductor structure further includes a first interconnect layer, and a first bonding layer includes a plurality of first bonding contacts. In some implementations, the second semiconductor structure further includes a second interconnect layer, and a second bonding layer includes a plurality of second bonding contacts. In some implementations, the first bonding contacts are in contact with the second bonding contacts at the bonding interface.

In some implementations, the 3D transistors are coupled to the word lines, respectively, through the first and second interconnect layers, and the first and second bonding layers.

In some implementations, the 3D transistor includes a 3D semiconductor body, and a gate structure in contact with a plurality of sides of the 3D semiconductor body. The gate structure can include a gate dielectric and a gate electrode.

In some implementations, the second semiconductor structure further includes a voltage source coupled to the plurality of string drivers and configured to provide a voltage to the 3D transistors. In some implementations, the voltage being greater than 3.3 V.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
    an array of memory cells;
    a plurality of word lines coupled to the array of memory cells; and a plurality of peripheral circuits coupled to the array of memory cells and configured to control the array of memory cells, wherein:

a first peripheral circuit of the plurality of peripheral circuits comprises a first three-dimensional (3D) transistor coupled to the array of memory cells through at least one of the plurality of word lines, and a second peripheral circuit of the plurality of peripheral circuits comprises a second 3D transistor;

the first 3D transistor comprises a 3D semiconductor body, and a gate structure in contact with a plurality of sides of the 3D semiconductor body, the gate structure comprising a gate dielectric and a gate electrode; and a thickness of a gate dielectric of the second 3D transistor is smaller than a thickness of the gate dielectric of the first 3D transistor.

2. The memory device of claim 1, wherein the first 3D transistor further comprises a drift region in the 3D semiconductor body; and the first 3D transistor further comprises a source and a drain each in contact with the drift region, and a doping concentration of the source and the drain is greater than a doping concentration of the drift region.

3. The memory device of claim 1, wherein a channel length of the first 3D transistor is greater than a channel width of the first 3D transistor.

4. The memory device of claim 1, wherein the gate dielectric of the first 3D transistor comprises silicon oxide and has the thickness greater than 10 nm.

5. The memory device of claim 1, wherein a width of the 3D semiconductor body is greater than 100 nm;

a channel length of the 3D semiconductor body is greater than 120 nm; and a height of the 3D semiconductor body is greater than 50 nm.

6. The memory device of claim 5, wherein the first peripheral circuit further comprises:

another 3D transistor; and a trench isolation between the first 3D transistor and the other 3D transistor of the first peripheral circuit, a thickness of the trench isolation being smaller than the height of the 3D semiconductor body.

7. The memory device of claim 1, further comprising a first voltage source coupled to the first peripheral circuit and configured to provide a first voltage to the first 3D transistor, wherein the first voltage is greater than 3.3 V.

8. The memory device of claim 7, further comprising a second voltage source coupled to the second peripheral circuit and configured to provide a second voltage to the second 3D transistor, wherein the second voltage is different from the first voltage.

9. The memory device of claim 1, wherein the first peripheral circuit is a word line driver.

10. The memory device of claim 9, wherein the word line driver comprises a string driver.

11. The memory device of claim 1, wherein a third peripheral circuit of the plurality of peripheral circuits comprises a planar transistor.

12. The memory device of claim 1, wherein:

the 3D semiconductor body of the first 3D transistor protrudes from a trench isolation and forms a plurality of surfaces of the 3D semiconductor body, the plurality of surfaces comprising a top surface and a side surface; and a gate dielectric of the first 3D transistor covering the top surface and a gate dielectric of the first 3D transistor covering the side surface are identical.

13. A memory device, comprising:

an array of memory cells;

a plurality of word lines coupled to the array of memory cells; and a plurality of string drivers coupled to the plurality of word lines, respectively, and configured to drive the array of memory cells through the plurality of word lines, wherein:

each of the plurality of string drivers comprises a three-dimensional (3D) transistor, the 3D transistors comprising a first 3D transistor and a second 3D transistor; and a thickness of a gate dielectric of the first 3D transistor is smaller than a thickness of a gate dielectric of the second 3D transistor.

14. The memory device of claim 13, further comprising a voltage source coupled to the plurality of string drivers and configured to provide a voltage to the 3D transistors, wherein the voltage is greater than 3.3 V.

15. The memory device of claim 13, wherein the first 3D transistor comprises a 3D semiconductor body, and a gate structure in contact with a plurality of sides of the 3D semiconductor body, the gate structure comprising the gate dielectric of the first 3D transistor and a gate electrode; and the gate dielectric of the first 3D transistor comprises silicon oxide and has the thickness greater than 10 nm.

16. A three-dimensional (3D) memory device, comprising:

a first semiconductor structure comprising:

a stack structure comprising interleaved word lines and dielectric layers, edges of the interleaved word lines and dielectric layers define a staircase structure on a side of the stack structure; and an array of 3D NAND memory strings extending through the stack structure;

a second semiconductor structure comprising a plurality of string drivers, wherein each of the plurality of string drivers comprises a 3D transistor, the 3D transistors comprise a first 3D transistor and a second 3D transistor, and a thickness of a gate dielectric of the first 3D transistor is smaller than a thickness of a gate dielectric of the second 3D transistor; and a bonding interface between the first semiconductor structure and the second semiconductor structure, wherein the plurality of string drivers face the staircase structure across the bonding interface.

17. The 3D memory device of claim 16, wherein the first semiconductor structure further comprises a first interconnect layer, and a first bonding layer comprising a plurality of first bonding contacts;

the second semiconductor structure further comprises a second interconnect layer, and a second bonding layer comprising a plurality of second bonding contacts; and the first bonding contacts are in contact with the second bonding contacts at the bonding interface.

18. The 3D memory device of claim 17, wherein the 3D transistors are coupled to the word lines, respectively, through the first and second interconnect layers, and the first and second bonding layers.

19. The 3D memory device of claim 16, wherein the first 3D transistor comprises a 3D semiconductor body, and a gate structure in contact with a plurality of sides of the 3D semiconductor body, the gate structure comprising the gate dielectric of the first 3D transistor and a gate electrode; and the gate dielectric of the first 3D transistor comprises silicon oxide and has the thickness greater than 10 nm.

20. The 3D memory device of claim 16, wherein the second semiconductor structure further comprises a voltage source coupled to the plurality of string drivers and configured to provide a voltage to the 3D transistors, the voltage being greater than 3.3 V.

* * * * *